(12) United States Patent
Lee et al.

(10) Patent No.: US 12,002,790 B2
(45) Date of Patent: Jun. 4, 2024

(54) PIXEL AND DISPLAY DEVICE INCLUDING THE SAME

(71) Applicant: Samsung Display Co., Ltd., Yongin-si (KR)

(72) Inventors: Hee Keun Lee, Yongin-si (KR); Jin Taek Kim, Yongin-si (KR); Seung Min Lee, Yongin-si (KR); Jung Hwan Yi, Yongin-si (KR); Baek Hyeon Lim, Yongin-si (KR); Kyung Tae Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 367 days.

(21) Appl. No.: 17/210,282

(22) Filed: Mar. 23, 2021

(65) Prior Publication Data
US 2021/0384169 A1 Dec. 9, 2021

(30) Foreign Application Priority Data
Jun. 3, 2020 (KR) .................. 10-2020-0067083

(51) Int. Cl.
*H01L 25/075* (2006.01)
*H01L 27/12* (2006.01)
*H01L 33/38* (2010.01)
*H01L 33/44* (2010.01)
*H01L 33/62* (2010.01)

(52) U.S. Cl.
CPC ...... *H01L 25/0753* (2013.01); *H01L 27/1214* (2013.01); *H01L 33/38* (2013.01); *H01L 33/44* (2013.01); *H01L 33/62* (2013.01)

(58) Field of Classification Search
CPC . H01L 25/0753; H01L 27/1214; H01L 33/38; H01L 33/44; H01L 33/62; H01L 25/167; H01L 27/156; H01L 27/124; H01L 27/1248; G09G 3/32; G09G 2300/0439
See application file for complete search history.

(56) References Cited

U.S. PATENT DOCUMENTS 9,001,007 B2 4/2015 Park et al.
9,570,425 B2 2/2017 Do
9,773,761 B2 9/2017 Do
(Continued)

FOREIGN PATENT DOCUMENTS

KR 10-1429095 B1 8/2014
KR 10-1436123 B1 11/2014
(Continued)

*Primary Examiner* — Su C Kim
(74) *Attorney, Agent, or Firm* — Lewis Roca Rothgerber Christie LLP

(57) ABSTRACT

A pixel includes a first electrode and a second electrode facing each other, an insulating layer on the first and second electrodes, a plurality of light-emitting elements located on the insulating layer between the first electrode and the second electrode, a first contact electrode electrically connected to the first electrode, and a second contact electrode electrically connected to the second electrode. Here, a first gap having a constant width in a first direction and a second gap having a width in the first direction that gradually changes along a second direction are located between the first electrode and the second electrode or between the first contact electrode and the second contact electrode.

22 Claims, 33 Drawing Sheets

(56) References Cited

U.S. PATENT DOCUMENTS

| | | | |
|---|---|---|---|
| 9,978,725 B2 | 5/2018 | Do | |
| 2009/0273004 A1 | 11/2009 | Lin et al. | |
| 2012/0193662 A1* | 8/2012 | Donofrio | H01L 33/60 |
| | | | 257/E33.059 |
| 2017/0062493 A1* | 3/2017 | Jeon | H01L 27/124 |
| 2018/0012876 A1 | 1/2018 | Kim et al. | |
| 2019/0259880 A1* | 8/2019 | Kanawati | H01L 29/0649 |
| 2020/0051962 A1 | 2/2020 | Heo et al. | |

FOREIGN PATENT DOCUMENTS

| | | |
|---|---|---|
| KR | 10-1490758 B1 | 2/2015 |
| KR | 10-1908468 B1 | 10/2018 |
| KR | 10-2020-0014955 A | 2/2020 |

\* cited by examiner

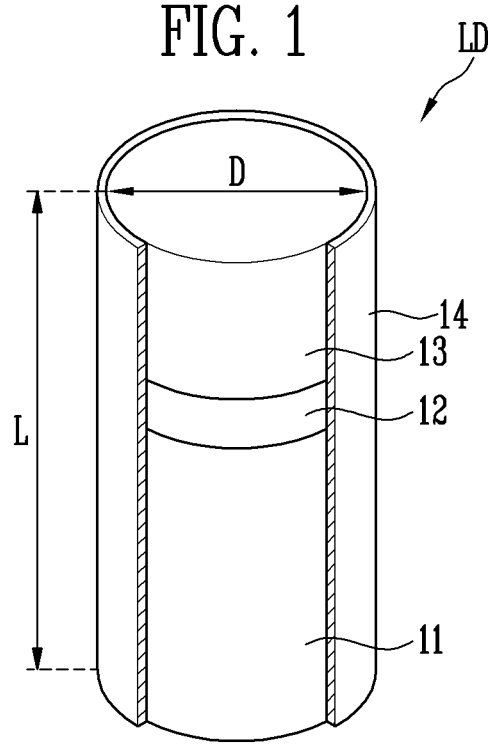
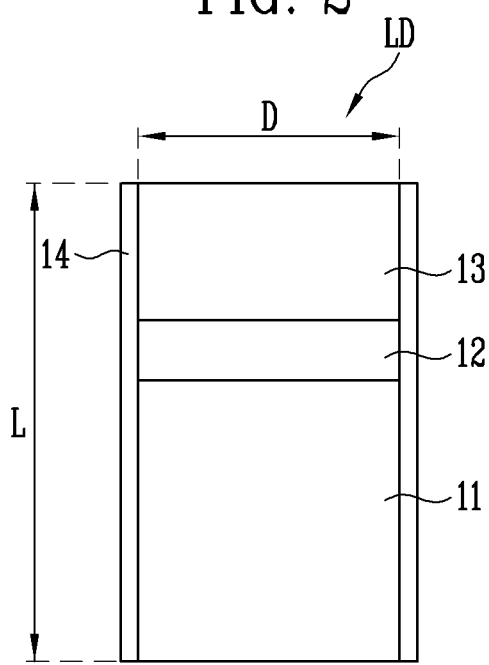

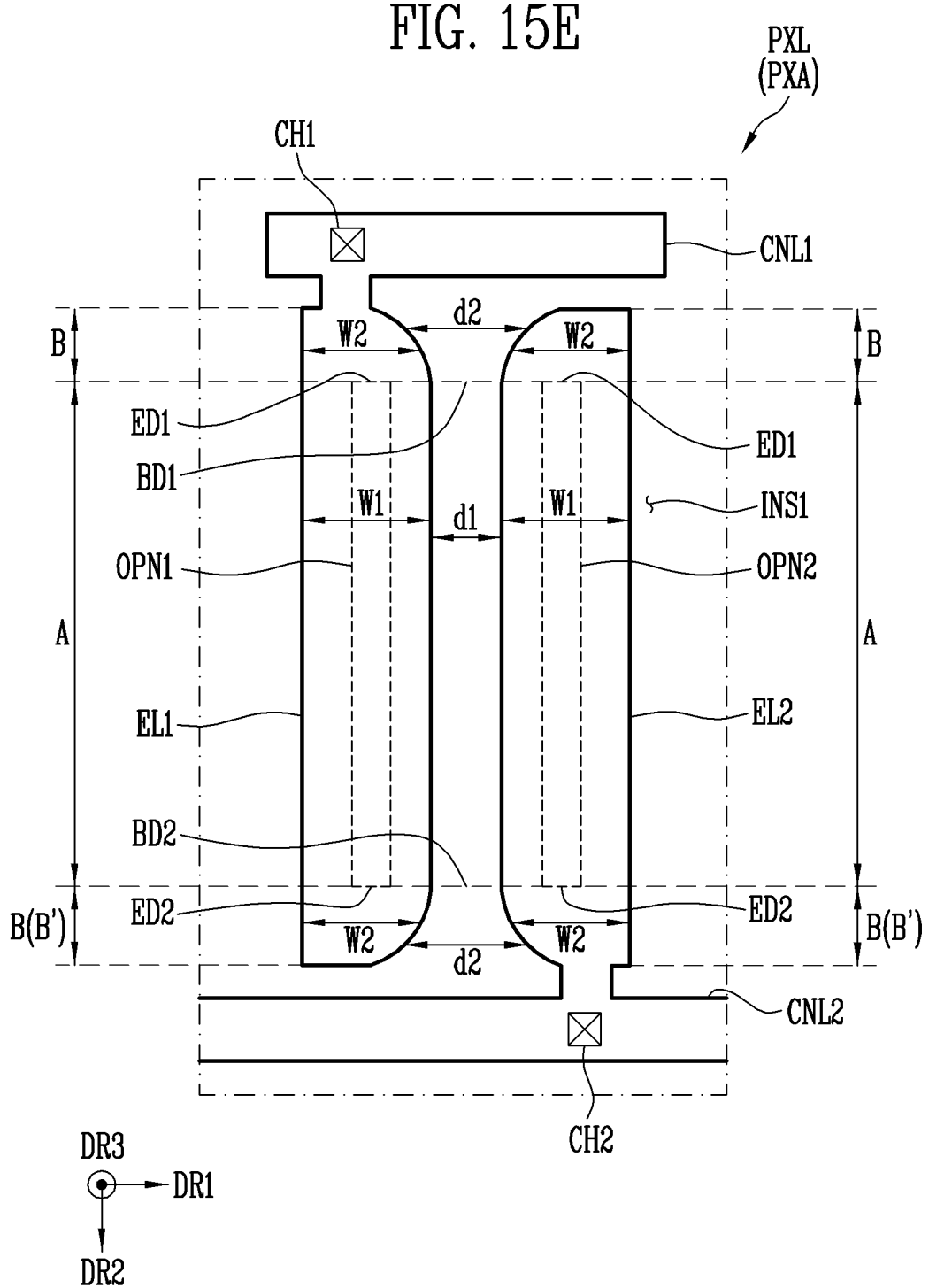

PIXEL AND DISPLAY DEVICE INCLUDING THE SAME

CROSS-REFERENCE TO RELATED APPLICATION

This application claims priority to and the benefit of Korean Patent Application No. 10-2020-0067083 filed in the Korean Intellectual Property Office on Jun. 3, 2020, the entire content of which is incorporated herein by reference.

BACKGROUND

1. Field

The present disclosure relates to a pixel and a display device including the same.

2. Description of the Related Art

As interests in information displays and demands on using portable information media increase, researches and commercialization on display devices are being actively performed.

SUMMARY

One or more example embodiments of the present disclosure provide a pixel capable of preventing short circuit defects between two electrodes by changing a shape of an end portion of each of the two electrodes adjacent to each other in one direction, and a display device including the same.

A pixel according to one or more example embodiments of the present disclosure includes a first electrode and a second electrode facing each other, an insulating layer on the first and second electrodes, a plurality of light-emitting elements located on the insulating layer between the first electrode and the second electrode, a first contact electrode electrically connected to the first electrode, and a second contact electrode electrically connected to the second electrode. Here, a first gap having a constant width in a first direction and a second gap having a width in the first direction that gradually changes along a second direction may be located between the first electrode and the second electrode or between the first contact electrode and the second contact electrode, the second direction being crossing the first direction.

In one or more example embodiments of the present disclosure, the second gap may be wider than the first gap in the first direction.

In one or more example embodiments of the present disclosure, each of the first and second electrodes may include a first region corresponding to the first gap and a second region corresponding to the second gap, and each of the first and second contact electrodes may include a third region corresponding to the first gap and a fourth region corresponding to the second gap.

In one or more example embodiments of the present disclosure, the second region of each of the first and second electrodes may be partially chamfered.

In one or more example embodiments of the present disclosure, the insulating layer may include a first opening exposing one region of the first electrode and a second opening exposing one region of the second electrode.

In one or more example embodiments of the present disclosure, in a plan view, an edge of the first opening may match a boundary between the first region of the first electrode and the second region of the first electrode. In the plan view, an edge of the second opening may match a boundary between the first region of the second electrode and the second region of the second electrode. In some embodiments, in a plan view, an edge of the first opening may not match a boundary between the first region of the first electrode and the second region of the first electrode, and in the plan view, an edge of the second opening may not match a boundary between the first region of the second electrode and the second region of the second electrode.

In one or more example embodiments of the present disclosure, in a plan view, the second region of each of the first and second electrodes may have at least one side surface that extends in a diagonal direction inclined to the first direction.

In one or more example embodiments of the present disclosure, in a plan view, the second region of each of the first and second electrodes may have at least one side surface having certain curvature.

In one or more example embodiments of the present disclosure, a width of the second region of each of the first and second electrodes in the first direction may be decreased as a distance from a boundary between the first region and the second region of a corresponding electrode is increased.

In one or more example embodiments of the present disclosure, each of the first and second electrodes may extend in the second direction different from the first direction. Here, each of the first and second electrodes may have at least two widths in the first direction along the second direction.

In one or more example embodiments of the present disclosure, the first region of each of the first and second electrodes has a constant width in the first direction.

In one or more example embodiments of the present disclosure, in a plan view, a corner of the first contact electrode may be positioned outside a chamfered portion of the first electrode, and a corner of the second contact electrode may be positioned outside a chamfered portion of the second electrode.

In one or more example embodiments of the present disclosure, the fourth region of each of the first and second contact electrodes may be partially chamfered.

In one or more example embodiments of the present disclosure, a width of the fourth region in the first direction may be less than a width of the third region in the first direction.

In one or more example embodiments of the present disclosure, the insulating layer may include a first opening exposing one region of the first electrode and a second opening exposing one region of the second electrode.

In one or more example embodiments of the present disclosure, in a plan view, an edge of the first opening may match a boundary between the third region of the first contact electrode and the fourth region of the first contact electrode. In addition, in the plan view, an edge of the second opening may match a boundary between the third region of the second contact electrode and the fourth region of the second contact electrode.

In one or more example embodiments of the present disclosure, the width of the fourth region of each of the first and second contact electrodes in the first direction may be decreased as a distance from the boundary between the third region and the fourth region of a corresponding contact electrode is increased.

In one or more example embodiments of the present disclosure, each of the first and second contact electrodes may have at least two widths in the first direction along an extending direction thereof.

In some embodiments, in a plan view, an edge of the first opening may not match a boundary between the third region of the first contact electrode and the fourth region of the first contact electrode, and in the plan view, an edge of the second opening may not match a boundary between the third region of the second contact electrode and the fourth region of the second contact electrode.

A display device according to one or more example embodiments of the present disclosure includes a substrate including a plurality of pixel areas, and a pixel in each of the pixel areas. The pixel may include a first electrode and a second electrode facing each other on the substrate, an insulating layer on the first electrode and the second electrode, a plurality of light-emitting elements positioned between the first electrode and the second electrode on the insulating layer, a first contact electrode located on the first electrode and configured to electrically connect the first electrode and one end each of the light-emitting elements, and a second contact electrode located on the second electrode and configured to electrically connect the second electrode and an other end of each of the light-emitting elements. A first gap having a constant width in a first direction and a second gap having a width in the first direction that gradually changes along a second direction may be located between the first electrode and the second electrode or between the first contact electrode and the second contact electrode, the second direction being crossing the first direction.

In one or more example embodiments of the present disclosure, each of the first and second electrodes may be divided into a first region corresponding to the first gap and a second region corresponding to the second gap. In some embodiments, each of the first and second contact electrodes may include a third region corresponding to the first gap and a fourth region corresponding to the second gap. Here, the second gap may be wider than the first gap in the first direction.

BRIEF DESCRIPTION OF THE DRAWINGS

FIG. 1 is a schematic perspective view illustrating a light-emitting element according to one or more example embodiments of the present disclosure.

FIG. 2 is a cross-sectional view of the light-emitting element of FIG. 1.

FIGS. 15A-15G are schematic plan views of first and second electrodes illustrated in FIG. 7 implemented according to some other example embodiments.

DETAILED DESCRIPTION

Figure 3:
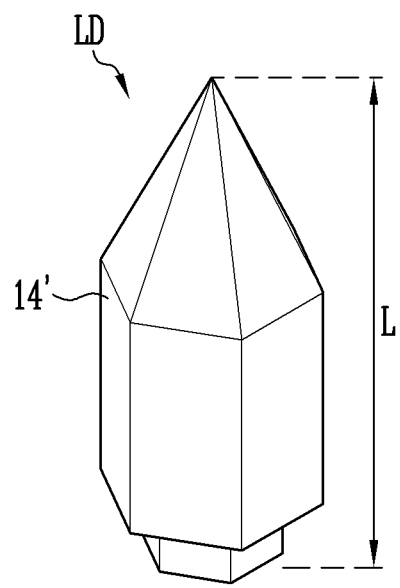
FIG. 3 is a schematic perspective view illustrating a light-emitting element according to another example embodiment of the present disclosure.

While the present disclosure is open to various modifications and alternative embodiments, specific example embodiments thereof will be described and shown by way of example in the accompanying drawings. However, it should be understood that there is no intention to limit the present disclosure to the particular example embodiments disclosed, and, on the contrary, the present disclosure is to cover all modifications, equivalents, and alternatives falling within the spirit and scope of the present disclosure.

Hereinafter, example embodiments of the present disclosure and other subject matters necessary for those skilled in the art to easily understand the contents of the present disclosure will be described in detail with reference to the accompanying drawings. In the following description, the singular forms "a," "an," and "the" are intended to include the plural forms as well, unless the context clearly indicates otherwise.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Figure 4:
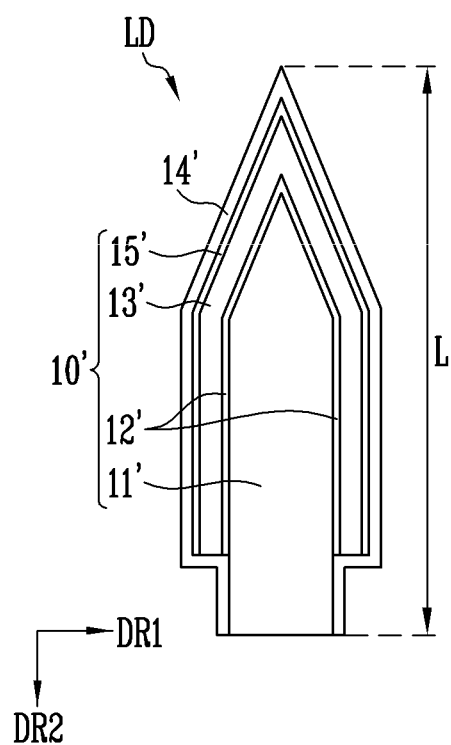
FIG. 4 is a cross-sectional view of the light-emitting element of FIG. 3.

FIG. 1 is a schematic perspective view illustrating a light-emitting element according to one or more example embodiments of the present disclosure, and FIG. 2 is a cross-sectional view of the light-emitting element of FIG. 1. FIG. 3 is a schematic perspective view illustrating a light-emitting element according to another example embodiment of the present disclosure, and FIG. 4 is a cross-sectional view of the light-emitting element of FIG. 3.

In one or more example embodiments of the present disclosure, the type and/or shape of a light-emitting element is not limited to the example embodiments illustrated in FIGS. 1-4.

Referring to FIGS. 1-4, a light-emitting element LD may include a first semiconductor layer 11, a second semiconductor layer 13, and an active layer 12 interposed between the first semiconductor layer 11 and the second semiconductor layer 13. For example, the light-emitting element LD may implement a light-emitting stack in which the first semiconductor layer 11, the active layer 12, and the second semiconductor layer 13 are sequentially stacked.

The light-emitting element LD may be provided in a shape that extends in one direction. When it is assumed that an extending direction of the light-emitting element LD is a length direction thereof, the light-emitting element LD may have one end portion (or lower end portion) and the other end portion (or upper end portion) in the extending direction. One semiconductor layer of the first and second semiconductor layers 11 and 13 may be disposed at one end portion (lower end portion) of the light-emitting element LD, and the other semiconductor layer of the first and second semiconductor layers 11 and 13 may be disposed at the other end portion of the light-emitting element LD. For example, the first semiconductor layer 11 may be disposed at one end portion (or lower end portion) of the light-emitting element LD, and the second semiconductor layer 13 may be disposed at the other end portion (or upper end portion) of the light-emitting element LD.

The light-emitting element LD may be provided in various shapes. For example, the light-emitting element LD may have a rod-like shape or a bar-like shape which is long in a length direction thereof (i.e., has an aspect ratio greater than one). In one or more example embodiments of the present disclosure, a length L of the light-emitting element LD in the length direction thereof may be greater than a diameter D (or width of a cross section) thereof. The light-emitting element LD may include, for example, a light-emitting diode (LED) manufactured in a very small size such that the diameter D and/or the length L may be in a micro-scale or a nano-scale.

The diameter D of the light-emitting element LD may be in a range of about 0.5 µm to about 500 µm, and the length L thereof may be in a range of about 1 µm to about 10 µm. However, the diameter D and the length L of the light-emitting element LD are not limited thereto, and the size of the light-emitting element LD may be changed such that the light-emitting element LD meets requirements (or design conditions) of a lighting device or a self-luminous display device to which the light-emitting element LD is applied.

For example, the first semiconductor layer 11 may include at least one n-type semiconductor layer. For example, the first semiconductor layer 11 may be an n-type semiconductor layer which includes any one semiconductor material selected from InAlGaN, GaN, AlGaN, InGaN, AlN, and InN and is doped with a first conductive type dopant (or n-type dopant) such as silicon (Si), germanium (Ge), tin (Sn), or the like. However, a material constituting the first semiconductor layer 11 is not limited thereto, and the first semiconductor layer 11 may be made of various materials. In one or more example embodiments of the present disclosure, the first semiconductor layer 11 may include a gallium nitride (GaN) semiconductor material doped with the first conductive dopant (or n-type dopant). For example, the first semiconductor layer 11 may be an n-type GaN semiconductor layer. The first semiconductor layer 11 may include an upper surface in contact with the active layer 12 in a direction of the length L of the light-emitting element LD and a lower surface exposed to the outside. The lower surface of the first semiconductor layer 11 may be one end portion (or lower end portion) of the light-emitting element LD.

The active layer 12 may be disposed on the first semiconductor layer 11 and may be formed to have a single or multi-quantum well structure. For example, when the active layer 12 is formed to have a multi-quantum well structure, in the active layer 12, a barrier layer (not illustrated), a strain reinforcing layer, and a well layer may be repeatedly and periodically stacked as one unit. The strain strengthening layer may have a smaller lattice constant than the barrier layer to further strengthen strain, for example, compression stress applied to the well layer. However, the structure of the active layer 12 is not limited to the above-described example embodiment.

The active layer 12 may emit light having a wavelength of 400 nm to 900 nm and may have a double hetero structure. In one or more example embodiments of the present disclosure, a clad layer (not illustrated) doped with a conductive dopant may be formed on an upper portion and/or a lower portion of the active layer 12 in the direction of the length of the light-emitting element LD. For example, the clad layer may be formed as an AlGaN layer or an InAlGaN layer. According to some example embodiments, a material such as AlGaN or InAlGaN may be used to form the active layer 12, and in some cases, various materials may constitute the active layer 12. The active layer 12 may have a first surface in contact with the first semiconductor layer 11 and a second surface in contact with the second semiconductor layer 13. The first surface and the second surface of the active layer 12 may face each other in the direction of the length L of the light-emitting element LD.

When a voltage greater than equal to a certain voltage is applied to both ends of the light-emitting element LD, electrons-hole pairs combine, and thus, the light-emitting elements LD emits light. By controlling light emission of the light-emitting element LD using such a principle, the light-emitting element LD may be used as a light source (or light-emitting source) of various light-emitting elements including pixels of a display device.

The second semiconductor layer 13 may be disposed on the second surface of the active layer 12 and may include a semiconductor layer which is a different type from the first semiconductor layer 11. For example, the second semiconductor layer 13 may include at least one p-type semiconductor layer. For example, the second semiconductor layer 13 may include a p-type semiconductor layer which includes at least one semiconductor material selected from InAlGaN, GaN, AlGaN, InGaN, AlN, and InN and is doped with a second conductive type dopant (or p-type dopant) such as magnesium (Mg). However, the material constituting the second semiconductor layer 13 is not limited thereto, and the second semiconductor layer 13 may be made of various materials. In one or more example embodiments of the present disclosure, the second semiconductor layer 13 may include a gallium nitride (GaN) semiconductor material doped with the second conductive dopant (or p-type dopant). For example, the second semiconductor layer 13 may be a p-type GaN semiconductor. The second semiconductor layer 13 may have a lower surface in contact with the active layer 12 in the direction of the length L of the light-emitting element LD and an upper surface exposed to the outside. Here, the upper surface of the second semiconductor layer 13 may be the other end portion (or upper end portion) of the light-emitting element LD.

In one or more example embodiments of the present disclosure, the first semiconductor layer 11 and the second semiconductor layer 13 may have different thicknesses in the direction of the length of the light-emitting element LD. For example, the first semiconductor layer 11 may have a thickness that is relatively greater than that of the second semiconductor layer 13 in the direction of the length L of the light-emitting element LD. Accordingly, the active layer 12 of the light-emitting element LD may be positioned closer to the upper surface of the second semiconductor layer 13 than the lower surface of the first semiconductor layer 11.

In one or more example embodiments, the first semiconductor layer 11 and the second semiconductor layer 13 are illustrated as being formed as one layer, but the present disclosure is not limited thereto. In one or more example embodiments of the present disclosure, each of the first semiconductor layer 11 and the second semiconductor layer 13 may further include at least one layer, for example, a clad layer and/or a tensile strain barrier reducing layer (TSBR) according to a material of the active layer 12. The TSBR layer may be a strain reducing layer disposed between semiconductor layers having different lattice structures to serve as a buffer for reducing a lattice constant difference. The TSBR layer may be made of a p-type semiconductor layer such as p-GaInP, p-AlInP, or p-AlGaInP, but the present disclosure is not limited thereto.

According to one or more example embodiments, in addition to the first semiconductor layer 11, the active layer 12, and the second semiconductor layer 13 described above, the light-emitting element LD may further include an additional electrode (not illustrated, hereinafter, referred to as "first additional electrode") disposed on the second semiconductor layer 13. According to another example embodiment, the light-emitting element LD may further include another additional electrode (not illustrated, hereinafter referred to as "second additional electrode") disposed at one end of the first semiconductor layer 11.

Each of the first and second additional electrodes may be an ohmic contact electrode, but the present disclosure is not limited thereto. According to one or more example embodiments, the first and second additional electrodes may be schottky contact electrodes. The first and second additional electrodes may include a conductive material (or substance). For example, the first and second additional electrodes may include an opaque metal using chromium (Cr), titanium (Ti), aluminum (Al), gold (Au), nickel (Ni), and an oxide or alloy thereof, alone or in a mixture. According to one or more example embodiments, the first and second additional electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials included in the first and second additional electrodes may be the same or different. The first and second additional electrodes may be substantially transparent or semitransparent. Accordingly, light generated by the light-emitting element LD may be emitted to the outside of the light-emitting element LD by passing through the first and second additional electrodes. According to one or more example embodiments, when light generated by the light-emitting element LD does not pass through the first and second additional electrodes and is emitted to the outside of the light-emitting element LD through a region excluding both ends of the light-emitting-element LD, the first and second additional electrodes may include an opaque metal.

In one or more example embodiments, the light-emitting element LD may further include an insulating film 14.

However, according to some example embodiments, the insulating film 14 may be omitted and may be provided to cover only a portion of the first semiconductor layer 11, the active layer 12, and the second semiconductor layer 13.

The insulating film 14 may prevent an electrical short circuit that may occur when the active layer 12 comes into contact with conductive materials other than the first and second semiconductor layers 11 and 13. In some embodiments, the insulating film 14 may reduce or minimize the surface defects of the light-emitting element LD and may improve a lifetime and efficiency of the light-emitting element LD. Furthermore, when a plurality of light-emitting elements LD are closely disposed, the insulating film 14 may prevent an undesired short circuit that may occur between the light-emitting elements LD. As long as the active layer 12 can be prevented from being short-circuited with an external conductive material, there is no limit or restriction as to whether the insulating film 14 should be provided.

The insulating film 14 may be provided in a form which entirely surrounds (or partially surrounds) an outer surface (e.g., an outer peripheral or circumferential surface) of the light-emitting stack including the first semiconductor layer 11, the active layer 12, and the second semiconductor layer 13. For convenience of description, FIG. 1 illustrates a state in which a portion of the insulating film 14 is deleted, and the first semiconductor layer 11, the active layer 12, and the second semiconductor layer 13 included in the light-emitting element LD may be actually surrounded by the insulating film 14.

In the above-described example embodiment, it has been described that the insulating film 14 is provided in a form which entirely surrounds an outer surface (e.g., an outer peripheral or circumferential surface) of each of the first semiconductor layer 11, the active layer 12, and the second semiconductor layer 13, but the present disclosure is limited thereto. According to one or more example embodiments, when the light-emitting element LD includes the first additional electrode, the insulating film 14 may entirely surround an outer surface (e.g., an outer peripheral or circumferential surface) of each of the first semiconductor layer 11, the active layer 12, the second semiconductor layer 13, and the first additional electrode. According to another example embodiment, the insulating film 14 may not entirely surround the outer surface (e.g., an outer peripheral or circumferential surface) of the first additional electrode or may surround only a portion of the outer surface (e.g., an outer peripheral or circumferential surface) of the first additional electrode and not surround the rest of the outer surface (e.g., an outer peripheral or circumferential surface) of the first additional electrode. Furthermore, according to some example embodiments, when the first additional electrode is disposed at the other end portion (or upper end portion) of the light-emitting element LD and the second additional electrode is disposed at one end portion (or lower end portion) of the light-emitting element LD, the insulating film 14 may expose at least one region of each of the first and second additional electrodes. In another example embodiment, the insulating film 14 may not be provided.

According to one or more example embodiments of the present disclosure, the insulating film 14 may include a transparent insulating material. For example, the insulating film 14 may include at least one insulating material selected from the group consisting of silicon oxide ($SiO_x$), silicon nitride ($SiN_x$), silicon oxynitride ($SiO_xN_y$), aluminum oxide ($AlO_x$), and titanium dioxide ($TiO_2$). However, the present disclosure is not limited thereto, and various materials having insulating properties may be used as the material of the insulating film 14.

When the insulating film 14 is provided in the light-emitting element LD, the active layer 12 can be prevented from being short-circuited with electrodes which are not illustrated. In some embodiments, the insulating film 14 may reduce or minimize the surface defects of the light-emitting element LD and may improve a lifetime and luminance efficiency of the light-emitting element LD. Furthermore, when the plurality of light-emitting elements LD are closely disposed, the insulating film 14 may prevent an undesired short circuit that may occur between the light-emitting elements LD.

According to one or more example embodiments, as illustrated in FIGS. 3 and 4, a light-emitting element LD' may include a light-emitting pattern 10' having a core-shell structure. In this case, a first semiconductor layer 11' may be positioned at a core (that is, a center) of the light-emitting element LD', and an active layer 12' may be provided or formed in a form which surrounds an outer surface (e.g., an outer peripheral or circumferential surface) of the first semiconductor layer 11' in a direction of a length L of the light-emitting element LD'. A second semiconductor layer 13' may be provided or formed in a form which surrounds the active layer 12' in the direction of the length L of the light-emitting element LD'. In one or more example embodiments, the light-emitting element LD' may further include an additional electrode (e.g., 15') surrounding at least one side of the second semiconductor layer 13'. Furthermore, according to some example embodiments, the light-emitting element LD' may further include an insulating film 14' which is provided on an outer surface (e.g., an outer peripheral or circumferential surface) of the light-emitting pattern 10' having a core-shell structure and includes a transparent insulating material.

The light-emitting element LD (or LD') may be used as a light-emitting source for various display devices. The light-emitting element LD (or LD') may be manufactured through a surface treatment process. For example, when a plurality of light-emitting elements LD (or LD') are mixed in a flowable solution (or solvent) and provided to each pixel area (for example, an emission area of each pixel), the light-emitting elements LD (or LD') may be surface-treated so as to be uniformly sprayed without being non-uniformly aggregated in the solution.

A light-emitting unit (or light-emitting device) including the above-described light-emitting element LD (or LD') may be used in various types of electronic devices, such as display devices, which require a light source. For example, when the plurality of light-emitting elements LD (or LD') are disposed in a pixel area of each pixel of a display panel, the light-emitting elements LD (or LD') may be used as light sources for each pixel. However, the application field of the light-emitting element LD (or LD') is not limited to the above-described example. For example, the light-emitting element LD (or LD') may be used in other types of electronic devices, such as lighting devices, which require a light source.

Figure 5:
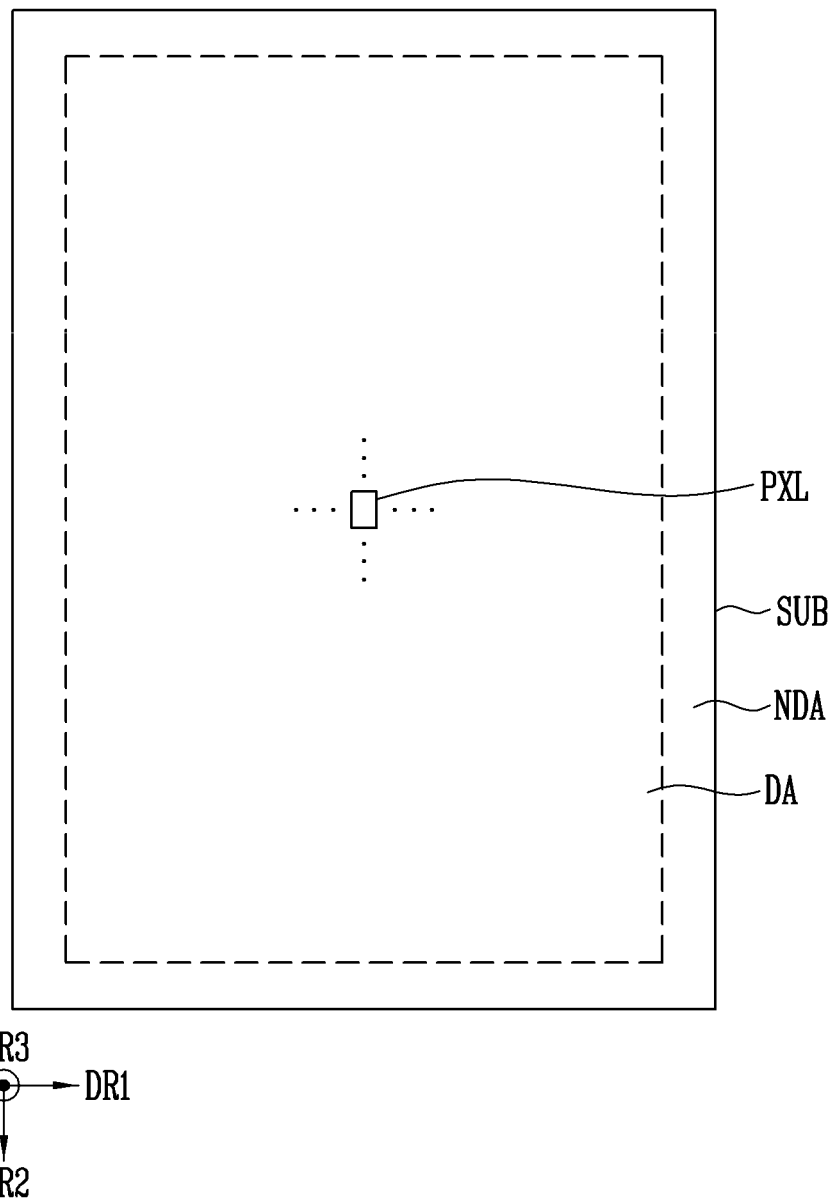
FIG. 5 is a view illustrating a display device according to one or more example embodiments, and particularly, a schematic plan view of a display device using any one light-emitting element of the light-emitting elements illustrated in FIGS. 1-4 as a light source.

FIG. 5 is a view illustrating a display device according to one or more example embodiments, and particularly, a schematic plan view of a display device using any one light-emitting element of the light-emitting elements illustrated in FIGS. 1-4 as a light source.

In FIG. 5, for convenience, the structure of the display device is briefly illustrated based on a display area DA in which an image is displayed. However, according to one or more example embodiments, at least one driver (for example, a scan driver or a data driver) and/or a plurality of signal lines (not illustrated) may be further disposed in the display device.

Referring to FIGS. 1-5, the display device according to one or more example embodiments of the present disclosure may include a substrate SUB, a plurality of pixels PXL which are provided on the substrate SUB, each of the pixels PXL including at least one light-emitting element LD, a driver which is provided on the substrate SUB to drive the pixels PXL, and a line portion which connects the pixels PXL and the driver.

As long as the display device is an electronic device, in which a display surface is applied to at least one surface thereof, such as a smartphone, a television, a tablet personal computer (PC), a mobile phone, an image phone, an e-book reader, a desktop PC, a laptop PC, a netbook computer, a workstation, a server, a personal digital assistant (PDA), a portable multimedia player (PMP), an MP3 player, a medical device, a camera, or a wearable device, the present disclosure may be applied.

The display device may be classified into a passive matrix type display device and an active matrix type display device according to a method of driving the light-emitting element LD. For example, when the display device is implemented as an active matrix type, each of the pixels PXL may include a driving transistor which controls an amount of a current supplied to the light-emitting element LD, a switching transistor which transmits a data signal to the driving transistor, and the like.

Recently, an active matrix display device, in which each pixel PXL is selected and turned on in terms of resolution, contrast, and an operation speed, is becoming mainstream, but the present disclosure is not limited thereto. A passive matrix type display device, in which turning-on is performed for each group of the pixel PXL, may also use components (for example, first and second electrodes) for driving the light-emitting element LD.

The substrate SUB may include the display area DA and a non-display area NDA.

According to one or more example embodiments, the display area DA may be disposed in a central area of the display device, and the non-display area NDA may be disposed in an edge area of the display device to surround the display area DA along the periphery of the display area DA. However, the positions of the display area DA and the non-display area NDA are not limited thereto, and the positions thereof may be changed.

The display area DA may be an area in which the pixels PXL displaying an image are provided. The non-display area NDA may be an area in which the driver for driving the pixels PXL and a portion of the line portion for connecting the pixels PXL and the driver are provided. For convenience of description, only one pixel PXL is illustrated in FIG. 5, but the plurality of pixels PXL may be substantially disposed in the display area DA of the substrate SUB.

The display area DA may have various shapes. For example, the display area DA may be provided in a closed polygon having sides formed of straight lines. In one or more example embodiments, the display area DA may be provided in a circle shape and/or an ellipse shape having sides formed of curved lines. Furthermore, the display area DA may be provided in various shapes, such as a semicircle and a semi-ellipse, which include sides formed of straight lines and curved lines.

The non-display area NDA may be provided on at least one side of the display area DA. In one or more example embodiments of the present disclosure, the non-display area NDA may surround a periphery (or edge) of the display area DA.

The line portion connected to the pixels PXL and the driver for driving the pixels PXL may be provided in the non-display area NDA.

The line portion may electrically connect the driver and the pixels PXL. The line portion may provide a signal to each pixel PXL and may be a fan-out line portion connected to signal lines, for example, a scan line, a data line, and an emission control line. In one or more example embodiments, the line portion may be a fan-out line portion connected to signal lines connected to each pixel PXL, for example, a control line and a sensing line in order to compensate for changes in electrical characteristics of each pixel PXL in real time.

The substrate SUB may include a transparent insulating material to transmit light. The substrate SUB may be a rigid substrate or a flexible substrate.

One area of the substrate SUB may be provided as the display area DA, and thus, the pixels PXL may be disposed therein. The remaining area of the substrate SUB may be provided as the non-display area NDA. For example, the substrate SUB may include the display area DA including pixel areas in which the pixels PXL are formed and include the non-display area NDA disposed around (or adjacent to) the display area DA.

The pixels PXL may each be provided in the display area DA of the substrate SUB. In one or more example embodiments of the present disclosure, the pixels PXL may be arranged in the display area DA in a stripe arrangement structure or a pentile arrangement structure, but the present disclosure is not limited thereto.

Each pixel PXL may include at least one light-emitting element LD driven by a corresponding scan signal and data signal. The light-emitting element LD may have a small size ranging from a nanoscale to a microscale and may be parallel with light-emitting elements disposed adjacent thereto, but the present disclosure is not limited thereto. The light-emitting element LD may constitute a light source of each pixel PXL.

Each pixel PXL may include at least one light source driven by certain signals (for example, a scan signal and a data signal) and/or certain powers (for example, first driving power and second driving power). For example, each pixel PXL may include the light-emitting elements LD illustrated in FIGS. 1-4, for example, at least one micro light-emitting element LD having a size ranging from a nanoscale to a microscale. However, in some example embodiments of the present disclosure, a type of the light-emitting element LD usable as the light source of each pixel PXL is not limited thereto.

In one or more example embodiments of the present disclosure, the color, type, and/or number of the pixels PXL are not particularly limited, and as an example, the color of light emitted from each pixel PXL may be variously changed.

The driver may provide a certain signal and certain power to each pixel PXL through the line portion, thereby controlling the driving of the pixel PXL.

The driver may include a scan driver which provides scan signals to the pixels PXL through scan lines, an emission driver which provides emission control signals to the pixels PXL through emission control lines, a data driver which provides data signals to the pixels PXL through data lines, and a timing controller. The timing controller may control the scan driver, the emission driver, and the data driver.

Figure 6A:
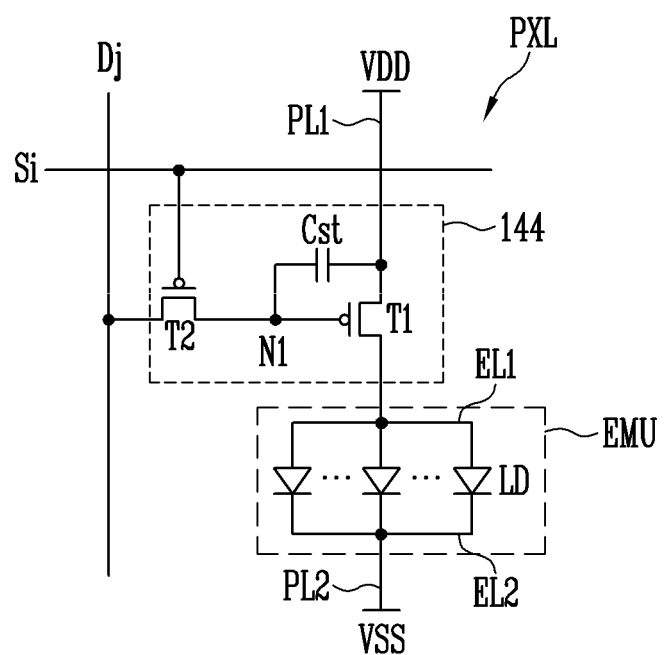
FIGS. 6A-6C are circuit diagrams illustrating electrical connection relationships of components included in one pixel illustrated in FIG. 5 according to various example embodiments.
Figure 6B:
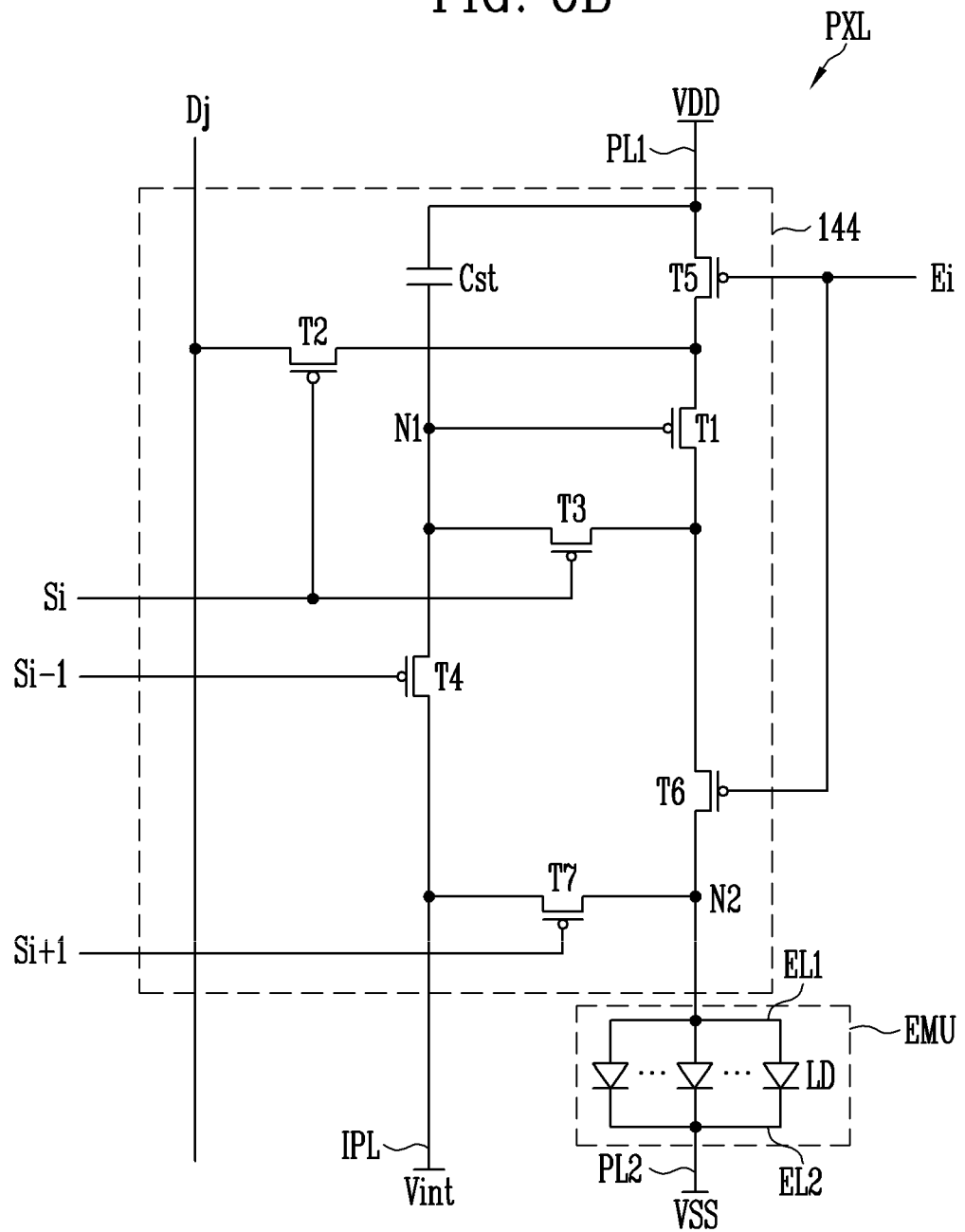
Figure 6C:
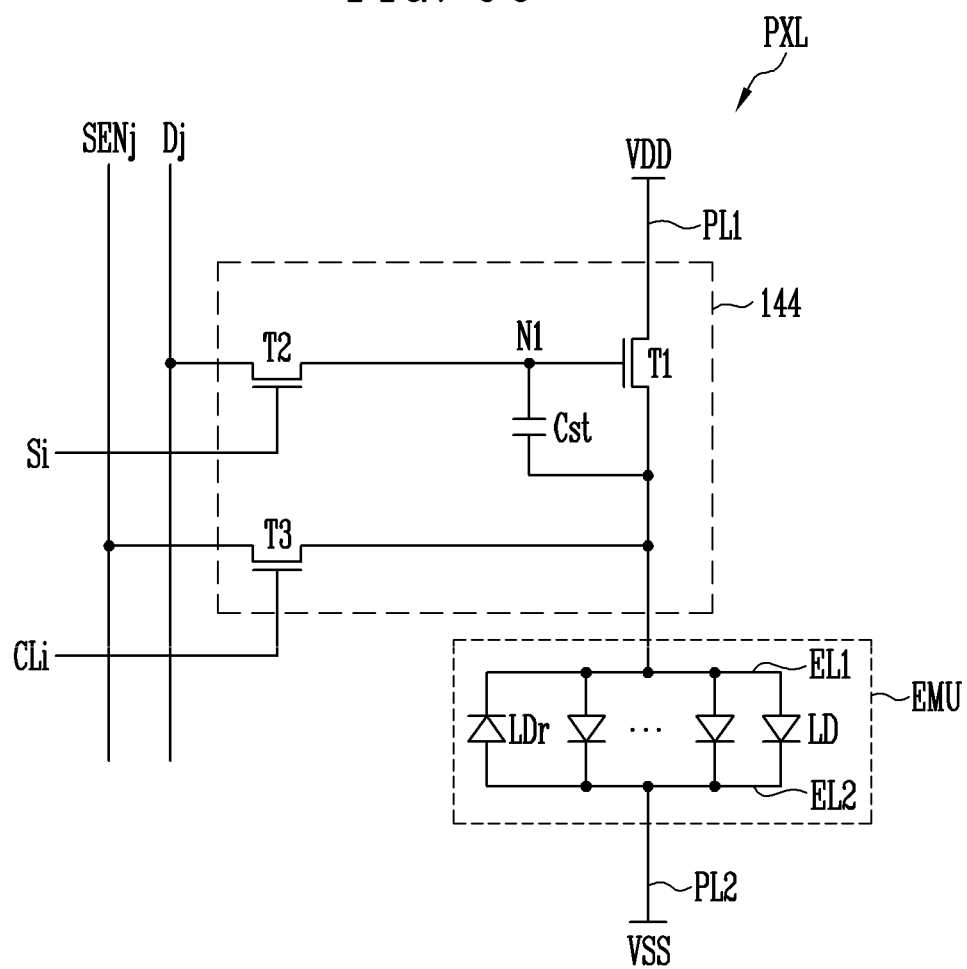

FIGS. 6A-6C are circuit diagrams illustrating electrical connection relationships of components included in one pixel illustrated in FIG. 5 according to various example embodiments.

For example, FIGS. 6A-6C illustrate electrical connection relationships of components included in pixels PXL applicable to an active type display device according to different example embodiments. However, the types of the components included in the pixel PXL to which the example embodiment of the present disclosure is applicable are not limited thereto.

In FIGS. 6A-6C, not only components included in each of the pixels illustrated in FIG. 5 but also an area in which the components are provided are referred to as the pixel PXL. According to one or more example embodiments, each of the pixels PXL illustrated in FIGS. 6A-6C may be any one of the pixels PXL provided in the display device of FIG. 5, and the pixels PXL may have substantially the same or similar structure.

Referring to FIGS. 1-5 and 6A-6C, one pixel PXL (hereinafter, referred to as "pixel") may include a light-emitting unit EMU which generates light having luminance corresponding to a data signal. In one or more example embodiments, the pixel PXL may further optionally include a pixel circuit 144 for driving the light-emitting unit EMU.

According to one or more example embodiments, the light-emitting unit EMU may include a plurality of light-emitting elements LD connected in parallel with each other between a first power line PL1 to which a voltage of a first driving power source VDD is applied and a second power line PL2 to which a voltage of a second driving power source VSS is applied. For example, the light-emitting unit EMU may include a first electrode EL1 (or "first alignment electrode") connected to the first driving power source VDD through the pixel circuit 144 and the first power line PL1, a second electrode EL2 (or "second alignment electrode") connected to the second driving power source VSS through the second power line PL2, and the plurality of light-emitting elements LD connected in parallel with each other in the same direction between the first electrode EL1 and the and second electrode EL2. In one or more example embodiments of the present disclosure, the first electrode EL1 may be an anode, and the second electrode EL2 may be a cathode.

According to one or more example embodiments of the present disclosure, each of the light-emitting elements LD included in the light-emitting unit EMU may include one end connected to the first driving power source VDD through the first electrode EL1 and the other end connected to the second driving power source VSS through the second electrode EL2. The first driving power source VDD and the second driving power source VSS may have different potentials. For example, the first driving power source VDD may be set as a high potential power source, and the second driving power source VSS may be set as a low potential power source. In this case, a potential difference between the first driving power source VDD and the second driving power source VSS may be set to be greater than or equal to a threshold voltage of the light-emitting elements LD during an emission period of the pixel PXL.

As described above, each of the light-emitting elements LD connected in parallel with each other in the same direction (for example, a forward direction) between the first electrode EL1 and the second electrode EL2, to which voltages having different potentials are supplied, may each constitute an effective light source. The effective light sources may be clustered to constitute the light-emitting unit EMU of the pixel PXL.

The light-emitting elements LD of the light-emitting unit EMU may emit light at luminance corresponding to a driving current supplied through the corresponding pixel circuit 144. For example, during each frame period, the pixel circuit 144 may supply a driving current corresponding to a gray level value of corresponding frame data to the light-emitting unit EMU. The driving current supplied to the light-emitting unit EMU may be divided to flow in the light-emitting elements LD. Accordingly, while each light-emitting element LD may emit light at luminance corresponding to a current flowing therein, the light-emitting unit EMU may emit light at luminance corresponding to the driving current.

FIGS. 6A-6C illustrate example embodiments in which the light-emitting elements LD are connected in the same direction (e.g., forward direction) between the first driving power source VDD and the second driving power source VSS, but the present disclosure is not limited thereto. According to one or more example embodiments, as illustrated in FIG. 6C, the light-emitting unit EMU may further include at least one ineffective light source, for example, a reverse light-emitting element LDr, in addition to the light-emitting-elements LD constituting the effective light sources. The reverse light-emitting element LDr is connected in parallel with the light-emitting elements LD between the first electrode EL1 and the second electrode EL2 and may be connected between the first electrode EL1 and the second electrode EL2 in an opposite direction as the light-emitting elements LD. The reverse light-emitting element LDr maintains an inactive state (or a reverse biased state) even when a certain driving voltage (for example, a driving voltage in a forward direction) is applied between the first electrode EL1 and the second electrode EL2, and thus, a current does not substantially flow in the reverse light-emitting element LDr.

The pixel circuit 144 may be connected to a scan line Si and a data line Dj of a corresponding pixel PXL. For example, when the pixel PXL is disposed in an $i^{th}$ row and a $j^{th}$ column of a display area DA (wherein i is a natural number and j is a natural number), the pixel circuit 144 of the pixel PXL may be connected to an $i^{th}$ scan line Si and a $j^{th}$ data line Dj in the display area DA. According to one or more example embodiments, the pixel circuit 144 may include first and second transistors T1 and T2 and a storage capacitor Cst. However, the structure of the pixel circuit 144 is not limited to the example embodiments illustrated in FIGS. 6A-6C.

First, referring to FIG. 6A, the pixel circuit 144 may include the first and second transistors T1 and T2 and the storage capacitor Cst.

A first terminal of the second transistor T2 (e.g., a switching transistor) may be connected to the $j^{th}$ data line Dj, and a second terminal thereof may be connected to a first node N1. Here, the first terminal and the second terminal of the second transistor T2 may be different terminals, and for example, when the first terminal is a source electrode, the second terminal may be a drain electrode. A gate electrode of the second transistor T2 may be connected to the $i^{th}$ scan line Si.

The second transistor T2 may be turned on when a scan signal having a voltage (for example, a low voltage), at which the second transistor T2 may be turned on, is supplied from the $i^{th}$ scan line Si, thereby electrically connecting the $j^{th}$ data line Dj and the first node N1. In this case, a data signal of a corresponding frame is supplied to the $j^{th}$ data line Dj, and thus, the data signal is transmitted to the first node N1. The data signal transmitted to the first node N1 is charged in the storage capacitor Cst, for example, the storage capacitor Cst may be charged according to the data signal from the $j^{th}$ data line Dj transmitted to the first node N1.

A first terminal of the first transistor T1 (e.g., a driving transistor) may be connected to the first driving power source VDD, and a second terminal thereof may be electrically connected to the first electrode EL1 of each of the light-emitting elements LD. A gate electrode of the first transistor T1 may be connected to the first node N1. The first transistor T1 controls an amount of a driving current supplied to the light-emitting elements LD in response to a voltage of the first node N1.

One electrode of the storage capacitor Cst may be connected to the first driving power source VDD, and the other electrode thereof may be connected to the first node N1. The storage capacitor Cst may be charged with a voltage corresponding to a data signal supplied to the first node N1 and may maintain the charged voltage until a data signal of a next frame is supplied.

FIG. 6A illustrates the pixel circuit 144 including the second transistor T2 for transmitting a data signal into the pixel PXL, the storage capacitor Cst for storing the data signal, and the first transistor T1 for supplying a driving current corresponding to the data signal to the light-emitting elements LD.

However, the present disclosure is not limited thereto, and the structure of the pixel circuit 144 may be variously changed and implemented. For example, the pixel circuit 144 may further additionally include other circuit elements such as at least one transistor element, which may include a transistor element for compensating for a threshold voltage of the first transistor T1, a transistor element for initializing the first node N1, and/or a transistor element for controlling emission times of the light-emitting elements LD, and a boosting capacitor for boosting a voltage of the first node N1.

In FIG. 6A, the transistors included in the pixel circuit 144, for example, the first and second transistors T1 and T2 are all illustrated as being p-type transistors, but the present disclosure is not limited thereto. For example, at least one of the first and second transistors T1 and T2 included in the pixel circuit 144 may be changed to an n-type transistor.

The pixel circuit 144 may be further connected to at least one other scan line according to some example embodiments. For example, when the pixel PXL is disposed in the $i^{th}$ row of the display area DA, as illustrated in FIG. 6B, the pixel circuit 144 of the pixel PXL may be further connected to an i-1$^{th}$ scan line Si-1 (e.g., a previous scan line) and/or an i+1$^{th}$ scan line Si+1 (e.g., a next scan line). According to one or more example embodiments, the pixel circuit 144 may be further connected to a third power source in addition to the first and second driving power sources VDD and VSS. For example, the pixel circuit 144 may also be connected to an initialization power source Vint. In this case, the pixel circuit 144 may include first to seventh transistors T1 to T7 and the storage capacitor Cst.

A first terminal of the first transistor T1 (e.g., the driving transistor), for example, a source electrode thereof may be connected to the first driving power source VDD through the fifth transistor T5, and a second terminal thereof, for example, a drain electrode thereof may be electrically connected to one end of the light-emitting elements LD through the sixth transistor T6. A gate electrode of the first transistor T1 may be connected to the first node N1. The first transistor T1 controls a driving current flowing between the first driving power source VDD and the second driving power source VSS through the light-emitting elements LD in response to a voltage of the first node N1.

The second transistor T2 (e.g., the switching transistor) may be connected between the $j^{th}$ data line Dj connected to the pixel PXL and the first terminal of the first transistor T1. A gate electrode of the second transistor T2 may be connected to the $i^{th}$ scan line Si connected to the pixel PXL. The second transistor T2 may be turned on when a scan signal having a gate-on voltage (for example, a low voltage) is supplied from the $i^{th}$ scan line Si, thereby electrically connecting the $j^{th}$ data line Dj and the first terminal of the first transistor T1. Therefore, when the second transistor T2 is turned on, a data signal supplied from the $j^{th}$ data line Dj may be transmitted to the first transistor T1.

The third transistor T3 may be connected between the second terminal of the first transistor T1 and the first node N1. A gate electrode of the third transistor T3 may be connected to the $i^{th}$ scan line Si. The third transistor T3 may be turned on when a scan signal having a gate-on voltage (for example, a low voltage) is supplied from the $i^{th}$ scan line Si, thereby electrically connecting the second terminal of the first transistor T1 and the first node N1.

The fourth transistor T4 may be connected between the first node N1 and an initialization power line IPL to which the initialization power source Vint is connected. A gate electrode of the fourth transistor T4 may be connected to a previous scan line, for example, an i-1$^{th}$ scan line Si-1. The fourth transistor T4 may be turned on when a scan signal having a gate-on voltage (for example, a low voltage) is supplied to the i-1$^{th}$ scan line Si-1, thereby transmitting a voltage of the initialization power source Vint to the first node N1. Here, the initialization power source Vint may have a voltage less than or equal to a minimum voltage of a data signal.

The fifth transistor T5 may be connected between the first power driving source VDD and the first terminal of the first transistor T1. A gate electrode of the fifth transistor T5 may be connected to a corresponding emission control line, for example, an $i^{th}$ emission control line Ei. The fifth transistor T5 may be turned off when an emission control signal having a gate-off voltage (for example, a high voltage) is supplied to the $i^{th}$ emission control line Ei, and may be turned on otherwise.

The sixth transistor T6 may be connected between the second terminal of the first transistor T1 and one end of the light-emitting elements LD. A gate electrode of the sixth transistor T6 may be connected to the $i^{th}$ emission control line Ei. The sixth transistor T6 may be turned off when an emission control signal having a gate-off voltage (for example, a high voltage) is supplied to the $i^{th}$ emission control line Ei, and may be turned on otherwise.

The seventh transistor T7 may be connected between one end of the light-emitting elements LD and the initialization power line IPL. A gate electrode of the seventh transistor T7 may be connected to any one of scan lines in a next row, for example, an i+1$^{th}$ scan line Si+1. The seventh transistor T7 may be turned on when a scan signal having a gate-on voltage (for example, a low voltage) is supplied to the i+1$^{th}$ scan line Si+1, thereby supplying a voltage of the initialization power source Vint to one end of the light-emitting elements LD.

The storage capacitor Cst may be connected between the first driving power source VDD and the first node N1. The storage capacitor Cst may store a data signal supplied to the first node N1 during each frame period and a voltage corresponding to a threshold voltage of the first transistor T1.

In FIG. 6B, the transistors included in the pixel circuit 144, for example, the first to seventh transistors T1 to T7 are all illustrated as being p-type transistors, but the present disclosure is not limited thereto. For example, at least one of the first to seventh transistors T1 to T7 may be changed to an n-type transistor.

In one or more example embodiments of the present disclosure, the configuration of the pixel circuit 144 is not limited to the example embodiments illustrated in FIGS. 6A and 6B. For example, the pixel circuit 144 may be configured as in the example embodiment shown in FIG. 6C.

As illustrated in FIG. 6C, the pixel circuit 144 may be further connected to a control line CLi and a sensing line SENj. For example, the pixel circuit 144 may be connected to an $i^{th}$ control line CLi and a $j^{th}$ sensing line SENj in the display area DA. The pixel circuit 144 may further include a third transistor T3 in addition to the first and second transistors T1 and T2 illustrated in FIG. 6A.

The third transistor T3 is connected between the first transistor T1 and the $j^{th}$ sensing line SENj. For example, one electrode of the third transistor T3 may be connected to a first terminal (for example, a source electrode) of the first transistor T1 connected to the first electrode EL1, and the other electrode of the third transistor T3 may be connected to the $j^{th}$ sensing line SENj.

According to one or more example embodiments, a gate electrode of the third transistor T3 is connected to the $i^{th}$ control line CLi. In some embodiments, when the $i^{th}$ control line CLi is omitted, the gate electrode of the third transistor T3 may be connected to the $i^{th}$ scan line Si. The third transistor T3 is turned on by a control signal having a gate-on voltage (for example, a high level voltage) supplied to the $i^{th}$ control line CLi during a certain sensing period, thereby electrically connecting the $j^{th}$ sensing line SENj and the first transistor T1.

According to one or more example embodiments, the sensing period may be a period for extracting characteristic information (for example, a threshold voltage or the like of the first transistor T1) of each of the pixels PXL disposed in the display area DA. During the above-described sensing period, a certain reference voltage, at which the first transistor T1 may be turned on, may be supplied to the first node N1 through the $j^{th}$ data line Dj and the second transistor T2, or each pixel PXL may be connected to a current source or the like to turn the first transistor T1 on. In some embodiments, a control signal having a gate-on voltage may be supplied to the third transistor T3 (e.g., via the control line CLi) to turn the third transistor T3 on, thereby connecting the first transistor T1 to the $j^{th}$ sensing line SENj. Accordingly, characteristic information of each pixel PXL including the threshold voltage or the like of the first transistor T1 may be extracted through the $j^{th}$ sensing line SENj described above. The extracted characteristic information may be used to convert image data so that a characteristic deviation between pixels PXL is compensated for.

In FIG. 6C, the storage capacitor Cst may be connected between the first node N1 and the source electrode of the first transistor T1. The storage capacitor Cst may store a voltage corresponding to a data signal supplied to the first node N1 during each frame period and a voltage corresponding to a threshold voltage of the first transistor T1.

In FIG. 6C, the first to third transistors T1 to T3 are all illustrated as being n-type transistors, but the present disclosure is not limited thereto. For example, at least one of the first to third transistors T1 to T3 may be changed to a p-type transistor. FIG. 6C illustrates an example embodiment in which the light-emitting unit EMU is connected between the pixel circuit 144 and the second driving power source VSS, but the light-emitting unit EMU may be connected between the first driving power source VDD and the pixel circuit 144.

In addition, FIGS. 6A-6C illustrate the example embodiments in which the light-emitting elements LD constituting the light-emitting unit EMU are all connected in parallel, but the present disclosure is not limited thereto. According to one or more example embodiments, the light-emitting unit EMU may include at least one series stage including the plurality of light-emitting elements LD connected in parallel with each other. For example, the light-emitting unit EMU may also have a series-and-parallel mixed structure.

The structure of the pixel PXL applicable to the present disclosure is not limited to the example embodiments illustrated in FIGS. 6A-6C, and the pixel PXL may have various structures. For example, each pixel PXL may be provided inside a passive light-emitting display device. In this case, the pixel circuit 144 may be omitted, and both ends of the light-emitting elements LD included in the light-emitting unit EMU may be directly connected to the $i^{th}$ scan line Si, the $j^{th}$ data line Dj, the first power line PL1 to which the first driving power source VDD is connected, the second power line PL2 to which the second driving power source VSS is connected, and/or a certain control line (e.g., CLi).

Figure 7:
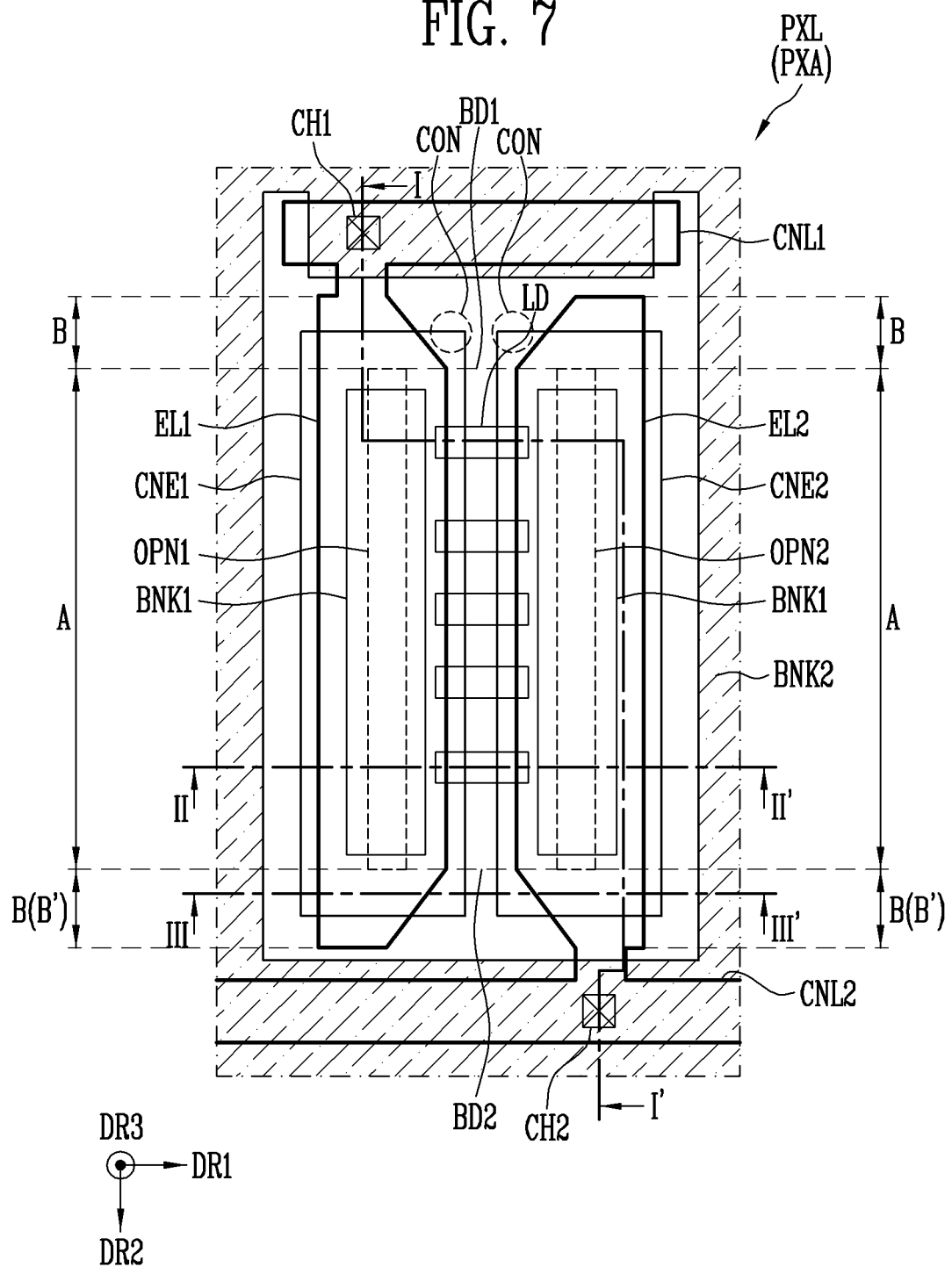
FIG. 7 is a schematic plan view illustrating one of the pixels illustrated in FIG. 5.
Figure 8:
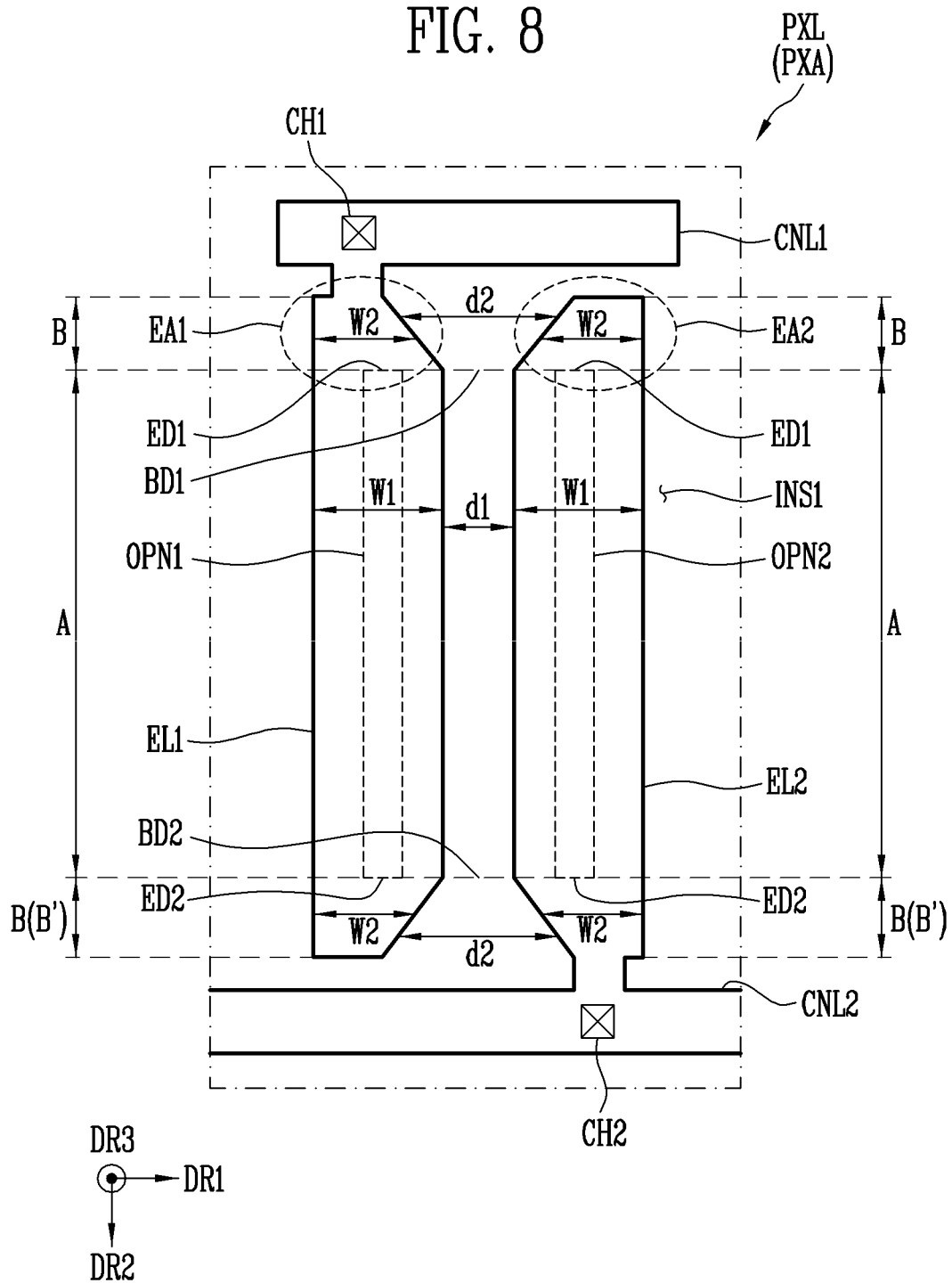
FIG. 8 is a plan view illustrating only first and second connection lines, first and second electrodes, and a first insulating layer of FIG. 7.
Figure 9:
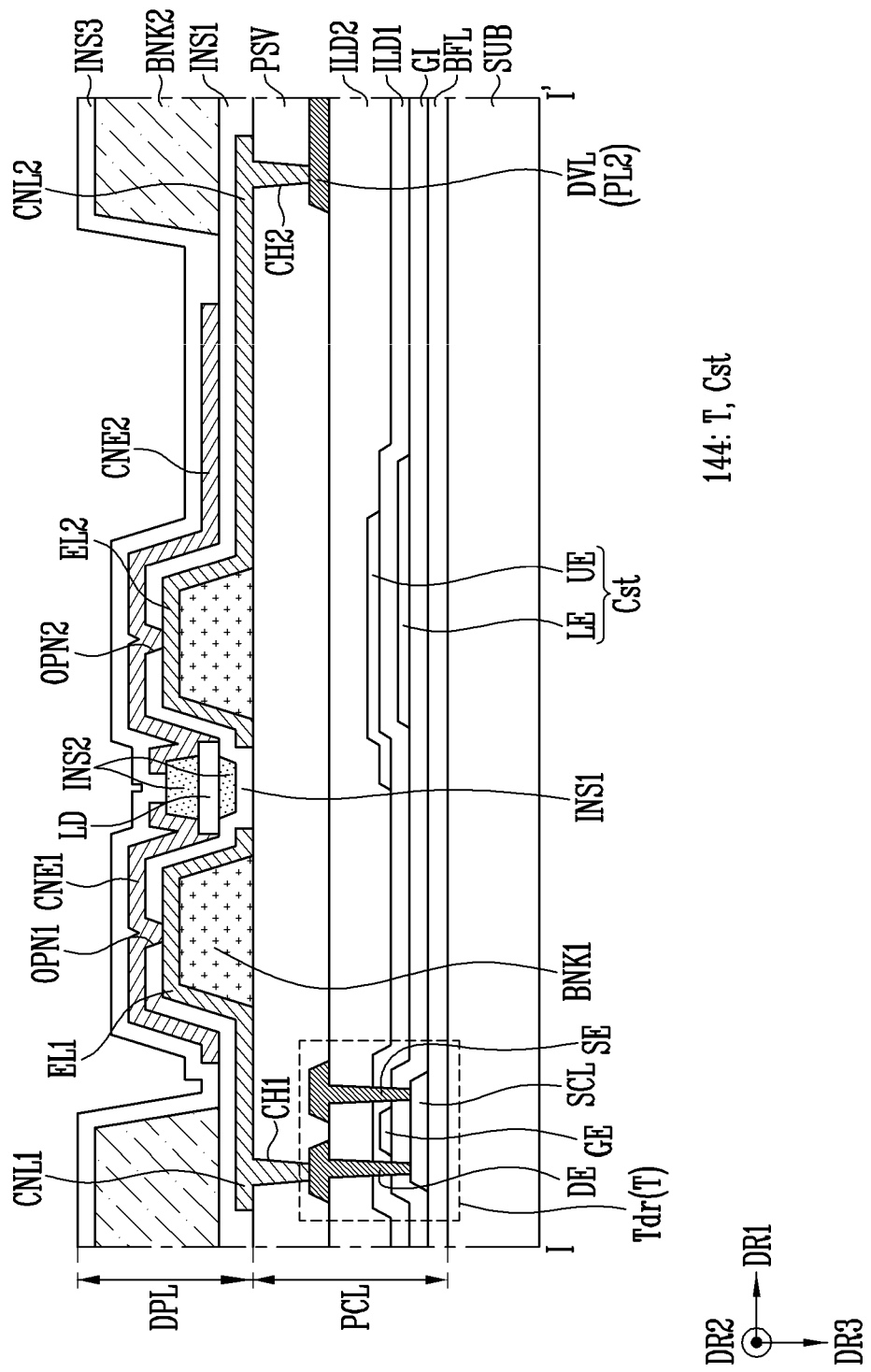
FIG. 9 is a cross-sectional view taken along the line I-I' of FIG. 7.
Figure 10:
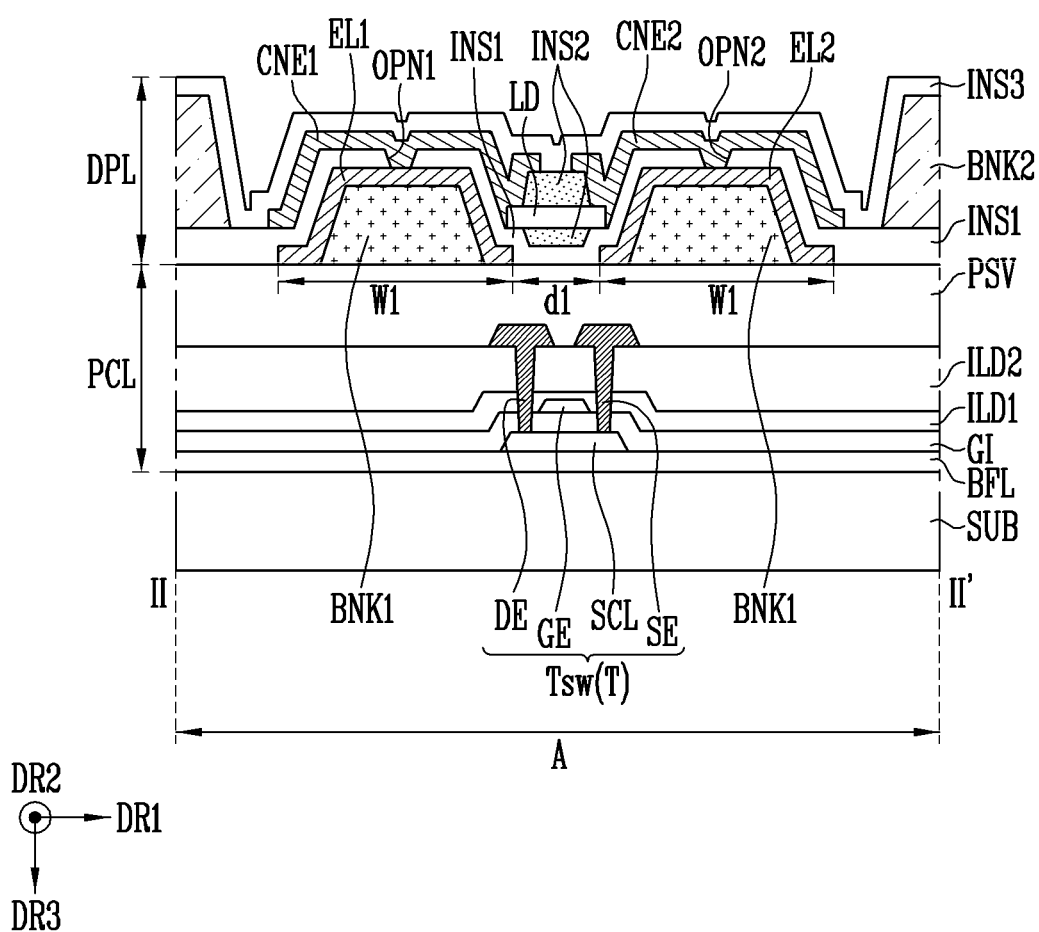
FIG. 10 is a cross-sectional view taken along the line II-II' of FIG. 7.
Figure 11:
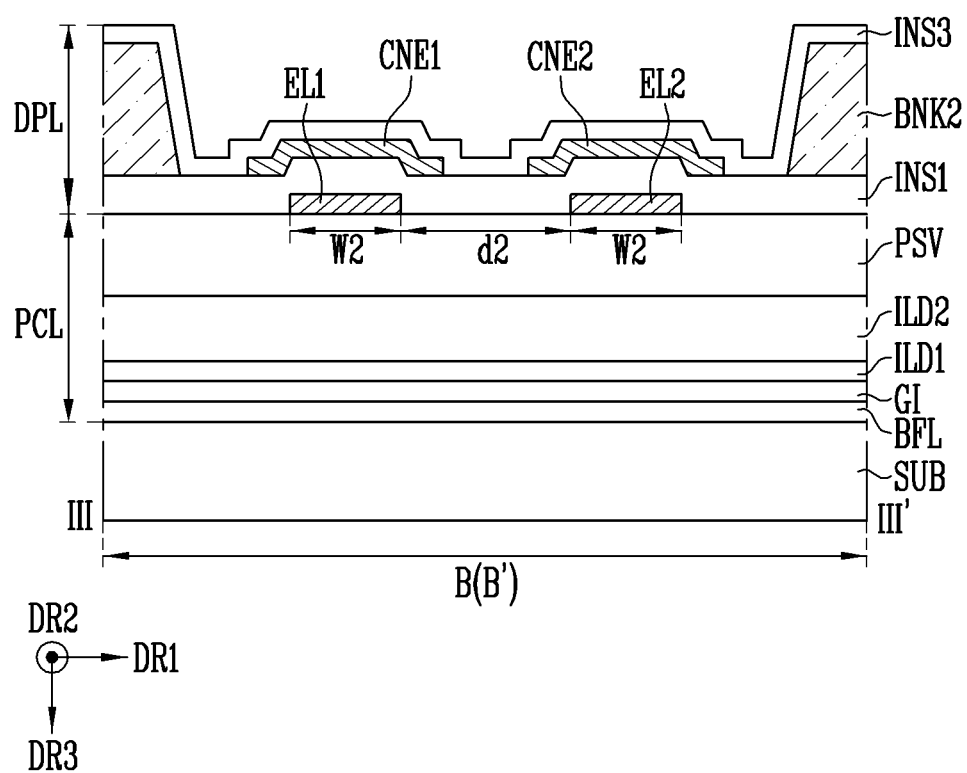
FIG. 11 is a cross-sectional view taken along the line III-III' of FIG. 7.
Figure 12:
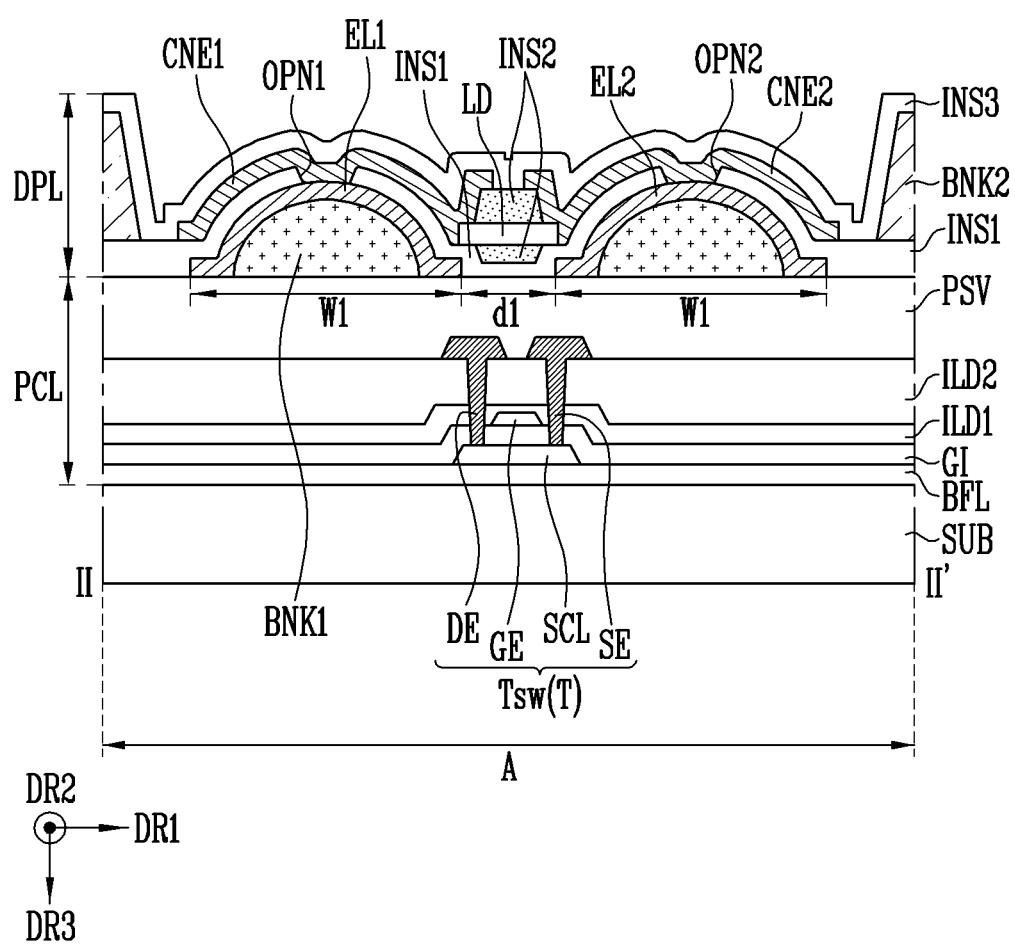
FIG. 12 is a view of a first bank pattern illustrated in FIG. 11 implemented according to another example embodiment and is a cross sectional view corresponding to the line II-II' of FIG. 7.
Figure 13:
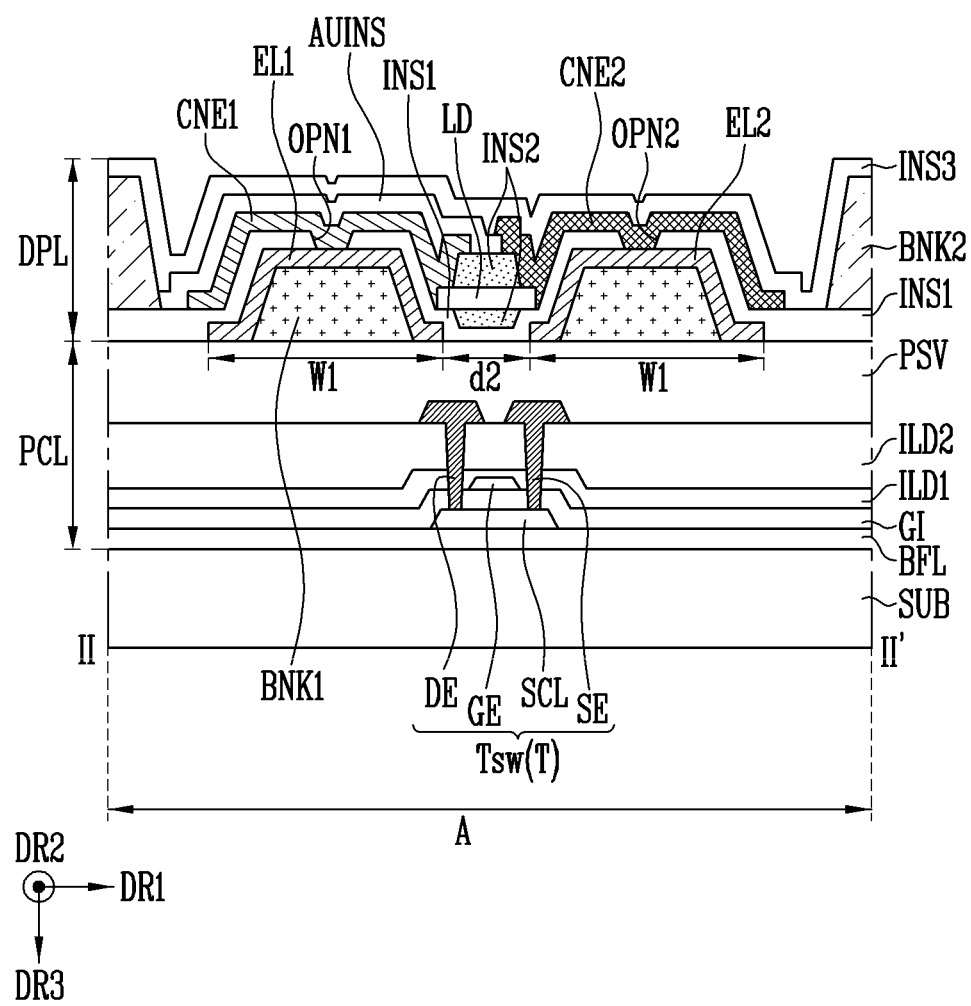
FIG. 13 is a view of a second contact electrode illustrated in FIG. 11 implemented according to another example embodiment and is a cross-sectional view corresponding to the line II-II' of FIG. 7.
Figure 14A:
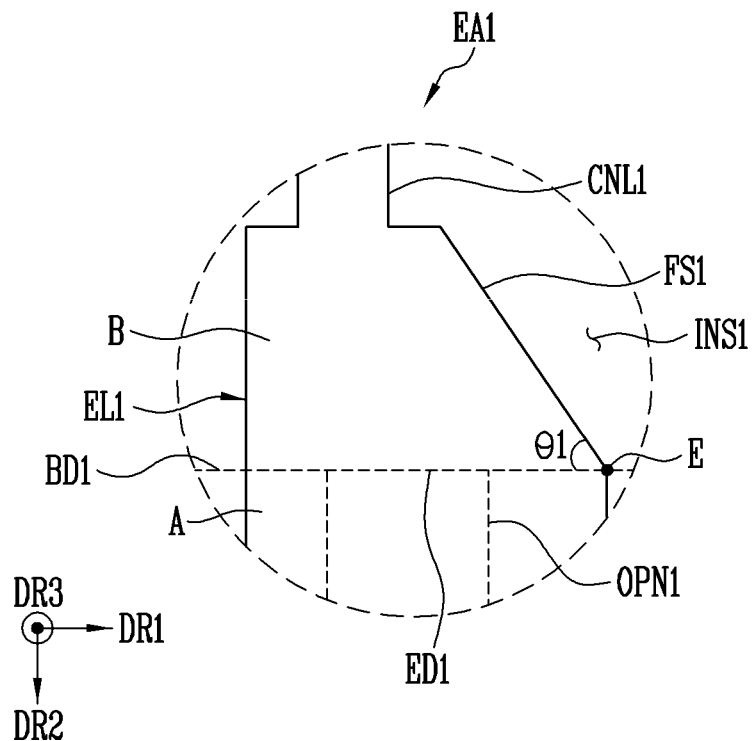
FIG. 14A is a schematic enlarged plan view of a portion EA1 of FIG. 8.
Figure 14B:
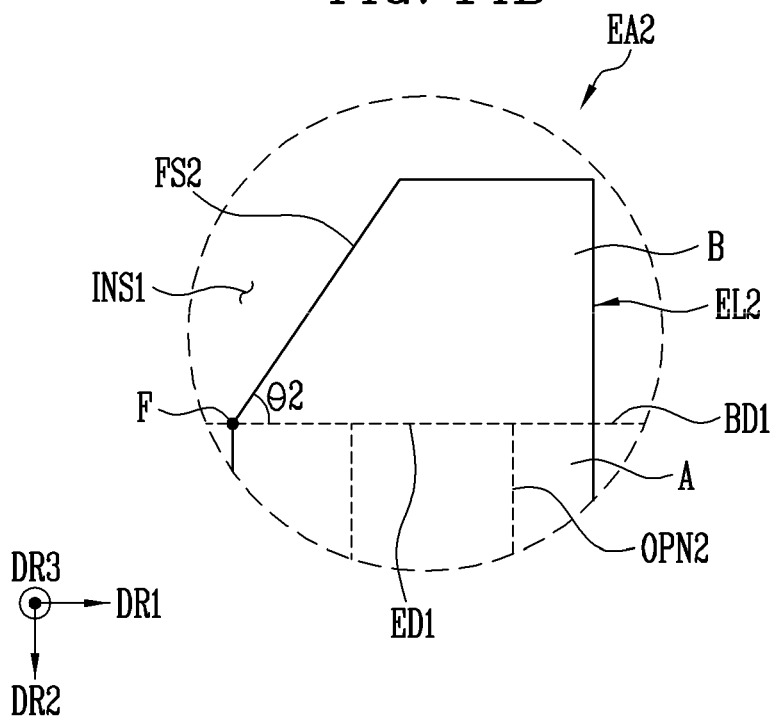
FIG. 14B is a schematic enlarged plan view of a portion EA2 of FIG. 8.

FIG. 7 is a schematic plan view illustrating one of the pixels illustrated in FIG. 5. FIG. 8 is a plan view illustrating only first and second connection lines, first and second electrodes, and a first insulating layer of FIG. 7. FIG. 9 is a cross-sectional view taken along the line I-I' of FIG. 7. FIG. 10 is a cross-sectional view taken along the line II-II' of FIG. 7. FIG. 11 is a cross-sectional view taken along the line III-III' of FIG. 7. FIG. 12 is a view of a first bank pattern illustrated in FIG. 11 implemented according to another example embodiment and is a cross sectional view corresponding to the line II-II' of FIG. 7. FIG. 13 is a view of a second contact electrode illustrated in FIG. 11 implemented according to another example embodiment and is a cross-sectional view corresponding to the line II-II' of FIG. 7. FIG. 14A is a schematic enlarged plan view of a portion EA1 of FIG. 8. FIG. 14B is a schematic enlarged plan view of a portion EA2 of FIG. 8.

The pixel illustrated in FIG. 7 may be the pixel illustrated in FIG. 6A.

In FIG. 7, transistors connected to light-emitting elements and signal lines connected to the transistors are omitted for convenience.

In FIGS. 7-14B, one pixel PXL is simplified and illustrated by illustrating each electrode as a single-film electrode and illustrating each insulating layer as an insulating layer that is a single-film, but the present disclosure is not limited thereto.

In one or more example embodiments of the present disclosure, the phrase "formed and/or provided on the same layer" may mean the phrase "formed through the same process," and the phrase "formed and/or provided on different layers" may mean the phrase "formed through different processes."

In one or more example embodiments of the present disclosure, the term "connection" between two components may mean that both electrical and physical connections are used.

In one or more example embodiments of the present disclosure, for convenience of description, a lateral direction (or horizontal direction) in a plan view is expressed as a first direction DR1, a longitudinal direction (or vertical direction) in a plan view is expressed as a second direction DR2, and a thickness direction of a substrate SUB on a cross section is expressed as a third direction DR3. The first to third directions DR1, DR2, and DR3 may refer to directions indicated by the first to third directions DR1, DR2, and DR3, respectively.

Referring to FIGS. 1-6A and 7-14B, a display device according to one or more example embodiments of the present disclosure may include a plurality of pixels PXL provided on the substrate SUB.

The substrate SUB may include a transparent insulating material to transmit light. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate which include a polymer organic material. For example, the flexible substrate may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material constituting the substrate SUB may be variously changed and may also include fiber reinforced plastic (FRP) or the like. A material applied to the substrate SUB may have resistance (or heat resistance) to a high processing temperature in a manufacturing process of the display device.

The substrate SUB may include a display area DA including at least one pixel area PXA in which the pixels PXL are disposed, and a non-display area NDA disposed around (or adjacent to) the display area DA.

The pixels PXL may be arranged in a matrix form or a stripe form according to a plurality of pixel rows extending in the first direction DR1 in the display area DA on the substrate SUB and a plurality of pixel columns extending in the second direction DR2 that is different from the first direction DR1, for example, a direction crossing the first direction DR1, but the present disclosure is not limited thereto. According to one or more example embodiments, the pixels PXL may be provided in the display area DA on the substrate SUB in various arrangement forms.

The pixel area PXA, in which each pixel PXL is provided (or formed), includes an emission area in which light is emitted and a peripheral area which is adjacent to the emission area (or surrounds the periphery of the emission area, in other words, the peripheral area may be adjacent to the emission area and/or may surround the emission area along the periphery of the emission area). In one or more example embodiments of the present disclosure, the peripheral area may include a non-emission area in which light is not emitted.

A line portion electrically connected to the pixels PXL may be positioned on the substrate SUB. The line portion may include a plurality of signal lines transmitting certain signals (or certain voltages) to each pixel PXL. The signal lines may include an $i^{th}$ scan line Si for transmitting a scan signal to each pixel PXL, a $j^{th}$ data line Dj for transmitting a data signal to each pixel PXL, and power lines PL1 and PL2 for transmitting driving power to each pixel PXL. According to one or more example embodiments, the line portion may further include an emission control line (e.g., Ei) that transmits an emission control signal to each pixel PXL. According to another example embodiment, the line portion may further include a sensing line (SENj) and a control line (CLi) connected to each pixel PXL.

Each pixel PXL may be provided on the substrate SUB and may include a pixel circuit layer PCL including a pixel circuit 144 and a display element layer DPL including a plurality of light-emitting elements LD. The light-emitting elements LD may be positioned in the pixel area PXA of each pixel PXL.

For convenience, the pixel circuit layer PCL is first described, and then, the display element layer DPL is described.

The pixel circuit layer PCL may include a buffer layer BFL, the pixel circuit 144 provided on the buffer layer BFL, and a passivation layer PSV disposed on the pixel circuit 144.

The buffer layer BFL may prevent impurities from being diffused into transistors T included in the pixel circuit 144. The buffer layer BFL may be an inorganic insulating film including an inorganic material. The buffer layer BFL may include at least one selected from metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single-film but may also be provided as a multi-film including a double or more layered film. When the buffer layer BFL is provided as the multi-film, respective layers may be made of the same material or may be made of different materials. The buffer layer BFL may be omitted according to the material and process conditions of the substrate SUB.

The pixel circuit 144 may include at least one transistor T and a storage capacitor Cst. The transistor T may include a driving transistor Tdr for controlling a driving current of the light-emitting elements LD and a switching transistor Tsw connected to the driving transistor Tdr. However, the present disclosure is not limited thereto, and the pixel circuit 144 may further include circuit elements that perform other functions in addition to the driving transistor Tdr and the switching transistor Tsw. In the following example embodiments, the driving transistor Tdr and the switching transistor Tsw will be collectively referred to as a transistor T or transistors T. The driving transistor Tdr may be the same component as the first transistor T1 described with reference to FIG. 6A, and the switching transistor Tsw may be the same component as the second transistor T2 described with reference to FIG. 6A.

Each of the driving transistor Tdr and the switching transistor Tsw may include a semiconductor pattern SCL, a gate electrode GE, a first terminal SE, and a second terminal DE. The first terminal SE may be one electrode of a source electrode and a drain electrode, and the second terminal DE may be the other electrode of the source electrode and the drain electrode. For example, when the first terminal SE is a source electrode, the second terminal DE may be a drain electrode.

The semiconductor pattern SCL may be provided/formed on the buffer layer BFL. The semiconductor pattern SCL may include a first contact region in contact with the first terminal SE and a second contact region in contact with the second terminal DE. A region of the semiconductor pattern SCL between the first contact region and the second contact region may be a channel region. The channel region may overlap the gate electrode GE of the corresponding transistor T. The semiconductor pattern SCL may be a semiconductor pattern made of poly silicon, amorphous silicon, oxide semiconductor, or the like. The channel region may be, for example, a semiconductor pattern that is not doped with impurities and may be an intrinsic semiconductor. The first contact region and the second contact region may be semiconductor patterns doped with impurities.

The gate electrode GE may be disposed and/or formed on a gate insulating layer GI to correspond to the channel region of the semiconductor pattern SCL. The gate electrode GE may be provided on the gate insulating layer GI to overlap the channel region of the semiconductor pattern SCL. The gate electrode GE may have a single-structure made of one selected from the group consisting of copper (Cu), molybdenum (Mo), tungsten (W), aluminum neodymium (AlNd), titanium (Ti), aluminum (Al), silver (Ag), and an alloy thereof, or a mixture thereof or may have a double- or multi-structure including a low resistance material, such as molybdenum (Mo), titanium (Ti), copper (Cu), aluminum (Al), or silver (Ag) in order to reduce line resistance.

The gate insulating layer GI may be disposed on the buffer layer BFL to cover the buffer layer BFL and the semiconductor pattern SCL. The gate insulating layer GI may be an inorganic insulating film including an inorganic material. For example, the gate insulating layer GI may include at least one selected from metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to the above-described example embodiments. According to one or more example embodiments, the gate insulating layer GI may be formed as an organic insulating film including an organic material. The gate insulating layer GI may be provided as a single-film but may also be provided as a multi-film including a double or more layered film.

The first terminal SE and the second terminal DE of the transistor T may be disposed and/or formed on a second interlayer insulating layer ILD2 and may be in contact with the first contact region and the second contact region of the semiconductor pattern SCL through contact holes sequentially passing through the gate insulating layer GI and first and second interlayer insulating layers ILD1 and ILD2. For example, the first terminal SE may be in contact with the first contact region of the semiconductor pattern SCL, and the second terminal DE may be in contact with the second contact region of the semiconductor pattern SCL. Each of the first and second terminals SE and DE may include the same material as the gate electrode GE or may include at least one selected from the materials described as structure materials of the gate electrode GE.

The first interlayer insulating layer ILD1 may include the same material as the gate insulating layer GI or may include at least one selected from the materials described as structure materials of the gate insulating GI. The first interlayer insulating layer ILD1 may be disposed on the gate insulating layer GI to cover the gate insulating layer GI and the gate electrode GE. The second interlayer insulating layer ILD2 may be disposed and/or formed on the first interlayer insulating layer ILD1. The second interlayer insulating layer ILD2 may be an inorganic insulating film including an inorganic material or an organic insulating film including an organic material. According to one or more example embodiments, the second interlayer insulating layer ILD2 may include the same material as the first interlayer insulating layer ILD1, but the present disclosure is not limited thereto. The second interlayer insulating layer ILD2 may be provided as a single-film but may also be provided as a multi-film including a double or more layered film.

In the above-described example embodiments, it has been described that the first and second terminals SE and DE of each of the driving transistor Tdr and the switching transistor Tsw are separate electrodes electrically connected to the semiconductor pattern SCL through the contact holes sequentially passing through the gate insulating layer GI and the first and second interlayer insulating layers ILD1 and ILD2, but the present disclosure is not limited thereto. According to one or more example embodiments, the first terminal SE of each of the driving transistor Tdr and the switching transistor Tsw may be a first contact region adjacent to the channel region of the semiconductor pattern SCL, and the second terminal DE of each of the driving transistor Tdr and the switching transistors Tsw may be a second contact region adjacent to the channel region of the semiconductor pattern SCL. In this case, the second terminal DE of the driving transistor Tdr may be electrically connected to the light-emitting elements LD of the pixel PXL through a separate connection means such as a bridge electrode or the like (e.g., the second terminal DE of the driving transistor Tdr may be electrically connected to the light-emitting elements LD via the first connection line CNL1, the first electrode EL1, and the first contact electrode CNE1 of the pixel PXL).

In one or more example embodiments of the present disclosure, the transistors T included in the pixel circuit 144 may be formed as low temperature polysilicon thin film transistors, but the present disclosure is not limited thereto. According to one or more example embodiments, the transistors T included in the pixel circuit 144 may be formed as oxide semiconductor thin film transistors. For example, a case, in which the transistors T are thin film transistors having a top gate structure, has been described as an example, but the present disclosure is not limited thereto, and the structure of the transistors T may be variously changed.

The storage capacitor Cst may include a lower electrode LE provided on the gate insulating layer GI and an upper electrode UE provided on the first interlayer insulating layer ILD1 to overlap the lower electrode LE.

The lower electrode LE may be provided at the same layer as the gate electrode GE of each of the driving transistor Tdr and the switching transistor Tsw and the $i^{th}$ scan line Si, and may include the same material as the gate electrode GE. The lower electrode LE may be provided integrally with the gate electrode GE of the driving transistor Tdr. In this case, the lower electrode LE may be regarded as one region of the gate electrode GE of the driving transistor Tdr. According to one or more example embodiments, the lower electrode LE may be provided as a component that is separate from the gate electrode GE of the driving transistor Tdr (e.g., not integrated with the gate electrode GE). In this case, the lower electrode LE and the gate electrode GE of the driving transistor Tdr may be electrically connected through a separate connection means.

The upper electrode UE may overlap and cover the lower electrode LE. A capacitance of the storage capacitor Cst may be increased by increasing an overlapping region of the upper electrode UE and the lower electrode LE. The upper electrode UE may be electrically connected to a first power line PL1. The storage capacitor Cst may be covered by the second interlayer insulating layer ILD2.

The pixel circuit layer PCL may include a driving voltage line DVL provided and/or formed on the second interlayer insulating layer ILD2. The driving voltage line DVL may have the same component as the second power line PL2 described with reference to FIG. 6A. The driving voltage line DVL (PL2) may be connected to a second driving power source VSS, and a voltage of the second driving power source VSS may be applied to the driving voltage line DVL (PL2). The pixel circuit layer PCL may further include the first power line PL1 connected to a first driving power source VDD. The first power line PL1 may be provided on the same layer as the driving voltage line DVL (PL2) or may be provided on a different layer from the driving voltage line DVL (PL2). In one or more example embodiments of the present disclosure, it has been described that the driving voltage line DVL (PL2) is provided at the same layer as the first and second terminals SE and DE of the driving transistor Tdr, but the present disclosure is not limited thereto. According to one or more example embodiments, the driving voltage line DVL (PL2) may be provided at the same layer as any one of conductive layers provided in the pixel circuit layer PCL. For example, the position of the driving voltage line DVL (PL2) in the pixel circuit layer PCL may be variously changed.

The first power line PL1 may be electrically connected to some components of the display element layer DPL, for example, a first electrode EL1, and the driving voltage line DVL (PL2) may be electrically connected to some components of the display element layer DPL, for example, a second electrode EL2. The first power line PL1 and the driving voltage line DVL (PL2) may transmit an alignment signal (or alignment voltage) to the first and second electrodes EL1 and EL2 to align the light-emitting elements LD in the pixel area PXA of each of the pixels PXL. In some embodiments, after the light-emitting elements LD are aligned, each of the first power line PL1 and the driving voltage line DVL (PL2) may transmit a voltage of a corresponding driving power source to each pixel PXL, thereby driving the light-emitting elements LD.

Each of the first power line PL1 and the driving voltage line DVL (PL2) may include a conductive material. For example, each of the first power line PL1 and the driving voltage line DVL (PL2) may have a single-film structure made of one selected from the group consisting of copper (Cu), molybdenum (Mo), tungsten (W), aluminum neodymium (AlNd), titanium (Ti), aluminum (Al), silver (Ag), and an alloy thereof, or a mixture thereof or may have a double- or multi-structure including a low resistance material, such as molybdenum (Mo), titanium (Ti), copper (Cu), aluminum (Al), or silver (Ag) in order to reduce line resistance. For example, each of the first power line PL1 and the driving voltage line DVL (PL2) may be formed as a double-film in which titanium (Ti) and copper (Cu) are sequentially stacked.

The passivation layer PSV may be disposed and/or formed on the transistors T and the driving voltage line DVL (PL2).

The passivation layer PSV may be provided in the form of an organic insulating film, an inorganic insulating film, or an organic insulating film disposed on an inorganic insulating film. The inorganic insulating film may include, for example, at least one selected from metal oxides such as silicon oxide ($SiO_x$), silicon nitride ($SiN_x$), silicon oxynitride ($SiO_xN_y$), and aluminum oxide ($AlO_x$). The organic insulating film may include, for example, at least one selected from an acrylic-based resin (polyacrylate-based resin), an epoxy-based resin, a phenolic-based resin, a polyamide-based resin, a polyimide-based resin, an unsaturated polyester-based resin, a poly-phenylenether-based resin, a poly-phenylene sulfide-based resin, and a benzocyclobutene resin.

The passivation layer PSV may include a first contact hole CH1 exposing one region of the second terminal DE of the driving transistor Tdr and a second contact hole CH2 exposing one region of the driving voltage line DVL (PL2).

The display element layer DPL may be disposed on the passivation layer PSV.

The display element layer DPL may include first and second bank patterns BNK1 and BNK2, first and second connection lines CNL1 and CNL2, the first and second electrodes EL1 and EL2, the light-emitting elements LD, and first and second contact electrodes CNE1 and CNE2. In some embodiments, the display element layer DPL may include first to third insulating layers INS1 to INS3.

The first bank pattern BNK1 may be positioned in an emission area of each pixel area PXA of the pixels PXL, in which light is emitted. In order to guide light emitted from the light-emitting elements LD in an image display direction (for example, a front direction) of the display device, the first bank pattern BNK1 may be a support member for supporting each of the first and second electrodes EL1 and EL2 so as to change a surface profile (or shape) of each of the first and second electrodes EL1 and EL2 in the third direction DR3. For example, the first bank pattern BNK1 may change the surface profile (or the shape) of each of the first and second electrodes EL1 and EL2 in the third direction DR3.

The first bank pattern BNK1 may be provided and/or formed between the passivation layer PSV and a corresponding electrode in an emission area of a corresponding pixel PXL. For example, the first bank pattern BNK1 may be provided and/or formed between the passivation layer PSV and the first electrode EL1 and between the passivation layer PSV and the second electrode EL2.

The first bank pattern BNK1 may be an inorganic insulating film including an inorganic material or an organic insulating film including an organic material. According to some example embodiments, the first bank pattern BNK1 may include an organic insulating film that is a single-film and/or an inorganic insulating film that is a single-film, but the present disclosure is not limited thereto. According to one or more example embodiments, the first bank pattern BNK1 may be provided in the form of a multi-film in which at least one organic insulating film and at least one inorganic insulating film are stacked. However, the material of the first bank pattern BNK1 is not limited to the above-described example embodiments, and according to one or more example embodiments, the first bank pattern BNK1 may include a conductive material.

The first bank pattern BNK1 may have a cross section having a trapezoidal shape of which a width is gradually decreased upward from one surface (for example, an upper surface) of the passivation layer PSV in the third direction DR3, but the present disclosure is not limited thereto. According to one or more example embodiments, as illustrated in FIG. 12, the first bank pattern BNK1 may have a cross section having a semicircular shape (or a hemispherical shape) which has a curved surface and of which a width is gradually decreased upward from one surface of the passivation layer PSV in the third direction DR3. When viewed in a cross section, the shape of the first bank pattern BNK1 is not limited to the above-described example embodiments and may be variously changed within a range capable of improving efficiency of light emitted from each of the light-emitting elements LD. The first bank patterns BNK1 adjacent to each other in the first direction DR1 may be disposed on the same surface of the passivation layer PSV and may have the same height (or thickness) in the third direction DR3.

In the above-described example embodiment, it has been described that the first bank pattern BNK1 is provided and/or formed on the passivation layer PSV so that the first bank pattern BNK1 and the passivation layer PSV are formed through different processes, but the present disclosure is not limited thereto. According to some example embodiments, the first bank pattern BNK1 and the passivation layer PSV may be formed through the same process. In this case, the first bank pattern BNK1 may be one region of the passivation layer PSV.

The second bank pattern BNK2 may be a structure that defines (or partitions) each pixel PXL and the pixel area PXA (or emission area) of each of the adjacent pixels PXL, and may be, for example, a pixel definition film. The second bank pattern BNK2 may include at least one light blocking material and/or reflective material, thereby preventing light leakage in which light (or ray) leaks between each pixel PXL and adjacent pixels PXL. According to one or more example embodiments, the second bank pattern BNK2 may include a transparent material. The transparent material may include, for example, a polyimide-based resin, a polyimide-based rein, or the like, but the present disclosure is not limited thereto. According to another example embodiment, a reflective material layer may be formed on the second bank pattern BNK2 to further improve efficiency of light emitted from each pixel PXL.

The second bank pattern BNK2 may be provided and/or formed on a different layer from the first bank pattern BNK1, but the present disclosure is not limited thereto. According to some example embodiments, the second bank pattern BNK2 may be provided and/or formed at the same layer as the first bank pattern BNK1. In some example embodiments of the present disclosure, the second bank pattern BNK2 may be formed on a different layer from the first bank pattern BNK1 and may be provided and/or formed on the first insulating layer INS1.

The first connection line CNL1 may extend in the first direction DR1 of each of the pixels PXL when viewed from above. The first connection line CNL1 may be provided and/or formed only in each pixel PXL to drive each pixel PXL independently or separately from adjacent pixels PXL and may be electrically and/or physically separated from the first connection line CNL1 provided and/or formed in each of adjacent pixels PXL. The first connection line CNL1 provided in each pixel PXL may be electrically connected to some components included in the pixel circuit layer PCL of the corresponding pixel PXL, for example, the driving transistor Tdr, through the first contact hole CH1 passing through the passivation layer PSV. For example, the first connection line CNL1 may be connected to the drain electrode DE of the driving transistor Tdr through the first contact hole CH1.

The second connection line CNL2 may extend in a direction parallel to an extending direction of the first connection line CNL1 when viewed from above. For example, the second connection line CNL2 may extend in the first direction DR1. The second connection line CNL2 may be commonly provided in each pixel PXL and adjacent pixels PXL. Accordingly, a plurality of pixels PXL disposed in the same pixel row in the first direction DR1 may be commonly connected to the second connection line CNL2. The second connection line CNL2 provided in each pixel PXL may be electrically connected to some components included in the pixel circuit layer PCL of the corresponding pixel PXL, for example, the driving voltage line DVL (PL2), through the second contact hole CH2 passing through the passivation layer PSV.

Each of the first and second electrodes EL1 and EL2 may be provided in the pixel area PXA of each of the pixels PXL and may extend in one direction, for example, the second direction DR2. The first electrode EL1 and the second electrode EL2 may be provided on the same surface, for example, one surface (or the upper surface) of the passivation layer PSV and may be disposed to be spaced from each other in the first direction DR1.

The first electrode EL1 may be branched off from the first connection line CNL1 in the second direction DR2. The first electrode EL1 and the first connection line CNL1 may be provided integrally with each other and electrically and/or physically connected to each other. In this case, the first connection line CNL1 may be one region of the first electrode EL1, or the first electrode EL1 may be one region of the first connection line CNL1. However, the present disclosure is not limited thereto, and according to one or more example embodiments, the first electrode EL1 and the first connection line CNL1 may also be formed separately from each other and electrically connected to each other through a contact hole, a connection means, and the like which are not illustrated.

The second electrode EL2 may be branched off from the second connection line CNL2 in the second direction DR2. The second electrode EL2 and the second connection line CNL2 may be provided integrally with each other and electrically and/or physically connected to each other. In this case, the second connection line CNL2 may be one region of the second electrode EL2, or the second electrode EL2 may be one region of the second connection line CNL2. However, the present disclosure is not limited thereto, and according to some example embodiments, the second electrode EL2 and the second connection line CNL2 may also be formed separately from each other and electrically connected to each other through a contact hole, a connection means, and the like which are not illustrated.

The first electrode EL1 may be electrically connected to some components included in the pixel circuit layer PCL of a corresponding pixel PXL, for example, the driving transistor Tdr, through the first contact hole CH1 and the first connection line CNL1. The second electrode EL2 may be electrically connected to some components included in the pixel circuit layer PCL of the corresponding pixel PXL, for example, the driving voltage line DVL (PL2), through the second contact hole CH2 and the second connection line CNL2.

Each of the first and second electrodes EL1 and EL2 may be provided and/or formed on the first bank pattern BNK1 to have a surface profile corresponding to a shape of the first bank pattern BNK1. For example, each of the first and second electrodes EL1 and EL2 may include a protrusion corresponding to the first bank pattern BNK1 and a flat portion corresponding to one surface (or upper surface) of the protective layer PSV.

Each of the first and second electrodes EL1 and EL2 may be made of a material having constant reflectance in order to allow light emitted from each of the light-emitting elements LD to travel in the image display direction of the display device. Each of the first and second electrodes EL1 and EL2 may be made of a conductive material (or substance) having constant reflectance. The conductive material (or substance) may include an opaque metal that is suitable for reflecting light emitted from the light-emitting elements LD in the image display direction of the display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. According to one or more example embodiments, each of the first and second electrodes EL1 and EL2 may include a transparent conductive material (or substance). The transparent conductive material may include a conductive material such as indium tin oxide (ITO), indium zinc oxide (IZO), zinc oxide (ZnO), indium gallium zinc oxide (IGZO), or indium tin zinc oxide (ITZO), or a conductive polymer such as poly (3,4-ethylenedioxythiophene) (PEDOT). When each of the first and second electrodes EL1 and EL2 includes the transparent conductive material, a separate conductive layer made of an opaque metal may be additionally included to reflect light emitted from the light-emitting elements LD in the image display direction of the display device. However, the material of each of the first and second electrodes EL1 and EL2 is not limited to the above-described materials.

Furthermore, each of the first and second electrodes EL1 and EL2 may be provided and/or formed as a single-film, but the present disclosure is not limited thereto. According to one or more example embodiments, each of the first and second electrodes EL1 and EL2 may be provided and/or formed as a multi-film in which at least two materials of metals, alloys, conductive oxides, and conductive polymers are stacked. In order to minimize or reduce distortion due to signal delay when a signal (or voltage) is transmitted to both ends of each of the light-emitting elements LD, each of the first and second electrodes EL1 and EL2 may be formed as a multi-film including a double or more layered film. For example, each of the first and second electrodes EL1 and EL2 may be formed as a multi-film in which indium tin oxide (ITO), silver (Ag), and ITO are sequentially stacked.

When the first connection line CNL1 is provided integrally with the first electrode EL1, the first connection line CNL1 may include the same material as the first electrode EL1. In some embodiments, when the second connection line CNL2 is provided integrally with the second electrode EL2, the second connection line CNL2 may include the same material as the second electrode EL2.

In one or more example embodiments of the present disclosure, the first electrode EL1 and the second electrode EL2 may receive an alignment signal (or alignment voltage) to serve as alignment electrodes (alignment lines) for aligning the light-emitting elements LD. For example, the first electrode EL1 may receive a first alignment signal (or first alignment voltage) from the first power line PL1 and the first connection line CNL1 to serve as a first alignment electrode (or first alignment line), and the second electrode EL2 may receive a second alignment signal (or second alignment voltage) from the driving voltage line DVL (PL2) and the second connection line CNL2 to serve as a second alignment electrode (or second alignment line). Here, the first and second alignment signals (or alignment voltages) may be signals having a voltage difference and/or a phase difference allowing the light-emitting elements LD to be aligned between the first electrode EL1 and the second electrode EL2. At least one alignment signal (or alignment voltage) of the first and second alignment signals (or alignment voltages) may be an alternating current (AC) signal (or voltage), but the present disclosure is not limited thereto.

After the light-emitting elements LD are aligned in the pixel area PXA of each pixel PXL, in order to individually (or independently) drive each pixel PXL, a portion of the first connection line CNL1, which is positioned between the pixels PXL adjacent to each other in the first direction DR1, may be removed. In some embodiments, after the light-emitting elements LD are aligned in the pixel area PXA, the first electrode EL1 and the second electrode EL2 may serve as driving electrodes for driving the light-emitting elements LD. In one or more example embodiments of the present disclosure, the first electrode EL1 may be an anode, and the second electrode EL2 may be a cathode.

Because, each of the first and second electrodes EL1 and EL2 has the surface profile corresponding to the shape of the first bank pattern BNK1 disposed thereunder, light emitted from each of the light-emitting elements LD may be reflected by each of the first and second electrodes EL1 and EL2 to further travel in the image display direction of the display device. As a result, efficiency of light emitted from each of the light-emitting elements LD can be further improved. Each of the first bank pattern BNK1 and the first and second electrodes EL1 and EL2 may serve as a reflective member which guides light emitted from the light-emitting elements LD in a desired direction to improve light efficiency of the display device.

Each of the light-emitting elements LD may be a micro light-emitting diode using a material with an inorganic crystal structure, for example, a light-emitting diode with a small size ranging from a nanoscale to a microscale. For example, each of the light-emitting elements LD may be a micro light-emitting diode manufactured through an etching method or a micro light-emitting diode manufactured through a growing method.

Two to tens of the light-emitting elements LD may be aligned and/or provided in the pixel area PXA of each pixel PXL, but the number of the light-emitting elements LD is not limited thereto. According to one or more example embodiments, the number of the light-emitting elements LD aligned and/or provided in the pixel area PXA may be variously changed.

Each of the light-emitting elements LD may emit any one of color light and/or white light. The light-emitting elements LD may be aligned on the first insulating layer INS1 between the first electrode EL1 and the second electrode EL2 such that an extending direction (or length L direction) thereof is parallel to the first direction DR1. The light-emitting elements LD may be provided in a form sprayed in a solution and thus may be introduced into the pixel area PXA of each pixel PXL.

The light-emitting elements LD may be introduced into the pixel area PXA of each pixel PXL through various methods such as an inkjet printing method, a slit coating method, or other methods. For example, the light-emitting elements LD may be mixed in a volatile solvent and provided to the pixel area PXA through an inkjet printing method or a slit coating method. In this case, when a corresponding alignment signal is applied to each of the first and second electrodes EL1 and EL2 provided in the pixel area PXA, an electric field is formed between the first electrode EL1 and the second electrode EL2. As a result, the light-emitting elements LD may be aligned between the first electrode EL1 and the second electrode EL2.

After the light-emitting elements LD are aligned, the light-emitting elements LD may be finally aligned and/or provided to the pixel area PXA of each pixel PXL by volatilizing the solvent or removing the solvent through other methods.

The light-emitting elements LD may be provided and/or formed on the first insulating layer INS1. The first insulating layer INS1 may include an inorganic insulating film made of an inorganic material or an organic insulating film made of an organic material. In one or more example embodiments of the present disclosure, the first insulating layer INS1 may be formed as an inorganic insulating film that is suitable for protecting the light-emitting elements LD from the pixel circuit layer PCL of each pixel PXL. For example, the first insulating layer INS1 may include at least one selected from metal oxides such as silicon nitride ($SiN_x$), silicon oxide ($SiO_x$), silicon oxynitride ($SiO_xN_y$), and aluminum oxide ($AlO_x$), but the present disclosure is not limited thereto. According to some example embodiments, the first insulating layer INS1 may be formed as an organic insulating film that is suitable for planarizing support surfaces of the light-emitting elements LD.

In some embodiments, the first insulating layer INS1 may be provided on the first connection line CNL1, the first electrode EL1, the second electrode EL2, and the second connection line CNL2. The first insulating layer INS1 may also be provided below the light-emitting element LD between the first electrode EL1 and the second electrode EL2 to provide electrical isolation between the first electrode EL1 and the second electrode EL2.

The first insulating layer INS1 may include a first opening OPN1 exposing one region of the first electrode EL1 and a second opening OPN2 exposing one region of the second electrode EL2. The first electrode EL1 may be in direct contact with and connected to a first contact electrode CNE1 by the first opening OPN1, and the second electrode EL2 may be in direct contact with and connected to a second contact electrode CNE2 by the second opening OPN2. The first insulating layer INS1 may cover the remaining regions excluding one region of the first electrode EL1 and one region of the second electrode EL2.

In FIG. 7, while a length of each of the first and second openings OPN1 and OPN2 of the first insulating layer INS1 in the second direction DR2 is illustrated as being greater than a length of the first bank pattern BNK1 in the second direction DR2, the present disclosure is not limited thereto. According to one or more example embodiments, the length of each of the first and second openings OPN1 and OPN2 of the first insulating layer INS1 in the second direction DR2 may be designed to be smaller than the length of the first bank pattern BNK1 in the second direction DR2. According to one or more example embodiments, the length of each of the first and second openings OPN1 and OPN2 of the first insulating layer INS1 in the second direction DR2 may be variously changed within a range capable of electrically and stably connecting a corresponding contact electrode to each of the first and second electrodes EL1 and EL2.

A second insulating layer INS2 may be provided and/or formed on each of the light-emitting elements LD. The second insulating layer INS2 may be provided and/or formed on the light-emitting elements LD to partially cover an outer surface (or an outer peripheral or circumferential surface) of each of the light-emitting elements LD and expose both ends of each of the light-emitting elements LD to the outside. The second insulating layer INS2 may be formed as an independent insulating pattern in the pixel area PXA of each pixel PXL, but the present disclosure is not limited thereto.

The second insulating layer INS2 may be formed as a single-film or a multi-film and may include an inorganic insulating film including at least one inorganic material or an organic insulating film including at least one organic material. The second insulating layer INS2 may further fix each of the light-emitting elements LD. The second insulating layer INS2 may include an inorganic insulating film that is suitable for protecting an active layer 12 of each of the light-emitting elements LD from external oxygen, moisture, or the like. However, the present disclosure is not limited thereto. The second insulating layer INS2 may be formed as an organic insulating film including an organic material according to design conditions of a display device to which the light-emitting elements LD are applied.

In one or more example embodiments of the present disclosure, after the alignment of the light-emitting elements LD is completed in the pixel area PXA of each of the pixels PXL, the second insulating layer INS2 may be formed on the light-emitting elements LD to prevent the light-emitting elements LD from deviating from positions at which the light-emitting elements LD are aligned. When an empty gap (or space) is present between the first insulating layer INS1 and the light-emitting elements LD before the second insulating layer INS2 is formed, the empty gap may be filled with the second insulating layer INS2 in a process of forming the second insulating layer INS2. Accordingly, the second insulating layer INS2 may be formed as an organic insulating film that is suitable for filling the empty gap between the first insulating layer INS1 and the light-emitting elements LD.

Because the second insulating layer INS2 is formed on the light-emitting elements LD, the active layer 12 of each of the light-emitting elements LD may not be in contact with an external conductive material. The second insulating layer INS2 may cover only a portion of the outer surface (or an outer peripheral or circumferential surface) of each of the light-emitting elements LD to expose both ends of each of the light-emitting elements LD to the outside.

The first contact electrode CNE1 may electrically and stably connect the first electrode EL1 and one end of each of the light-emitting elements LD, and the second contact electrode CNE2 may electrically and stably connect the second electrode EL2 and the other end of each of the light-emitting elements LD.

The first contact electrode CNE1 may be provided and/or formed on the first electrode EL1. The first contact electrode CNE1 may be in direct contact with the first electrode EL1 exposed by the first opening OPN1 of the first insulating layer INS1 to be connected to the first electrode EL1. According to one or more example embodiments, when a capping layer (not illustrated) is disposed on the first electrode EL1, the first contact electrode CNE1 may be disposed on the capping layer to be connected to the first electrode EL1 through the capping layer. Here, the capping layer may protect the first electrode EL1 from defects or the like generated during a manufacturing process of the display device and may further reinforce adhesion between the first electrode EL1 and the pixel circuit layer PCL positioned thereunder. The capping layer may include a transparent conductive material such as indium zinc oxide (IZO) to reduce or minimize loss of light that is emitted from each of the light-emitting elements LD and is reflected in the image display direction of the display device by the first electrode EL1.

In some embodiments, the first contact electrode CNE1 may be provided and/or formed on one end of each of the light-emitting elements LD to be connected to one end of each of the light-emitting elements LD. Accordingly, the first electrode EL1 and one end of each of the light-emitting elements LD may be electrically connected to each other through the first contact electrode CNE1.

The second contact electrode CNE2 may be provided and/or formed on the second electrode EL2. The second contact electrode CNE2 may be in direct contact with the second electrode EL2 exposed by the second opening OPN2 of the first insulating layer INS1 to be connected to the second electrode EL2. According to one or more example embodiments, when a capping layer is disposed on the second electrode EL2, the second contact electrode CNE2 may be disposed on the capping layer to be connected to the second electrode EL2 through the capping layer. Furthermore, the second contact electrode CNE2 may be provided and/or formed on the other end of each of the light-emitting elements LD to be connected to the other end of each of the light-emitting elements LD. Accordingly, the second electrode EL2 and the other end of each of the light-emitting elements LD may be connected to each other through the second contact electrode CNE2.

The first and second contact electrodes CNE1 and CNE2 may be made of at least one selected from various transparent conductive materials to allow light, which is emitted from each of the light-emitting elements LD and is reflected by the first and second electrodes EL1 and EL2, to travel in the image display direction of the display device without loss. For example, the first and second contact electrodes CNE1 and CNE2 may include at least one selected from various transparent conductive materials such as indium tin oxide (ITO), indium zinc oxide (IZO), zinc oxide (ZnO), indium gallium zinc oxide (IGZO), and indium tin zinc oxide (ITZO) and may be substantially transparent or semi-transparent to satisfy desired transmittance (or transmittancy). However, the material of the first and second contact electrodes CNE1 and CNE2 is not limited to the above-described example embodiments. According to one or more example embodiments, the first and second contact electrodes CNE1 and CNE2 may be made of at least one selected from various opaque conductive materials. However, the material of the first and second contact electrodes CNE1 and CNE2 is not limited to the above-described embodiments. According to one or more example embodiments, the first and second contact electrodes CNE1 and CNE2 may be made of at least one selected from various opaque conductive materials. The first and second contact electrodes CNE1 and CNE2 may be formed as a single-film or a multi-film.

When viewed from above, each of the first and second contact electrodes CNE1 and CNE2 may have a bar shape extending in the second direction DR2, but the present disclosure is not limited thereto. According to one or more example embodiments, the shapes of the first and second contact electrodes CNE1 and CNE2 may be variously changed within a range in which the first and second contact electrodes CNE1 and CNE2 are electrically and stably connected to each of the light-emitting elements LD. In some embodiments, the shapes of the first and second contact electrodes CNE1 and CNE2 may be variously changed in consideration of a connection relationship with electrodes disposed thereunder.

The first contact electrode CNE1 and the second contact electrode CNE2 may be disposed to be spaced from each other in the first direction DR1. For example, the first contact electrode CNE1 and the second contact electrode CNE2 may be disposed to be spaced from each other by a certain interval on the second insulating layer INS2. The first contact electrode CNE1 and the second contact electrode CNE2 may be provided at the same layer and may be formed through the same process. However, the present disclosure is not limited thereto, and according to one or more example embodiments, the first and second contact electrodes CNE1 and CNE2 may be provided on different layers and may be formed through different processes. In this case, as illustrated in FIG. 13, an auxiliary insulating layer AUINS may be provided and/or formed between the first contact electrode CNE1 and the second contact electrode CNE2. The auxiliary insulating layer AUINS may include the same material as the first insulating layer INS1 or may include at least one material selected from the materials described as structure materials of the first insulating layer INS1. For example, the auxiliary insulating layer AUINS may be an inorganic insulating film including an inorganic material. The inorganic insulating film may include at least one selected from metal oxides such as silicon nitride ($SiN_x$), silicon oxide ($SiO_x$), silicon oxynitride ($SiO_xN_y$), and aluminum oxide ($AlO_x$).

A third insulating layer INS3 may be provided and/or formed on the first and second contact electrodes CNE1 and CNE2. The third insulating layer INS3 may be an inorganic insulating film including an inorganic material or an organic insulating film including an organic material. For example, the third insulating layer INS3 may have a structure in which at least one inorganic insulating film or at least one organic insulating film is alternately stacked. The third insulating layer INS3 may entirely cover the display element layer DPL to prevent external moisture or moisture from being introduced into the display element layer DPL including the light-emitting elements LD.

In one or more example embodiments of the present disclosure, each of the first and second electrodes EL1 and EL2 may be divided into a first region A and a second region B in the second direction DR2. The first region A of each of the first and second electrodes EL1 and EL2 may be an alignment portion in which the light-emitting elements LD are aligned, and the second region B of each of the first and second electrodes EL1 and EL2 may be a region excluding the first region A of a corresponding electrode. For example, the second region B of each of the first and second electrodes EL1 and EL2 may be an end portion of a corresponding electrode, at which the light-emitting elements LD are not aligned. In some embodiments, the first region A of each of the first and second electrodes EL1 and EL2 may be a region that overlaps (or corresponds to) the light-emitting elements LD, and the second region B of a corresponding electrode may be a region that does not overlap (or does not correspond to) the light-emitting elements LD.

When each of the first and second electrodes EL1 and EL2 has the bar shape extending in the second direction DR2, the second region B of a corresponding electrode may be positioned on each of one side surface and the other side surface of the first region A of each of the first and second electrodes EL1 and EL2. For example, each of the first and second electrodes EL1 and EL2 may be divided into the second region B, the first region A, and a second region B (B') in the second direction DR2. Hereinafter, for convenience, the second region B connected to one side surface of the first region A of each of the first and second electrodes EL1 and EL2 (or positioned at an upper side of the first region A of each of the first and second electrodes EL1 and EL2 when viewed from above) is referred to as a second-first region B, and the second region B (B1') connected to the other side surface of the first region A of each of the first and second electrodes EL1 and EL2 (or positioned at a lower side of the first region A of each of the first and second electrodes EL1 and EL2 when viewed from above) is referred to as a second-second region B'. In the following example embodiments, the second-first region B and the second-second region B' are collectively referred to as the second region B.

In one or more example embodiments of the present disclosure, the first region A of the first electrode EL1 and the first region A of the second electrode EL2 may correspond to each other, the second-first region B of the first electrode EL1 and the second-first region B of the second electrode EL2 may correspond to each other, and the second-second region B' of the first electrode EL1 and the second-second region B' of the second electrode EL2) may correspond to each other.

The first region A of each of the first and second electrodes EL1 and EL2 may have a constant width W1 in the first direction DR1 along an extending direction of a corresponding electrode. For example, the first region A of the first electrode EL1 may have the constant width W1 in the first direction DR1 along an extending direction of the first electrode EL1, for example, in the second direction DR2. The first region A of the second electrode EL2 may have the constant width W1 in the first direction DR1 along an extending direction of the second electrode EL2, for example, in the second direction DR2. The width W1 of the first region A of the first electrode EL1 in the first direction DR1 may be the same as the width W1 of the first region A of the second electrode EL2 in the first direction DR1, but the present disclosure is not limited thereto. According to one or more example embodiments, the width W1 of the first region A of the first electrode EL1 in the first direction DR1 may be different from the width W1 of the first region A of the second electrode EL2 in the first direction DR1, but the present disclosure is not limited thereto.

The second-first region B and the second-second region B' of each of the first and second electrodes EL1 and EL2 may have a non-constant width W2 in the first direction DR1 along an extending direction of a corresponding electrode. For example, the second-first region B and the second-second region B' of each of the first and second electrodes EL1 and EL2 may have at least two widths W2 in the first direction DR1 along an extending direction of a corresponding electrode. For example, the second-first region B and the second-second region B' of the first electrodes EL1 may have at least two widths W2 in the first direction DR1 along the extending direction of the first electrode EL1. The second-first region B and the second-second region B' of the second electrodes EL2 may have at least two widths W2 in the first direction DR1 along the extending direction of the second electrode EL2.

In each of the first and second electrodes EL1 and EL2, the second-first region B and the second-second region B' may have the same size and shape, but the present disclosure is limited thereto. According to one or more example embodiments, in each of the first and second electrodes EL1 and EL2, the second-first region B and the second-second region B' may have different size and shape. In some example embodiments, the second-first region B and the second-second region B' of the first electrode EL1 and the second-first region B and the second-second region B' of the second electrode EL2 may have the same size and shape, but the present disclosure is limited thereto. According to some example embodiments, the second-first region B and the second-second region B' of the first electrode EL1 and the second-first region B and the second-second region B' of the second electrode EL2 may have different sizes and shapes.

When viewed from above, the second-first region B of each of the first and second electrodes EL1 and EL2 may have the width W2 in the first direction DR1 that is smaller than that of the first region A of a corresponding electrode. For example, the width W2 of the second-first region B in the first direction DR1 may be decreased as a distance from a first boundary BD1 between the first region A and the second-first region B of a corresponding electrode is increased. In one or more example embodiments of the present disclosure, the first boundary BD1 between the first region A and the second-first region B of the first electrode EL1 may match a first edge ED1 of the first opening OPN1 of the first insulating layer INS1 (e.g., upper end of the first opening OPN1 when viewed from above). The first boundary BD1 between the first region A and the second-first region B of the second electrode EL2 may match a first edge ED1 of the second opening OPN2 of the first insulating layer INS1 (e.g., upper end of the second opening OPN2 when viewed from above). However, the present disclosure is not limited thereto. According to some example embodiments, the first boundary BD1 of the first electrode EL1 may not match the first edge ED1 of the first opening OPN1, and the first boundary BD1 of the second electrode EL2 may not match the first edge ED1 of the second opening OPN2.

As shown in FIGS. 14A-14B, when viewed from above, the second-first region B of the first electrode EL1 may have at least one first side surface FS1 that extends from the first boundary BD1 in a diagonal direction inclined to the first direction DR1. As illustrated in FIG. 14A, the first side surface FS1 may meet the first boundary BD1 to form a first inclination angle θ1. The first side surface FS1 may extend in a diagonal direction from a first vertex E at which the first side surface FS1 and the first boundary BD1, which form the first inclination angle θ1, meet. In one or more example embodiments of the present disclosure, the first inclination angle θ1 may be an acute angle. In other words, the second-first region B of the first electrode EL1 may be partially chamfered. For this reason, the width W2 of the second-first region B of the first electrode EL1 in the first direction DR1 may be decreased as a distance from the first boundary BD1 of the first electrode EL1 is increased. For example, the width W2 of the second-first region B of the first electrode EL1 in the first direction DR1 may be increased as the distance from the first boundary BD1 of the first electrode EL1 is decreased.

When the second-first region B of the first electrode EL1 is partially chamfered, at least one corner CON of the first contact electrode CNE1 (e.g., as shown in FIG. 7) may be positioned outside a chamfered portion of the second-first region B of the first electrode EL1 when viewed from above.

When viewed from above, the second-first region B of the second electrode EL2 may have at least one second side surface FS2 that extends from the first boundary BD1 in a diagonal direction inclined to the first direction DR1. As illustrated in FIG. 14B, the second side surface FS2 may meet the first boundary BD1 to form a second inclination angle θ2. The second side surface FS2 may extend in a diagonal direction from a second vertex F at which the second side surface FS2 and the first boundary BD1, which form the second inclination angle θ2, meet. In one or more example embodiments of the present disclosure, the second inclination angle θ2 may be an acute angle. In other words, the second-first region B of the second electrode EL2 may be partially chamfered. For this reason, the width W2 of the second-first region B of the second electrode EL2 in the first direction DR1 may be decreased as a distance from the first boundary BD1 of the second electrode EL2 is increased. For example, the width W2 of the second-first region B of the second electrode EL2 in the first direction DR1 may be increased as the distance from the first boundary BD1 of the second electrode EL2 is decreased.

When the second-first region B of the second electrode EL2 is partially chamfered, at least one corner CON of the second contact electrode CNE2 may be positioned outside a chamfered portion of the second-first region B of the second electrode EL2 when viewed from above.

When viewed from above, the second-second region B' of each of the first and second electrodes EL1 and EL2 may have the width W2 in the first direction DR1 that is smaller than that of the first region A of a corresponding electrode. For example, the width W2 of the second-second region B' in the first direction DR1 may be decreased as a distance from a second boundary BD2 between the first region A and the second-second region B' of a corresponding electrode is increased. In one or more example embodiments of the present disclosure, the second boundary BD2 between the first region A and the second-second region B' of the first electrode EL1 may match a second edge ED2 of the first opening OPN1 of the first insulating layer INS1 (lower end of the first opening OPN1 when viewed from above). The second boundary BD2 between the first region A and the second-second region B' of the second electrode EL2 may match a second edge ED2 of the second opening OPN2 of the first insulating layer INS1 (lower end of the second opening OPN2 when viewed from above). However, the present disclosure is not limited thereto. According to one or more example embodiments, the second boundary BD2 of the first electrode EL1 may not match the second edge ED2 of the first opening OPN1, and the second boundary BD2 of the second electrode EL2 may not match the second edge ED2 of the second opening OPN2.

When viewed from above, the second-second region B' of each of the first and second electrodes EL1 and EL2 may have at least one side surface that extends from the second boundary BD2 in a diagonal direction inclined to the first direction DR1. The at least one side surface may meet the second boundary BD2 to form an inclination angle. In this case, the inclination angle may be an acute angle. In other words, the second-second region B' of each of the first and second electrodes EL1 and EL2 may be partially chamfered. For this reason, the width W2 of the second-second region B' of each of the first and second electrodes EL1 and EL2 in the first direction DR1 may be decreased as a distance from the second boundary BD2 of a corresponding electrode is increased. For example, the width W2 of the second-second region B' of each of the first and second electrodes EL1 and EL2 in the first direction DR1 may be increased as the distance from the second boundary BD2 of the corresponding electrode is decreased.

When viewed from above, the width W1 of the first region A of the first electrode EL1 in the first direction DR1 may be greater than the width W2 of each of the second-first and second-second regions B and B' of the first electrode EL1 in the first direction DR1. When viewed from above, the width W2 of each of the second-first and second-second regions B and B' of the first electrode EL1 in the first direction DR1 may be smaller than the width W1 of the first region A of the first electrode EL1 in the first direction DR1. In some embodiments, when viewed from above, the width W1 of the first region A of the second electrode EL2 in the first direction DR1 may be greater than the width W2 of each of the second-first and second-second regions B and B' of the second electrode EL2 in the first direction DR1. For example, when viewed from above, the width W2 of each of the second-first and second-second regions B and B' of the second electrode EL2 in the first direction DR1 may be smaller than the width W1 of the first region A of the second electrode EL2 in the first direction DR1. In the case described above, a separation distance d1 (hereinafter, referred to as a "first separation distance" or a "gap") between the first region A of the first electrode EL1 and the first region A of the second electrode EL2 in the first direction DR1 may be smaller than a separation distance d2 (e.g., a "gap") between the second-first region B of the first electrode EL1 and the second-first region B of the second electrode EL2 in the first direction DR1. In some embodiments, the first separation distance d1 may be smaller than a separation distance d2 between the second-second region B' of the first electrode EL1 and the second-second region B' of the second electrode EL2 in the first direction DR1.

As described above, because the second-first and second-second regions B and B' of each of the first and second electrodes EL1 and EL2 are chamfered, the separation distance d2 between the second-first region B of the first electrode EL1 and the second-first region B of the second electrode EL2 in the first direction DR1 and the separation distance d2 between the second-second region B' of the first electrode EL1 and the second-second region B' of the second electrode EL2 in the first direction DR1 may be secured at a certain level or more. In this case, it is possible to reduce or minimize short circuit defects occurring between end portions of the first electrode EL1 (for example, the second-first and second-second regions B and B' of the first electrode EL1) and end portions of the second electrode EL2 (for example, the second-first and second-second regions B and B' of the second electrode EL2).

In one or more example embodiments, the first and second electrodes EL1 and EL2 may be formed through a photolithography process using a mask. In the above-described process, a photoresist made of an organic material may be applied on conductive layers constituting the first and second electrodes EL1 and EL2, and processes such as an exposure process, a heat treatment process, and a development process may be performed using the mask to form the first and second electrodes EL1 and EL2. Due to a difference in amount, i.e., a difference in concentration of the photoresist dissolved during the above-described process or a spatial constraint between components included in each pixel PXL, for example, a reduction in critical dimension (CD) (e.g., line width of each electrode or gap width between adjacent electrodes), an overflow phenomenon, in which the photoresist overflows in a specific region, may occur.

The second-first and second-second regions B and B' of each of the first and second electrodes EL1 and EL2 may not overlap a structure such as the first bank pattern BNK1 and may be provided on one surface (or upper surface) of the passivation layer PSV and thus may have a flat surface. In this case, when the photoresist is applied on the conductive layers constituting the first and second electrodes EL1 and EL2, a relatively large amount of the photoresist may be concentrated in the second-first and second-second regions B and B' of each of the first and second electrodes EL1 and EL2, which have a relatively flat surface, and thus, an overflow phenomenon of the photoresist may occur in the second-first and second-second regions B and B' of each of the first and second electrodes EL1 and EL2. In this case, when the exposure and development processes are performed, short circuit defects, in which the second-first region B of the first electrode EL1 and the second-first region B of the second electrode EL2 are connected and the second-second region B' of the first electrode EL1 and the second-second region B' of the second electrode EL2 are connected, may occur. Short circuit defects between the first electrode EL1 and the second electrode EL2 may cause dark point (or dark spot) defects of each pixel PXL, thereby lowering reliability of the display device.

Thus, in one or more example embodiments of the present disclosure, the second region B of each of the first and second electrodes EL1 and EL2 may be partially chamfered to secure the separation distance d2 between the second region B of the first electrode EL1 and the second region B of the second electrode EL2 in the first direction DR1 at a certain level or more, thereby preventing the above-described short circuit defects.

According to the above-described example embodiments, because the first separation distance d1 is designed to be relatively short, when an alignment signal corresponding to each of the first and second electrodes EL1 and EL2 is applied, a strong electric field may be formed between the first region A of the first electrode EL1 and the first region A of the second electrode EL2. In this case, the light-emitting elements LD are intensively aligned between the first region A of the first electrode EL1 and the first region A of the second electrode EL2, thereby reducing the number of unaligned light-emitting elements LD. As a result, loss of the light-emitting elements LD may be reduced or minimized, and the number of the effective light-emitting elements LD provided per unit area of each pixel PXL may be increased. In one or more example embodiments, because the light-emitting elements LD may be intensively aligned only in a targeted area (or desired area) of the pixel area PXA of each of the pixels PXL (e.g., the first region A of the first and second electrodes EL1 and EL2), thereby preventing an abnormal misalignment in which the light-emitting element LD are in an undesired area.

FIGS. 15A-15G are schematic plan views of the first and second electrodes illustrated in FIG. 7 implemented according to one or more example embodiments.

In relation to the first and second electrodes of FIGS. 15A-15G, differences from the above-described example embodiments will be mainly described in order to avoid redundant descriptions. Parts not particularly described in the present disclosure are the same as those described in the above-described embodiment, the same reference numerals denote the same components, and similar reference numerals denote similar components Referring to 1-6A, 7, and 15A-15G, a first electrode EL1 and a second electrode EL2 spaced in a first direction DR1 may be provided in a pixel area PXA of each pixel PXL.

Each of the first and second electrodes EL1 and EL2 may be divided into a second-first region B, a first region A, and a second-second region B' in a second direction DR2. The first region A of each of the first and second electrodes EL1 and EL2 may be an alignment portion in which light-emitting elements LD are aligned, and the second-first region B and the second-second region B' of each of the first and second electrodes EL1 and EL2 may be regions excluding the first region A of a corresponding electrode and may be end portions of the corresponding electrode. For example, the second-first region B and the second-second region B' of each of the first and second electrodes EL1 and EL2 may be regions in which the light-emitting elements LD are not aligned.

Figure 15A:
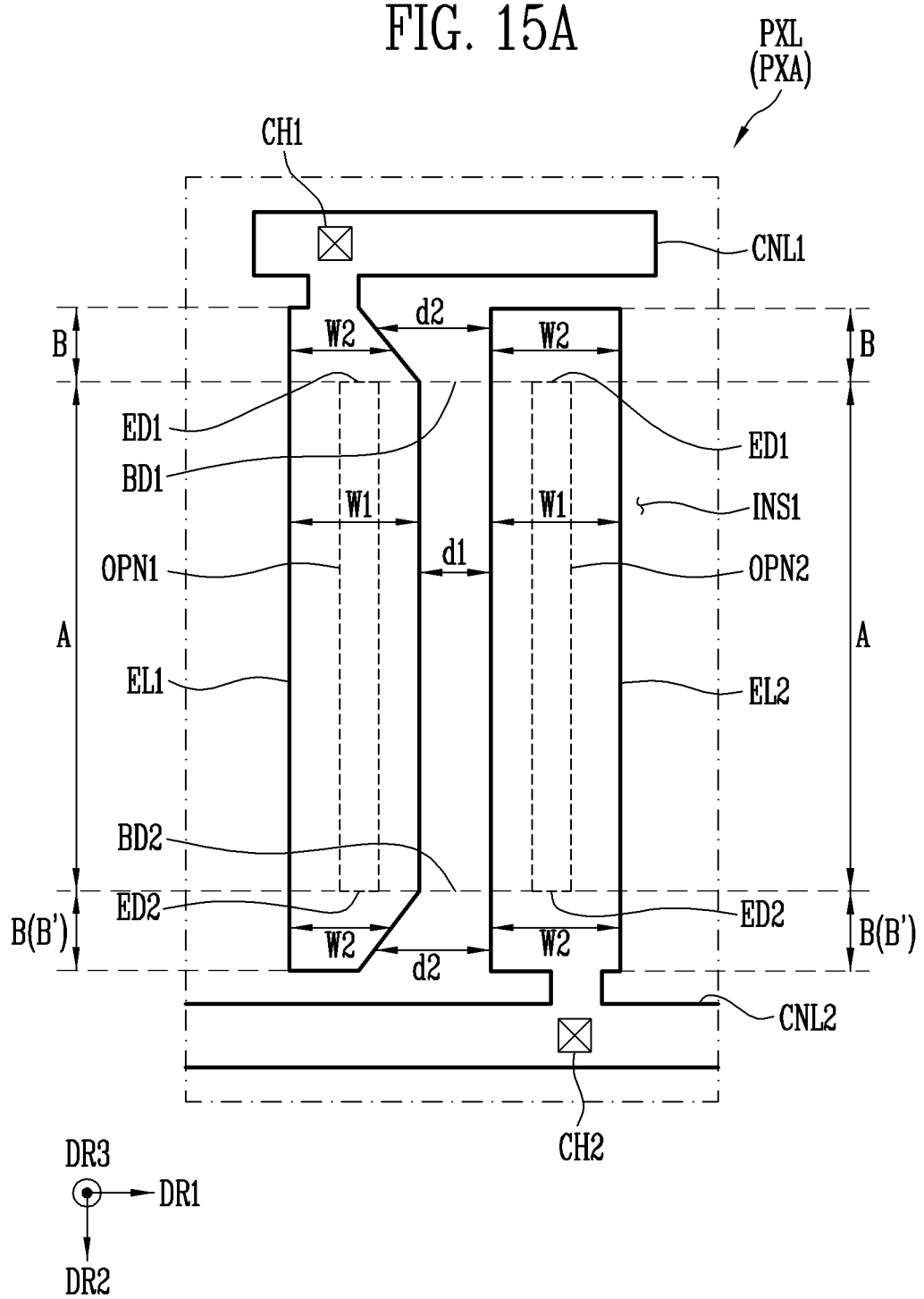

First, referring to FIG. 15A, the first region A of each of the first and second electrodes EL1 and EL2 may have a constant width W1 in the first direction DR1 along a second direction DR2.

The second-first region B and the second-second region B' of the first electrode EL1 may each be partially chamfered and thus may have at least two widths W2 in the first direction DR1 along the second direction DR2. For this reason, the width W2 of the second-first region B of the first electrode EL1 in the first direction DR1 may be decreased as a distance from a first boundary BD1 between the first region A and the second-first region B of the first electrode EL1 is increased. In some embodiments, the width W2 of the second-second region B' of the first electrode EL1 in the first direction DR1 may be decreased as a distance from a second boundary BD2 between the first region A and the second-second region B' of the first electrode EL1 is increased.

In this case, the width W2 of each of the second-first and second-second regions B and B' of the first electrode EL1 in the first direction DR1 may be smaller than the width W1 of the first region A of the first electrode EL1 in the first direction DR1. Each of the second-first and second-second regions B and B' of the first electrode EL1 may have at least one side surface that extends in a diagonal direction inclined to the first direction DR1. The second-first region B of the first electrode EL1 and the second-second region B' of the first electrode EL1 may have the same size and shape, but the present disclosure is limited thereto. According to one or more example embodiments, the second-first region B of the first electrode EL1 and the second-second region B' of the first electrode EL1 may have different sizes and shapes.

Each of the second-first region B and the second-second region B' of the second electrode EL2 may have a constant width W2 in the first direction DR1. In this case, the width W2 of each of the second-first and second-second regions B and B' of the second electrode EL2 in the first direction DR1 may be the same as the width W1 of the first region A of the second electrode EL2 in the first direction DR1.

As described above, because the second-first and second-second regions B and B' of the first electrode EL1 are partially chamfered, a separation distance d2 between the second-first region B of the first electrode EL1 and the second-first region B of the second electrode EL2 in the first direction DR1 may be further secured, and a separation distance d2 between the second-second region B' of the first electrode EL1 and the second-second region B' of the second electrode EL2 in the first direction DR1 may also be further secured. Accordingly, it is possible to reduce or minimize short circuit defects between the first electrode EL1 and the second electrode EL2 caused by a spatial constraint.

Figure 15B:
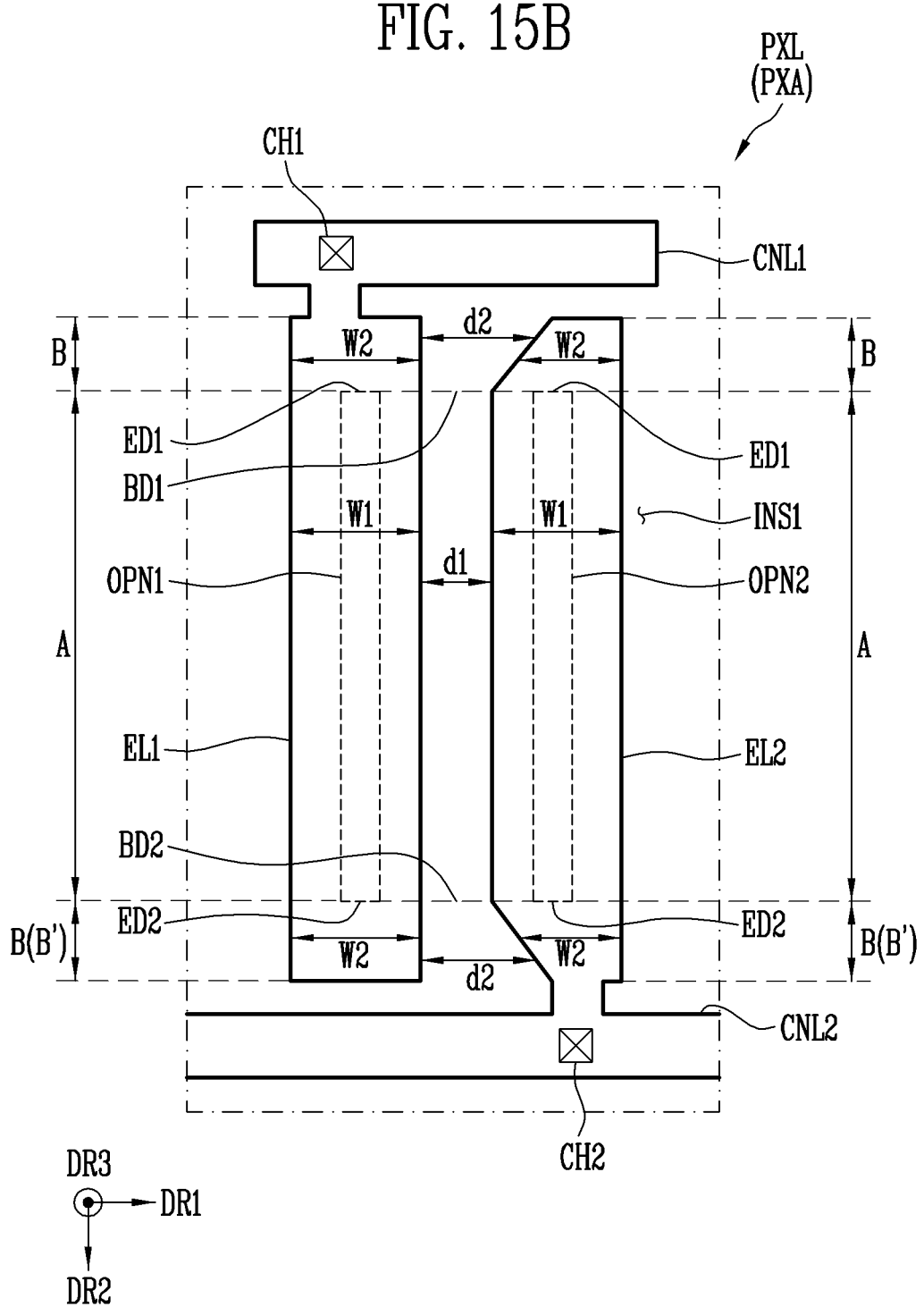

Referring to FIG. 15B, the second-first region B and the second-second region B' of the second electrode EL2 may each be partially chamfered and thus may have at least two widths W2 in the first direction DR1 along the second direction DR2. For example, the width W2 of the second-first region B of the second electrode EL2 in the first direction DR1 may be decreased as a distance from a first boundary BD1 between the first region A and the second-first region B of the second electrode EL2 is increased. In some embodiments, the width W2 of the second-second region B' of the second electrode EL2 in the first direction DR1 may be decreased as a distance from a second boundary BD2 between the first region A and the second-second region B' of the second electrode EL2 is increased.

In this case, the width W2 of each of the second-first and second-second regions B and B' of the second electrode EL2 in the first direction DR1 may be smaller than a width W1 of the first region A of the second electrode EL2 in the first direction DR1. Each of the second-first and second-second regions B and B' of the second electrode EL2 may have at least one side surface that extends in a diagonal direction inclined to the first direction DR1.

Each of the second-first and second-second regions B and B' of the first electrode EL1 may have a constant width W2 in the first direction DR1 along the second direction DR2. In this case, the width W2 of each of the second-first and second-second regions B and B' of the first electrode EL1 in the first direction DR1 may be the same as a width W1 of the first region A of the first electrode EL1 in the first direction DR1.

As described above, because the second-first and second-second regions B and B' of the second electrode EL2 are partially chamfered, a separation distance d2 between the second-first region B of the first electrode EL1 and the second-first region B of the second electrode EL2 in the first direction DR1 may be further secured, and a separation distance d2 between the second-second region B' of the first electrode EL1 and the second-second region B' of the second electrode EL2 in the first direction DR1 may be further secured.

Figure 15C:
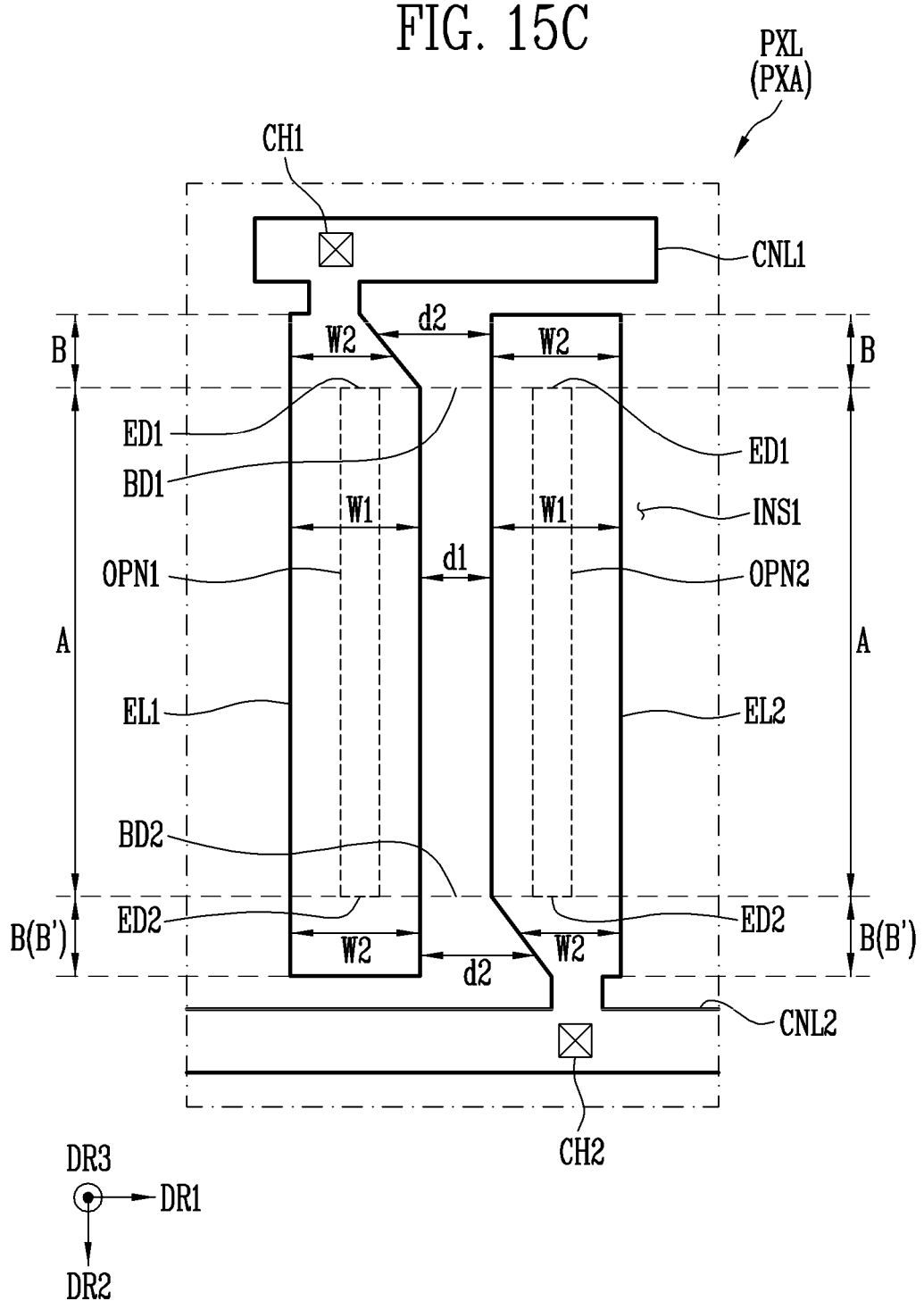

Referring to FIG. 15C, the second-first region B of the first electrode EL1 and the second-second region B' of the second electrode EL2 may be partially chamfered and thus may have at least two widths W2 in the first direction DR1 along the second direction DR2. Thus, the width W2 of the second-first region B of the first electrode EL1 in the first direction DR1 may be decreased as a distance from a first boundary BD1 is increased, and the width W2 of the second-second region B' of the second electrode EL2 in the first direction may be decreased as a distance from a second boundary BD2 is increased. In this case, the width W2 of the second-first region B of the first electrode EL1 in the first direction DR1 may be smaller than a width W1 of the first region A of the first electrode EL1 in the first direction DR1. Also, the width W2 of the second-second region B' of the second electrode EL2 in the first direction DR1 may be smaller than a width W1 of the first region A of the second electrode EL2 in the first direction DR1.

As described above, because the second-first region B of the first electrode and the second-second region B' of the second electrode EL2 are partially chamfered, a separation distance d2 between the second-first region B of the first electrode EU and the second-first region B of the second electrode EL2 in the first direction DR1 may be further secured, and a separation distance d2 between the second-second region B' of the first electrode EL1 and the second-second region B' of the second electrode EL2 in the first direction DR1 may be further secured.

In the above-described example embodiment, it has been described that the second-first region B of the first electrode EL1 and the second-second region B' of the second electrode EL2 are partially chamfered and the second-second region B' of the first electrode EL1 and the second-first region B of the second electrode EL2 have a constant width W2 in the first direction DR1 which may be the same as the constant width W1, but the present disclosure is not limited thereto, and vice versa. For example, the second-second region B' of the first electrode EL1 and the second-first region B of the second electrode EL2 may partially chamfered, and the second-first region B of the first electrode EL1 and the second-second region B' of the second electrode EL2 may have a constant width W2 in the first direction DR1.

Figure 15D:
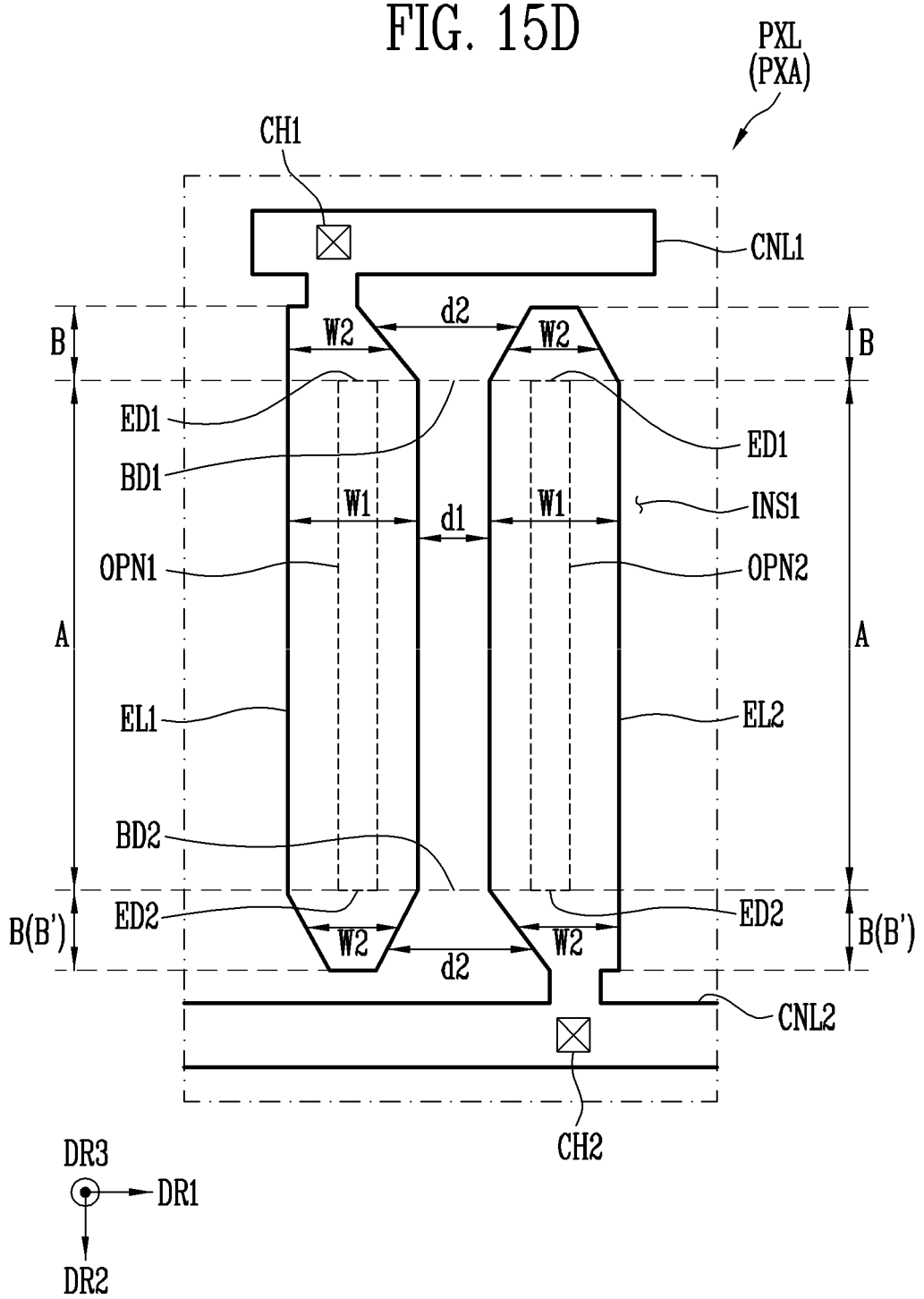

Referring to FIG. 15D, each of the second-first region B of the first electrode EL1 and the second-second region B' of the second electrode EL2 may be partially chamfered and thus may have at least one side surface in a direction inclined to the first direction DR1. In some embodiments, each of the second-second region B' of the first electrode EL1 and the second-first region B of the second electrode EL2 may be partially chamfered and thus may have two side surfaces that extend in a diagonal direction inclined to the first direction DR1. The second-first region B of the first electrode EL1 and the second-first region B of the second electrode EL2 may have different shapes and sizes, and the second-second region B' of the first electrode EL1 and the second-second region B' of the second electrode EL2 may have different shapes and sizes.

A width W2 of the second-first region B of each of the first and second electrodes EL1 and EL2 in the first direction DR1 may be decreased as a distance from a first boundary BD1 is increased. In some embodiments, a width W2 of the second-second region B' of each of the first and second electrodes EL1 and EL2 in the first direction DR1 may be decreased as a distance from a second boundary BD2 is increased.

As described above, because the second-first and second-second regions B and B' of each of the first and second electrodes EL1 and EL2 are partially chamfered, a separation distance d2 between the second-first region B of the first electrode EU and the second-first region B of the second electrode EL2 in the first direction DR1 may be further secured, and a separation distance d2 between the second-second region B' of the first electrode EL1 and the second-second region B' of the second electrode EL2 in the first direction DR1 may be further secured.

In the above-described example embodiments, it has been described that each of the partially chamfered second-first and second-second regions B and B' of the first and second electrodes EL1 and EL2 has at least one side surface formed of a straight line that extends in a diagonal direction inclined to the first direction DR1, but the present disclosure is not limited thereto. According to one or more example embodiments, as illustrated in FIG. 15E, the second-first and second-second regions B and B' of each of the first and second electrodes EL1 and EL2 may include a non-square boundary. For example, the second-first and second-second regions B and B' of each of the first and second electrodes EL1 and EL2 may include at least one side surface formed of a curve having a certain curvature. In this case, the shapes of the second-first and second-second regions B and B' of each of the first and second electrodes EL1 and EL2 may be variously changed within a range in which a width W2 of the second-first and second-second regions B and B' of a corresponding electrode in the first direction DR1 may be smaller than a width W1 of the first region A of the corresponding electrode in the first direction DR1.

Figure 15F:
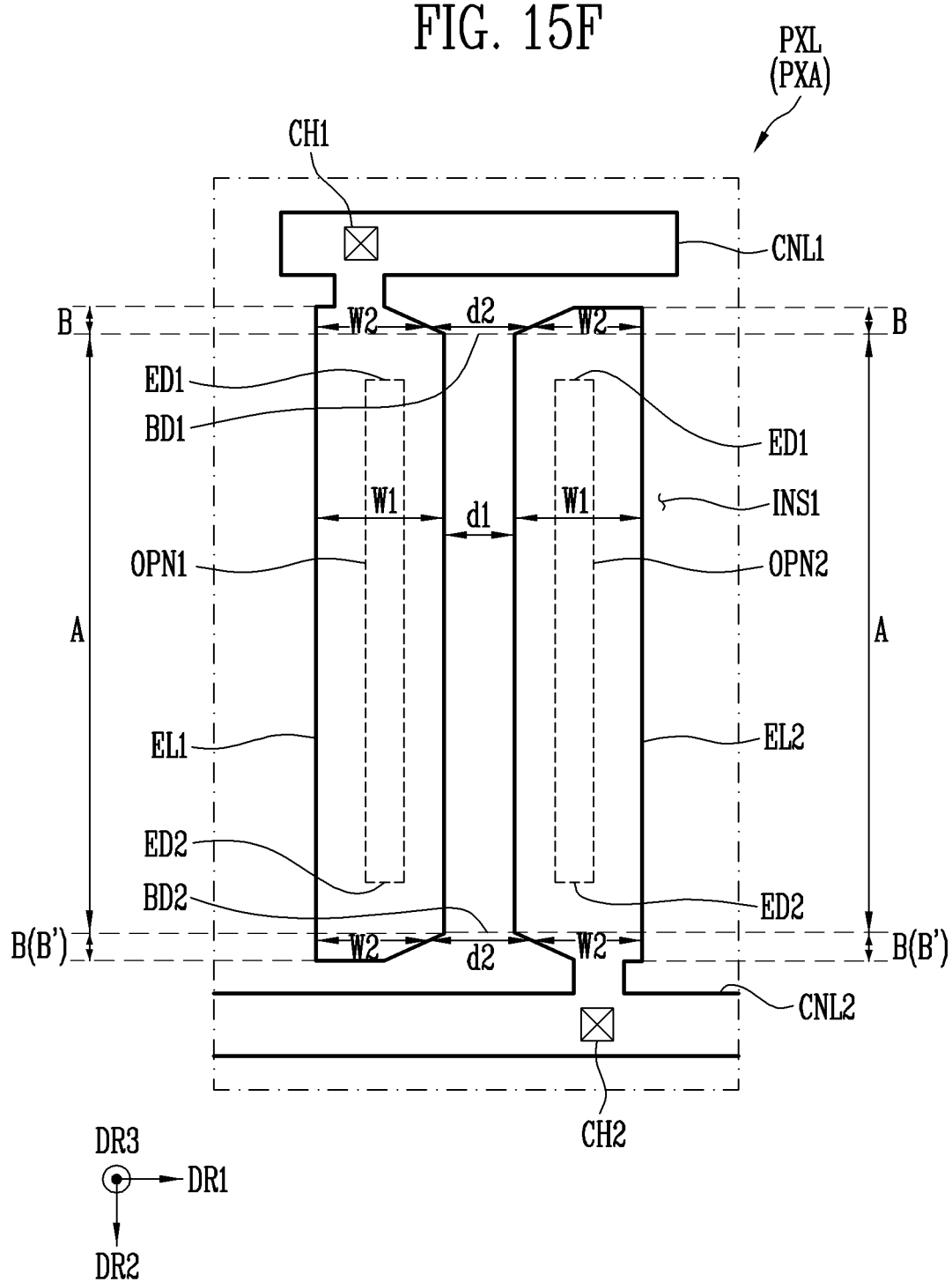
Figure 15G:
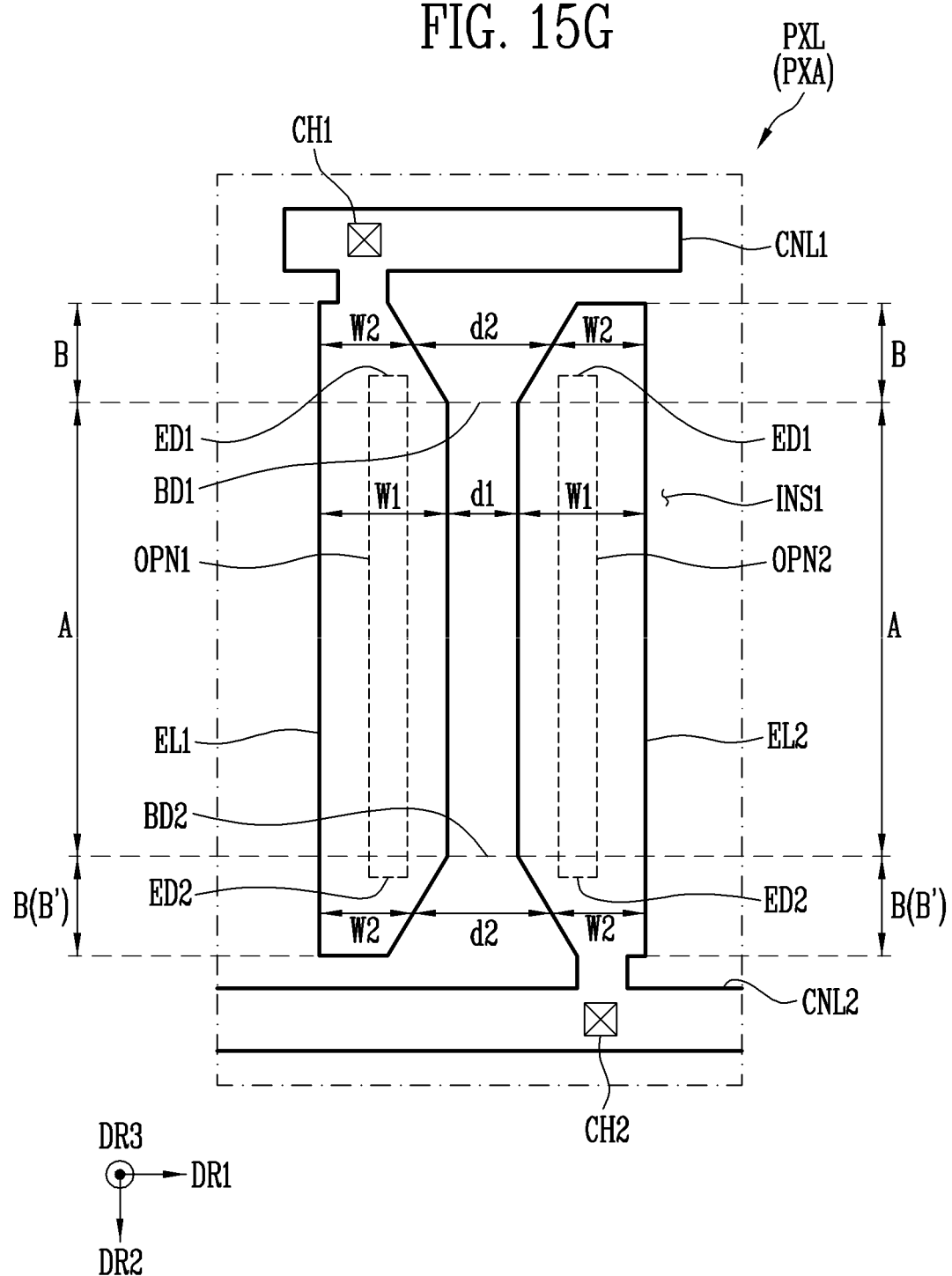

A first boundary BD1 of each of the first and second electrodes EL1 and EL2 may match a first edge ED1 of a corresponding opening of a first insulating layer INS1, and a second boundary BD2 of each of the first and second electrodes EL1 and EL2 may match a second edge ED2 of the corresponding opening of the first insulating layer INS1, but the present disclosure is not limited thereto. Referring to FIGS. 15F and 15G, the first boundary BD1 of the first electrode EL1 may not match a first edge ED1 of a first opening OPN1 of the first insulating layer INS1, and the first boundary BD1 of the second electrode EL2 may not match a first edge ED1 of a second opening OPN2 of the first insulating layer INS1. For example, the first boundary BD1 of the first electrode EL1 may not be positioned on the same line as the first edge ED1 of the first opening OPN1, and the first boundary BD1 of the second electrode EL2 may not be positioned on the same line as the first edge ED1 of the second opening OPN2.

As illustrated in FIG. 15F, the first boundary BD1 of the first electrode EL1 may be positioned at an upper side than the first edge ED1 of the first opening OPN1 in a second direction DR2, and the first boundary BD1 of the second electrode EL2 may be positioned at an upper side than the first edge ED1 of the second opening OPN2 in the second direction DR2, but the present disclosure is not limited to thereto. According to one or more example embodiments, as illustrated in FIG. 15G, the first boundary BD1 of the first electrode EL1 may be positioned at a lower side than the first edge ED1 of the first opening OPN1 in the second direction DR2, and the first boundary BD1 of the second electrode EL2 may be positioned at a lower side than the first edge ED1 of the second opening OPN2 in the second direction DR2.

In some embodiments, a second boundary BD2 of the first electrode EL1 may not match a second edge ED2 of the first opening OPN1, and a second boundary BD2 of the second electrode EL2 may not match a second edge ED2 of the second opening OPN2. For example, the second boundary BD2 of the first electrode EL1 may not be positioned on the same line as the second edge ED2 of the first opening OPN1, and the second boundary BD2 of the second electrode EL2 may not be positioned on the same line as the second edge ED2 of the second opening OPN2.

As illustrated in FIG. 15F, the second boundary BD2 of the first electrode EL1 may be positioned at a lower side than the second edge ED2 of the first opening OPN1 in the second direction DR2, and the second boundary BD2 of the second electrode EL2 may be positioned at a lower side than the second edge ED2 of the second opening OPN2 in the second direction DR2, but the present disclosure is not limited to thereto. According to one or more example embodiments, as illustrated in FIG. 15G, the second boundary BD2 of the first electrode EL1 may be positioned at an upper side than the second edge ED2 of the first opening OPN1 in the second direction DR2, and the second boundary BD2 of the second electrode EL2 may be positioned at an upper side than the second edge ED2 of the second opening OPN2 in the second direction DR2.

According to one or more example embodiments, the first boundary BD1 of one electrode of the first and second electrodes EL1 and EL2 may match the first edge ED1 of a corresponding opening of the first insulating layer INS1, and the first boundary BD1 of the other electrode of the first and second electrodes EL1 and EL2 may not match the first edge ED1 of the corresponding opening of the first insulating layer INS1. In this case, the second boundary BD2 of the one electrode may or may not match the second edge ED2 of the corresponding opening of the first insulating layer INS1, and the second boundary BD2 of the other electrode may or may not match the second edge ED2 of the corresponding opening of the first insulating layer INS1. For example, the first boundary BD1 of the first electrode EL1 may match the first edge ED1 of the first opening OPN1 of the first insulating layer INS1, and the first boundary BD1 of the second electrode EL2 may not match the first edge ED1 of the second opening OPN2 of the first insulating layer INS1. In this case, the second boundary BD2 of the first electrode EL1 may or may not match the second edge ED2 of the first opening OPN1, and the second boundary BD2 of the second electrode EL2 may or may not match the second edge ED2 of the second opening OPN2.

Furthermore, according to another example embodiment, the first boundary BD1 of one electrode of the first and second electrodes EL1 and EL2 may not match the first edge ED1 of a corresponding opening of the first insulating layer INS1, and the first boundary BD1 of the other electrode of the first and second electrodes EL1 and EL2 may not match the first edge ED1 of the corresponding opening of the first insulating layer INS1. In this case, the second boundary BD2 of the one electrode may or may not match the second edge ED2 of the corresponding opening of the first insulating layer INS1, and the second boundary BD2 of the other electrode may or may not match the second edge ED2 of the corresponding opening of the first insulating layer INS1. For example, the first boundary BD1 of the first electrode EL1 may not match the first edge ED1 of the first opening OPN1 of the first insulating layer INS1, and the first boundary BD1 of the second electrode EL2 may match the first edge ED1 of the second opening OPN2 of the first insulating layer INS1. In this case, the second boundary BD2 of the first electrode EL1 may or may not match the second edge ED2 of the first opening OPN1, and the second boundary BD2 of the second electrode EL2 may or may not match the second edge ED2 of the second opening OPN2.

According to the above-described example embodiments, one region of each of the first electrode EL1 and the second electrode EL2 (for example, the second-first and second-second regions B and B') may be partially chamfered to reduce a width W2 of the one region in the first direction, thereby further securing a separation distance d2 between the first electrode EL1 and the second electrode EL2 adjacent to each other in the first direction DR1. Accordingly, short circuit defects between the first electrode EL1 and the second electrode EL2 may be reduced or minimized to prevent dark spot defects of pixels PXL.

Figure 16:
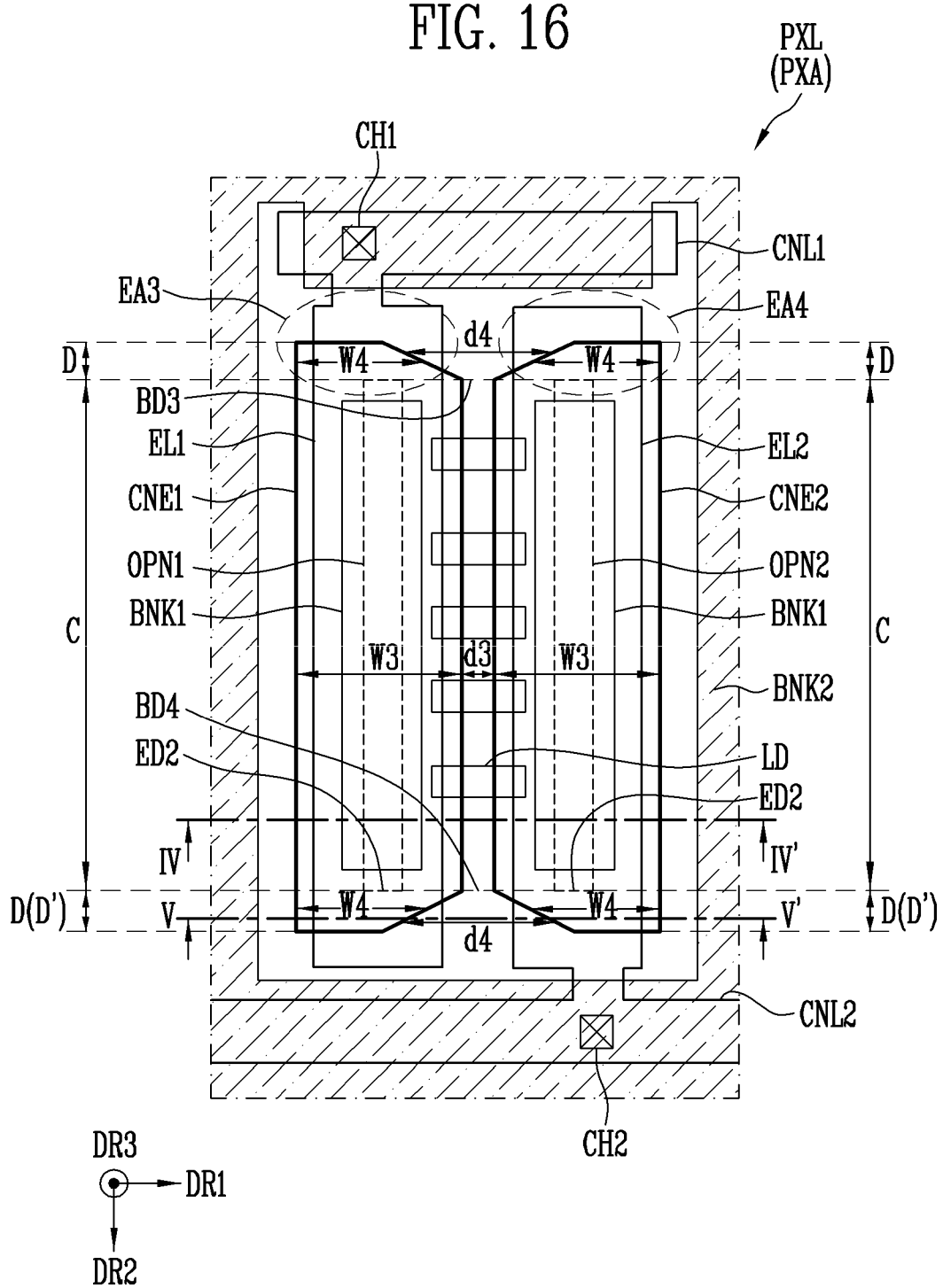
FIG. 16 is a schematic plan view illustrating a pixel according to another example embodiment of the present disclosure.
Figure 17:
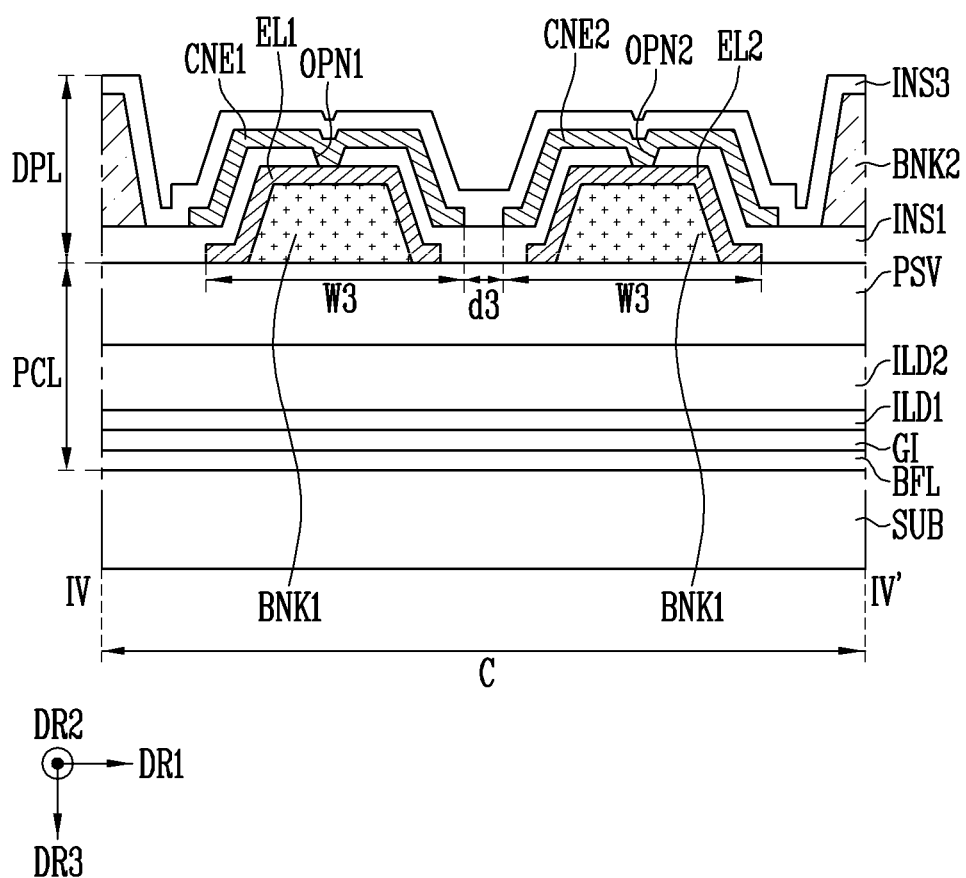
FIG. 17 is a cross-sectional view taken along the line IV-IV' of FIG. 16.
Figure 18:
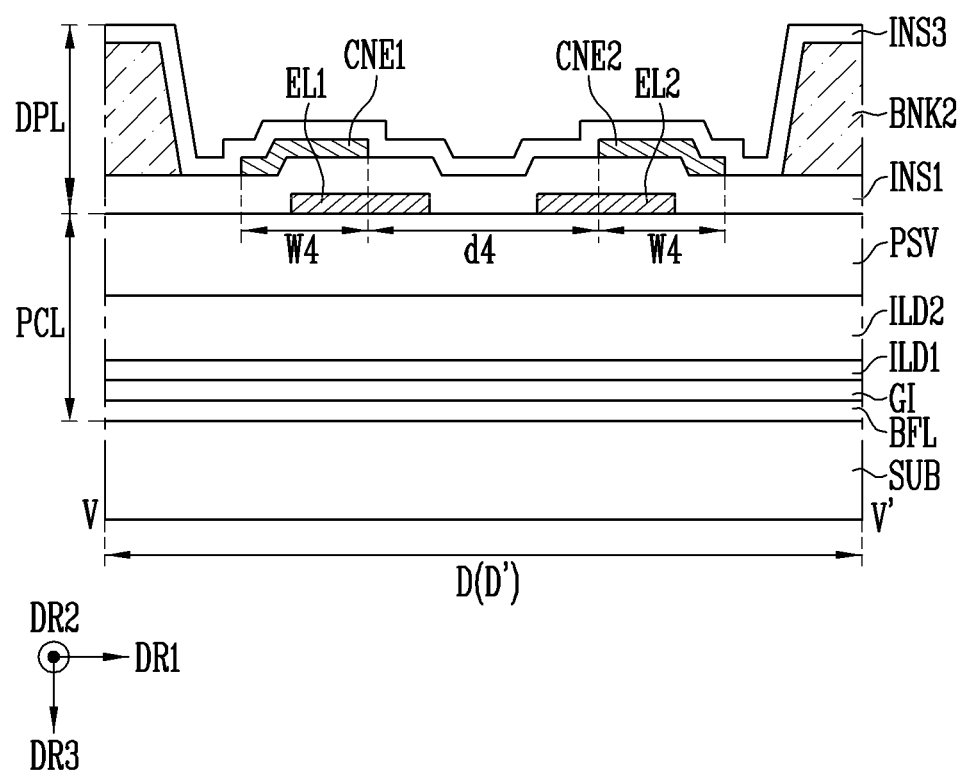
FIG. 18 is a cross-sectional view taken along the line V-V' of FIG. 16.
Figure 19A:
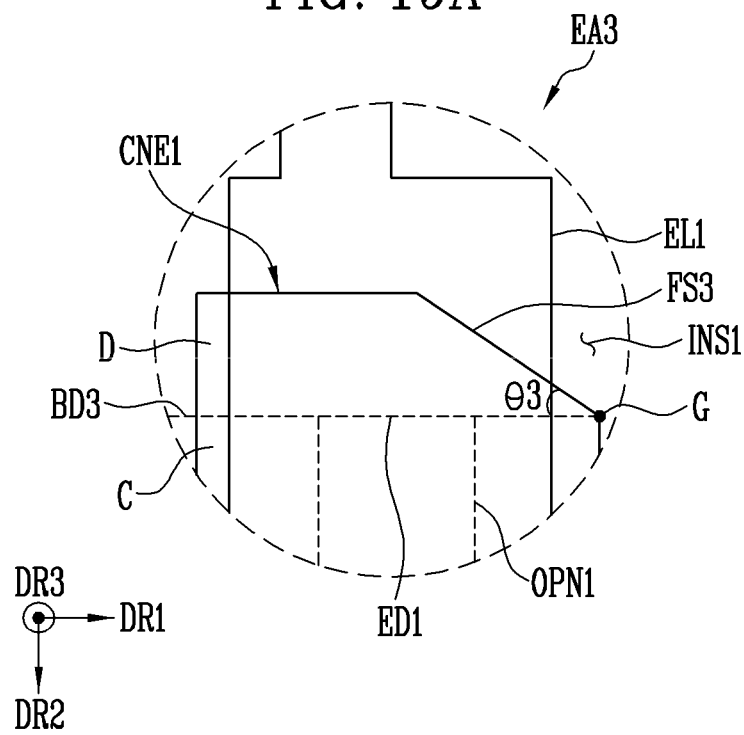
FIG. 19A is a schematic enlarged plan view of a portion EA3 of FIG. 16.
Figure 19B:
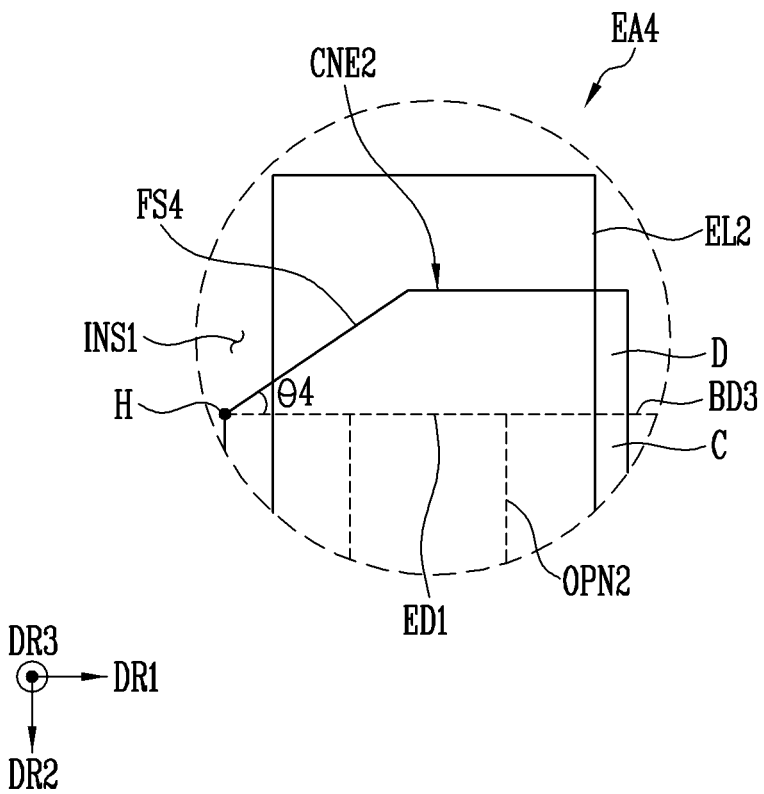
FIG. 19B is a schematic enlarged plan view of a portion EA4 of FIG. 16.

FIG. 16 is a schematic plan view illustrating a pixel according to another example embodiment of the present disclosure. FIG. 17 is a cross-sectional view taken along the line IV-IV' of FIG. 16. FIG. 18 is a cross-sectional view taken along the line V-V' of FIG. 16. FIG. 19A is a schematic enlarged plan view of a portion EA3 of FIG. 16, and FIG. 19B is a schematic enlarged plan view of a portion EA4 of FIG. 16.

The pixel illustrated in FIGS. 16-19B may have a configuration substantially the same as or substantially similar to that of the pixel of FIGS. 7-14B, except that one region of each of first and second contact electrodes CNE1 and CNE2 is partially chamfered and the first and second electrodes EL1 and EL2 are not chamfered.

In relation to the pixel of FIGS. 16-19B, differences from the above-described example embodiments will be mainly described in order to avoid redundant descriptions Referring to FIGS. 1-6A, 7, and 16-19B, a substrate SUB, a pixel circuit layer PCL, and a display element layer DPL may be disposed in a pixel area PXA of each pixel PXL.

The display element layer DPL may include first and second bank patterns BNK1 and BNK2, the first and second electrodes EL1 and EL2, first and second connection lines CNL1 and CNL2, light-emitting elements LD, the first and second contact electrodes CNE1 and CNE2, and first to third insulating layers INS1 to INS3.

In one or more example embodiments of the present disclosure, each of the first and second electrodes EL1 and EL2 may have a bar shape extending in a second direction DR2. In some embodiments, each of the first and second electrodes EL1 and EL2 may have a constant width in a first direction DR1 along the second direction DR2. However, the present disclosure is not limited thereto, and according to some example embodiments, one region of each of the first and second electrodes EL1 and EL2 may have a non-constant width in the first direction DR1 along an extending direction thereof.

In one or more example embodiments of the present disclosure, the first contact electrode CNE1 and the second contact electrode CNE2 may be divided into a third region C and a fourth region D in the second direction DR2. The third region C of each of the first and second contact electrodes CNE1 and CNE2 may be one region that overlaps the light-emitting elements LD, and the fourth region D of each of the first and second contact electrodes CNE1 and CNE2 may be an end portion of a corresponding contact electrode that does not overlap the light-emitting elements LD.

When each of the first and second contact electrodes CNE1 and CNE2 has the bar shape extending in the second direction DR2, the fourth region D of a corresponding contact electrode may be positioned on one side surface and the other side surface of the third region C of each of the first and second contact electrodes CNE1 and CNE2. For example, each of the first and second contact electrodes CNE1 and CNE2 may be divided into the fourth region D, the third region C, and a fourth region D (D') in the second direction DR2. Hereinafter, for convenience, the fourth region D connected to one side surface of the third region C of each of the first and second contact electrodes CNE1 and CNE2 (or positioned at an upper side of the third region C of each of the first and second contact electrodes CNE1 and CNE2 when viewed from above) is referred to as a fourth-first region D, and the fourth region D (D') connected to the other side surface of the third region C of each of the first and second contact electrodes CNE1 and CNE2 (or positioned at an lower side of the third region C of each of the first and second contact electrodes CNE1 and CNE2 when viewed from above) is referred to as a fourth-second region D'. In the following example embodiments, when the fourth-first region D and the fourth-second region D' are collectively referred to as the fourth region D.

In one or more example embodiments of the present disclosure, the third region C of the first contact electrode CNE1 and the third region C of the second contact electrode CNE2 may correspond to each other, the fourth-first region D of the first contact electrode CNE1 and the fourth-first region D of the second contact electrode CNE2 may correspond to each other, the fourth-second region D' of the first contact electrode CNE1 and the fourth-second region D' of the second contact electrode CNE2 may correspond to each other.

The third region C of each of the first and second contact electrodes CNE1 and CNE2 may have a constant width W3 in the first direction DR1 along an extending direction of a corresponding contact electrode. For example, the third region C of the first contact electrode CNE1 may have the constant width W3 in the first direction DR1 along an extending direction of the first contact electrode CNE1, for example, in the second direction DR2. The third region C of the second contact electrode CNE2 may have the constant width W3 in the first direction DR1 along an extending direction of the second contact electrode CNE2, for example, in the second direction DR2. The width W3 of the third region C of the first contact electrode CNE1 in the first direction DR1 may be the same as the width W3 of the third region C of the second contact electrode CNE2 in the first direction DR1, but the present disclosure is not limited thereto. According to one or more example embodiments, the width W3 of the third region C of the first contact electrode CNE1 in the first direction DR1 may be different from the width W3 of the third region C of the second contact electrode CNE2 in the first direction DR1.

The fourth-first region D and the fourth-second region D' of each of the first and second contact electrodes CNE1 and CNE2 may have a non-constant width W4 in the first direction DR1 along an extending direction of a corresponding contact electrode. For example, the fourth-first region D and the fourth-second region D' of each of the first and second contact electrodes CNE1 and CNE2 may have at least two widths W4 in the first direction DR1 along the extending direction of the corresponding contact electrode. For example, the fourth-first region D and the fourth-second region D' of the first contact electrode CNE1 may have at least two widths W4 in the first direction DR1 along the extending direction of the first contact electrode CNE1. The fourth-first region D and the fourth-second region D' of the second contact electrode CNE2 may have at least two widths W4 in the first direction DR1 along the extending direction of the second contact electrode CNE2.

In each of the first and second contact electrodes CNE1 and CNE2, the fourth-first region D and the fourth-second region D' may have the same size and shape, but the present disclosure is not limited thereto. According to some example embodiments, in each of the first and second contact electrodes CNE1 and CNE2, the fourth-first region D and the fourth-second region D' may have different sizes and shapes. In some embodiments, the fourth-first region D and the fourth-second region D' of the first contact electrode CNE1 and the fourth-first region D and the fourth-second region D' of the second contact electrode CNE2 may have the same size and shape, but the present disclosure is not limited thereto. According to one or more example embodiments, the fourth-first region D and the fourth-second region D' of the first contact electrode CNE1 and the fourth-first region D and the fourth-second region D' of the second contact electrode CNE2 may have different sizes and shapes.

When viewed from above, the fourth-first region D of each of the first and second contact electrodes CNE1 and CNE2 may have the width W4 in the first direction DR1 smaller than that of the third region C of a corresponding contact electrode. For example, the width W4 of the fourth-first region D in the first direction DR1 may be decreased as a distance from a third boundary BD3 between the third region C and the fourth-first region D of a corresponding contact electrode is increased. In one or more example embodiments of the present disclosure, a third boundary BD3 between the third region C and the fourth-first region D of the first contact electrode CNE1 may match a first edge ED1 of a first opening OPN1 of the first insulating layer INS1, and a third boundary BD3 between the third region C and the fourth-first region D of the second contact electrode CNE2 may match a first edge ED1 of a second opening OPN2 of the first insulating layer INS1. However, the present disclosure is not limited thereto, and according to one or more example embodiments, the third boundary BD3 of the first contact electrode CNE1 may not match the first edge ED1 of the first opening OPN1, and the third boundary BD3 of the second contact electrode CNE2 may not match the first edge ED1 of the second opening OPN2.

As shown in FIG. 19A, when viewed from above, the fourth-first region D of the first contact electrode CNE1 may have at least one third side surface FS3 that extends from the third boundary BD3 in a diagonal direction inclined to the first direction DR1. As illustrated in FIG. 19A, the third side surface FS3 may meet the third boundary BD3 to form a third inclination angle θ3. The third side surface FS3 may extend in a diagonal direction from a third vertex G at which the third side surface FS3 and the third boundary BD3, which form the third inclination angle θ3, meet. In this case, the third inclination angle θ3 may be an acute angle. In other words, the fourth-first region D of the first contact electrode CNE1 may be partially chamfered. For this reason, the width W4 of the fourth-first region D of the first contact electrode CNE1 in the first direction DR1 may be decreased as a distance from the third boundary BD3 is increased. For example, the width W4 of the fourth-first region D of the first contact electrode CNE1 in the first direction DR1 may be increased as the distance from the third boundary BD3 is decreased.

When the fourth-first region D of the first contact electrode CNE1 is partially chamfered, at least one corner of the first electrode EL1 may be positioned outside a chamfered portion of the fourth-first region D of the first contact electrode CNE1 when viewed from above.

As shown in FIG. 19B, when viewed from above, the fourth-first region D of the second contact electrode CNE2 may have at least one fourth side surface FS4 that extends from the third boundary BD3 in a diagonal direction inclined to the first direction DR1. As illustrated in FIG. 19B, the fourth side surface FS4 may meet the third boundary BD3 to form a fourth inclination angle θ4. The fourth side surface FS4 may extend in a diagonal direction from a fourth vertex H at which the fourth side surface FS4 and the third boundary BD3, which form the fourth inclination angle θ4, meet. In one or more example embodiments of the present disclosure, the fourth inclination angle θ4 may be an acute angle. In other words, the fourth-first region D of the second contact electrode CNE2 may be partially chamfered. For this reason, the width W4 of the fourth-first region D of the second contact electrode CNE2 in the first direction DR1 may be decreased as a distance from the third boundary BD3 is increased. For example, the width W4 of the fourth-first region D of the second contact electrode CNE2 in the first direction DR1 may be increased as the distance from the third boundary BD3 is decreased.

When the fourth-first region D of the second contact electrode CNE2 is partially chamfered, at least one corner of the second electrode EL2 may be positioned outside a chamfered portion of the fourth-first region D of the second contact electrode CNE2 when viewed from above.

When viewed from above, the fourth-second region D' of each of the first and second contact electrodes CNE1 and CNE2 may have the width W4 in the first direction DR1 smaller than that of the third region C of a corresponding contact electrode. For example, the width W4 of the fourth-second region D' in the width W4 may be decreased as a distance from a fourth boundary BD4 between the third region C and the fourth-second region D' of a corresponding contact electrode is increased. In some example embodiments of the present disclosure, a fourth boundary BD4 of the first contact electrode CNE1 may match the second edge ED2 of the first opening OPN1 of the first insulating layer INS1, and a fourth boundary BD4 of the second contact electrode CNE2 may not match the second edge ED2 of the second opening OPN2 of the first insulating layer INS1. However, the present disclosure is not limited thereto, and according to some example embodiments, the fourth boundary BD4 of the first contact electrode CNE1 may not match the second edge ED2 of the first opening OPN1, and the fourth boundary BD4 of the second contact electrode CNE2 may not match the second edge ED2 of the second opening OPN2.

When viewed from above, the fourth-second region D' of each of the first and second contact electrodes CNE1 and CNE2 may have at least one side surface that extends from the fourth boundary BD4 in a diagonal direction inclined to the first direction DR1. The at least one side surface may meet the fourth boundary BD4 of a corresponding contact electrode to form an inclination angle. In this case, the inclination angle may be an acute angle. In other words, the fourth-second region D' of each of the first and second contact electrodes CNE1 and CNE2 may be partially chamfered. For this reason, the width W4 of the fourth-second region D' of each of the first and second contact electrodes CNE1 and CNE2 in the first direction DR1 may be decreased as a distance from the fourth boundary BD4 is increased. For example, the width W4 of the fourth-second region D' of each of the first and second contact electrodes CNE1 and CNE2 in the first direction DR1 may be increased as the distance from the fourth boundary BD4 is decreased.

When viewed from above, the width W3 of the third region C of the first contact electrode CNE1 in the first direction DR1 may be greater than the width W4 of each of the fourth-first and fourth-second regions D and D' of the first contact electrode CNE1 in the first direction DR1. In one or more example embodiments, when viewed from above, the width W3 of the third region C of the second contact electrode CNE2 in the first direction DR1 may be greater than the width W4 of each of the fourth-first and fourth-second regions D and D' of the second contact electrode CNE2 in the first direction DR1. In this case, a separation distance d3 (or a "gap") between the third region C of the first contact electrode CNE1 and the third region C of the second contact electrode CNE2 in the first direction DR1 may be smaller than a separation distance d4 (or a "gap") between the fourth-first region D of the first contact electrode CNE1 and the fourth-first region D of the second contact electrode CNE2 in the first direction DR1. In some example embodiments, the separation distance d3 between the third region C of the first contact electrode CNE1 and the third region C of the second contact electrode CNE2 in the first direction DR1 may be smaller than a separation distance d4 between the fourth-second region D' of the first contact electrode CNE1 and the fourth-second region D' of the second contact electrode CNE2 in the first direction DR1.

As described above, because the fourth-first and fourth-second regions D and D' of each of the first and second contact electrodes CNE1 and CNE2 are chamfered, the separation distance d4 between the fourth-first region D of the first contact electrode CNE1 and the fourth-first region D of the second contact electrode CNE2 in the first direction DR1 and the separation distance d4 between the fourth-second region D' of the first contact electrode CNE1 and the fourth-second region D' of the second contact electrode CNE2 in the first direction DR1 may be secured at a certain level or more. In this case, it is possible to reduce or minimize short circuit defects occurring between an end portion of the first contact electrode CNE1 (for example, the fourth-first and fourth-second regions D and D' of the first contact electrode CNE1) and an end portion of the second contact electrode CNE2 (for example, the fourth-first and fourth-second regions D and D' of the second contact electrode CNE2).

FIGS. 20A-20G are schematic plan views of the first and second contact electrodes of FIG. 16 implemented according to some other example embodiments.

In relation to the first and second contact electrodes of FIGS. 20A-20G, differences from the above-described example embodiments will be mainly described in order to avoid redundant descriptions.

Referring to FIGS. 1-6A, 16, and 20A-20G, a first contact electrode CNE1 and a second contact electrode CNE2 spaced from each other in a first direction DR1 may be provided in a pixel area PXA of each pixel PXL.

Each of the first and second contact electrodes CNE1 and CNE2 may be divided into a fourth-first region D, a third region C, and a fourth-second region D' in a second direction DR2. The third region C of each of the first and second contact electrodes CNE1 and CNE2 may be one region that overlaps light-emitting elements LD, and the fourth-first and fourth-second regions D and D' of each of the first and second contact electrodes CNE1 and CNE2 may be regions excluding the third region C of a corresponding contact electrode and may be end portions of the corresponding contact electrode. For example, the fourth-first and fourth-second regions D and D' of each of the first and second contact electrodes CNE1 and CNE2 may be one regions that do not overlap the light-emitting elements LD.

Figure 20A:
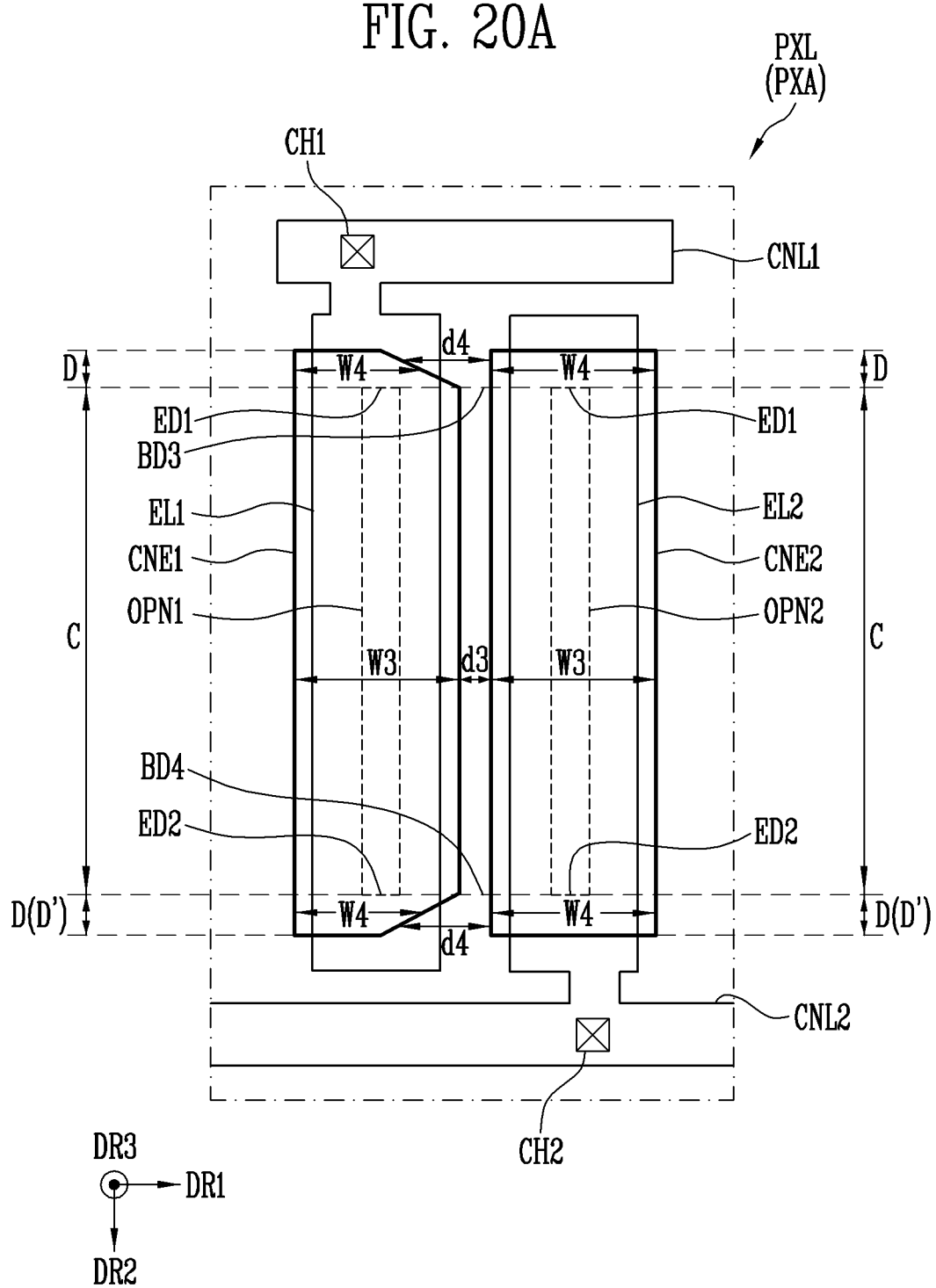
FIGS. 20A-20G are schematic plan views of first and second contact electrodes of FIG. 16 implemented according to some other example embodiments.

First, referring to FIG. 20A, the third region C of each of the first and second contact electrodes CNE1 and CNE2 may have a constant width W3 in the first direction DR1 along the second direction DR2.

The fourth-first region D and the fourth-second region D' of the first contact electrode CNE1 may each be partially chamfered and thus may have at least two widths W4 in the first direction DR1 along the second direction DR2. For example, the width W4 of the fourth-first region D of the first contact electrode CNE1 in the first direction DR1 may be decreased as a distance from a third boundary BD3 between the third region C and the fourth-first region D of the first contact electrode CNE1 is increased. In some embodiments, the width W4 of the fourth-second region D' of the first contact electrode CNE1 in the first direction DR1 may be decreased as a distance from a fourth boundary BD4 between the third region C and the fourth-second region D' of the first contact electrode CNE1 is increased.

In this case, the width W4 of each of the fourth-first and fourth-second regions D and D' of the first contact electrode CNE1 in the first direction DR1 may be smaller than the width W3 of the third region C of the first contact electrode CNE1 in the first direction DR1. Each of the fourth-first and fourth-second regions D and D' of the first contact electrode CNE1 may have at least one side surface that extends in a diagonal direction inclined to the first direction DR1. The fourth-first region D of the first contact electrode CNE1 and the fourth-second region D' of the first contact electrode CNE1 may have the same size and shape, but the present disclosure is not limited thereto. According to some example embodiments, the fourth-first region D of the first contact electrode CNE1 and the fourth-second region D' of the first contact electrode CNE1 may have different sizes and shapes.

Each of the fourth-first and fourth-second regions D and D' of the second contact electrode CNE2 may have a constant width W4 in the first direction DR1 along the second direction DR2. In this case, the width W4 of each of the fourth-first and fourth-second regions D and D' of the second contact electrode CNE2 in the first direction DR1 may be the same as the width W3 of the third region C of the second contact electrode CNE2 in the first direction DR1.

As described above, because the fourth-first and fourth-second regions D and D' of the first contact electrode CNE1 are partially chamfered, a separation distance d4 between the fourth-first region D of the first contact electrode CNE1 and the fourth-first region D of the second contact electrode CNE2 in the first direction DR1 may be further secured, and a separation distance d4 between the fourth-second region D' of the first contact electrode CNE1 and the fourth-second region D' of the second contact electrode CNE2 in the first direction DR1 may also be further secured. Accordingly, it is possible to reduce or minimize short circuit defects between the first contact electrode CNE1 and the second contact electrode CNE2 caused by a spatial constraint.

Figure 20B:
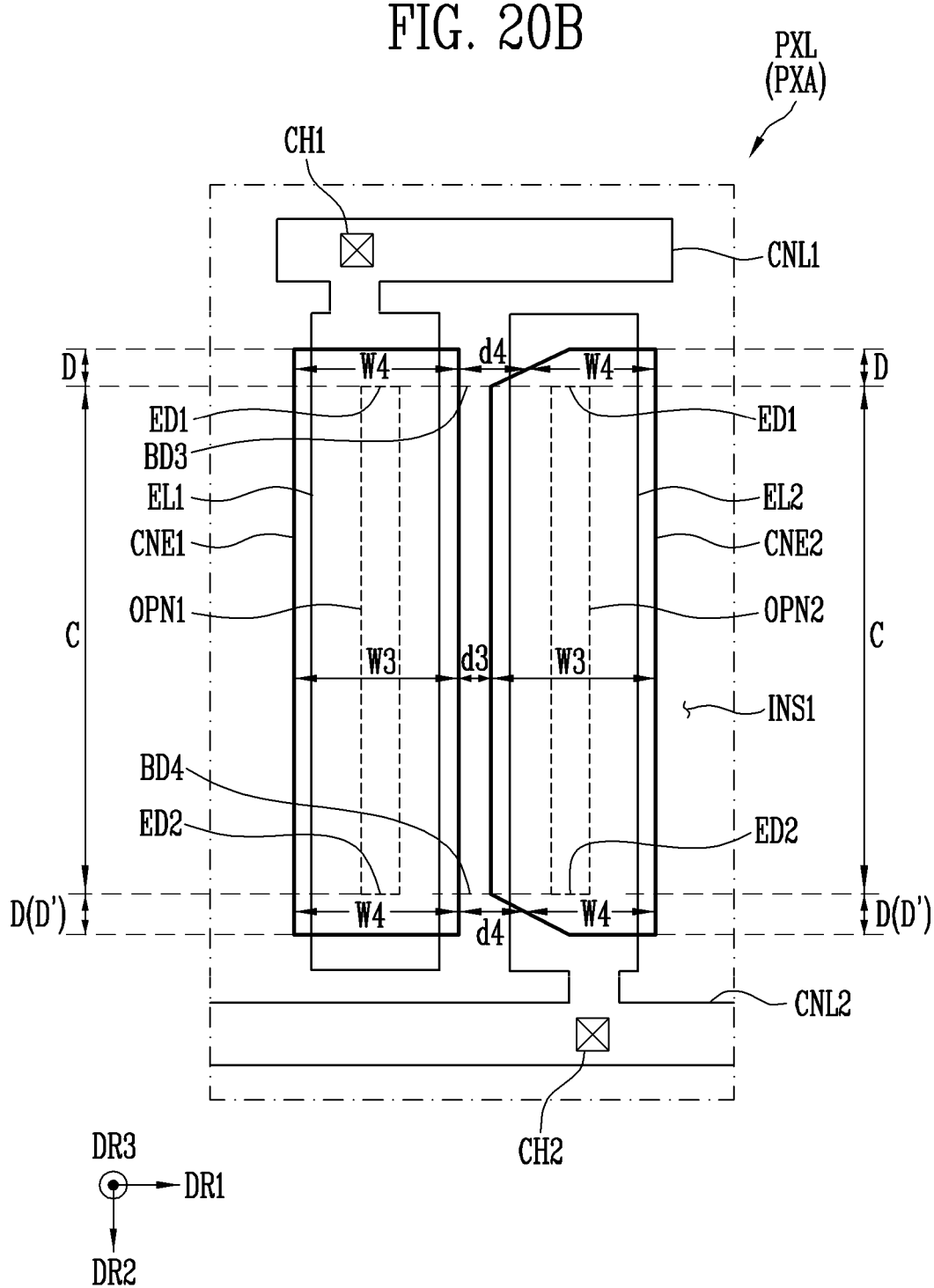

Referring to FIG. 20B, the fourth-first and fourth-second regions D and D' of the second contact electrode CNE2 may each be partially chamfered and thus may have at least two widths W4 in the first direction DR1 along the second direction DR2. For example, the width W4 of the fourth-first region D of the second contact electrode CNE2 in the first direction DR1 may be decreased as a distance from a third boundary BD3 between the third region C and the fourth-first region D of the second contact electrode CNE2 is increased. In some embodiments, the width W4 of the fourth-second region D' of the second contact electrode CNE2 in the first direction DR1 may be decreased as a distance from a fourth boundary BD4 between the third region C and the fourth-second region D' of the second contact electrode CNE2 is increased.

In this case, the width W4 of each of the fourth-first and fourth-second regions D and D' of the second contact electrode CNE2 in the first direction DR1 may be smaller than a width W3 of the third region C of the second contact electrode CNE2 in the first direction DR1. Each of the fourth-first and fourth-second regions D and D' of the second contact electrode CNE2 may have at least one side surface that extends in a diagonal direction inclined to the first direction DR1.

Each of the fourth-first and fourth-second regions D and D' of the first contact electrode CNE1 may have a constant width W4 in the first direction DR1 along the second direction DR2 In this case, the width W4 of each of the fourth-first and fourth-second regions D and D' of the first contact electrode CNE1 in the first direction DR1 may be the same as the width W3 of the third region C in the first direction DR1 in the first direction DR1.

As described above, because the fourth-first and fourth-second regions D and D' of the second contact electrode CNE2 are partially chamfered, a separation distance d4 between the fourth-first region D of the first contact electrode CNE1 and the fourth-first region D of the second contact electrode CNE2 in the first direction DR1 may be further secured, and a separation distance d4 between the fourth-second region D' of the first contact electrode CNE1 and the fourth-second region D' of the second contact electrode CNE2 in the first direction DR1 may be further secured.

Figure 20C:
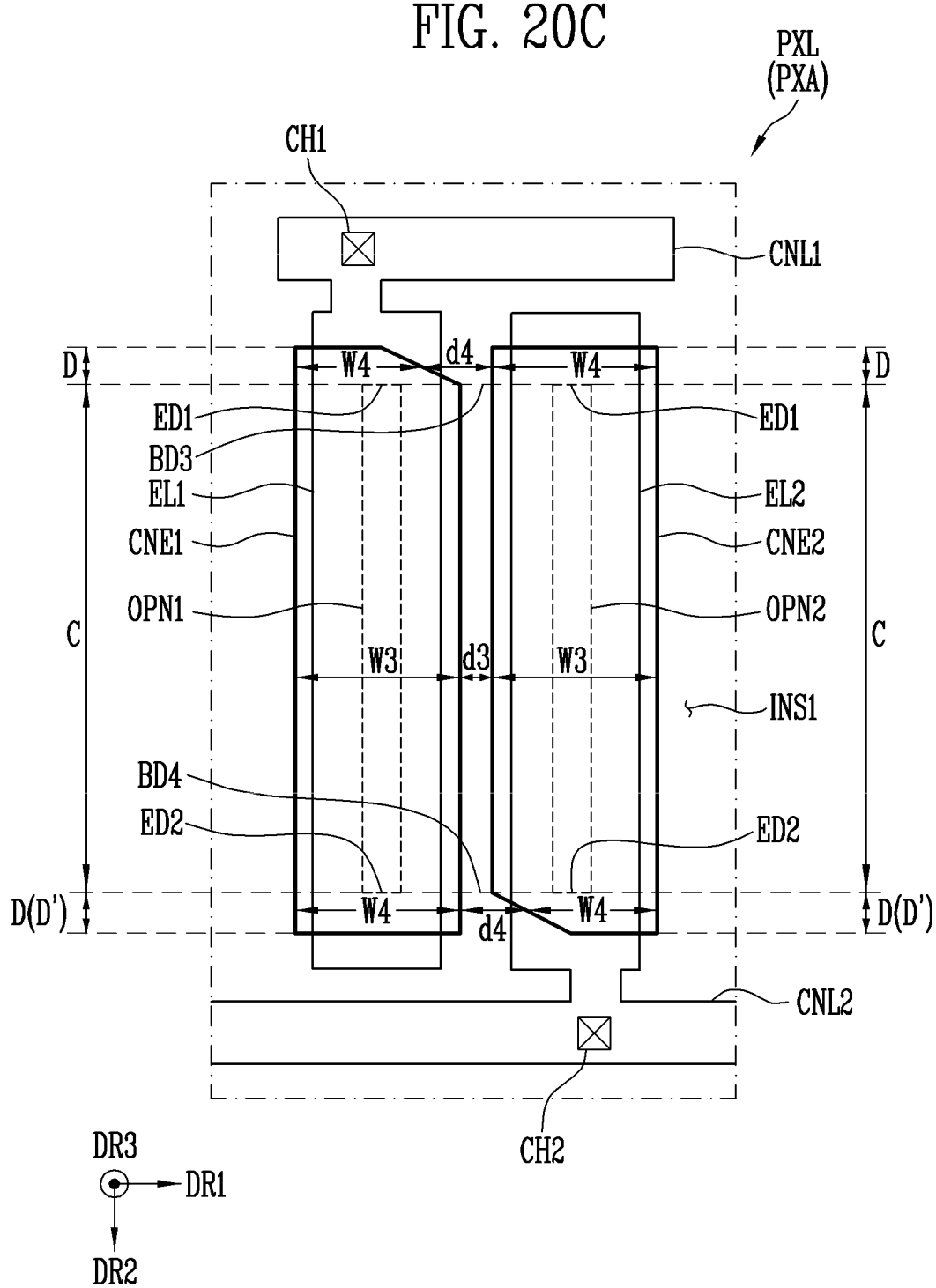

Referring to FIG. 20C, the fourth-first region D of the first contact electrode CNE1 and the fourth-second region D' of the second contact electrode CNE2 may be partially chamfered and thus may have at least two widths W4 in the first direction DR1 along the second direction DR2. Therefore, the width W4 of the fourth-first region D of the first contact electrode CNE1 in the first direction DR1 may be decreased as a distance from a third boundary BD3 between the third region C and the fourth-first region D of the first contact electrode CNE1 is increased, and the width W4 of the fourth-second region D' of the second contact electrode CNE2 in the first direction DR1 may be decreased as a distance from a fourth boundary BD4 between the third region C and the fourth-second region D' of the second contact electrode CNE2 is increased. In this case, the width W4 of the fourth-first region D of the first contact electrode CNE1 in the first direction DR1 may be smaller than a width W3 of the third region C of the first contact electrode CNE1 in the first direction DR1. In some embodiments, the width W4 of the fourth-second region D' of the second contact electrode CNE2 in the first direction DR1 may be smaller than a width W3 of the third region C of the second contact electrode CNE2 in the first direction DR1.

As described above, because the fourth-first region D of the first contact electrode CNE1 and the fourth-second region D' of the second contact electrode CNE2 are partially chamfered, a separation distance d4 between the fourth-first region D of the first contact electrode CNE1 and the fourth-first region D of the second contact electrode CNE2 in the first direction DR1 may be further secured, and a separation distance d4 between the fourth-second region D' of the first contact electrode CNE1 and the fourth-second region D' of the second contact electrode CNE2 in the first direction DR1 may be further secured.

In the above-described example embodiments, it has been described that the fourth-first region D of the first contact electrode CNE1 and the fourth-second region D' of the second contact electrode CNE2 are partially chamfered and the fourth-second region D' of the first contact electrode CNE1 and the fourth-first region D of the second contact electrode CNE2 have the constant width W4 in the first direction DR1, but the present disclosure is not limited thereto. For example, the fourth-second region D' of the first contact electrode CNE1 and the fourth-first region D of the second contact electrode CNE2 may be partially chamfered and the fourth-first region D of the first contact electrode CNE1 and the fourth-second region D' of the second contact electrode CNE2 may have the constant width W4 in the first direction DR1.

Figure 20D:
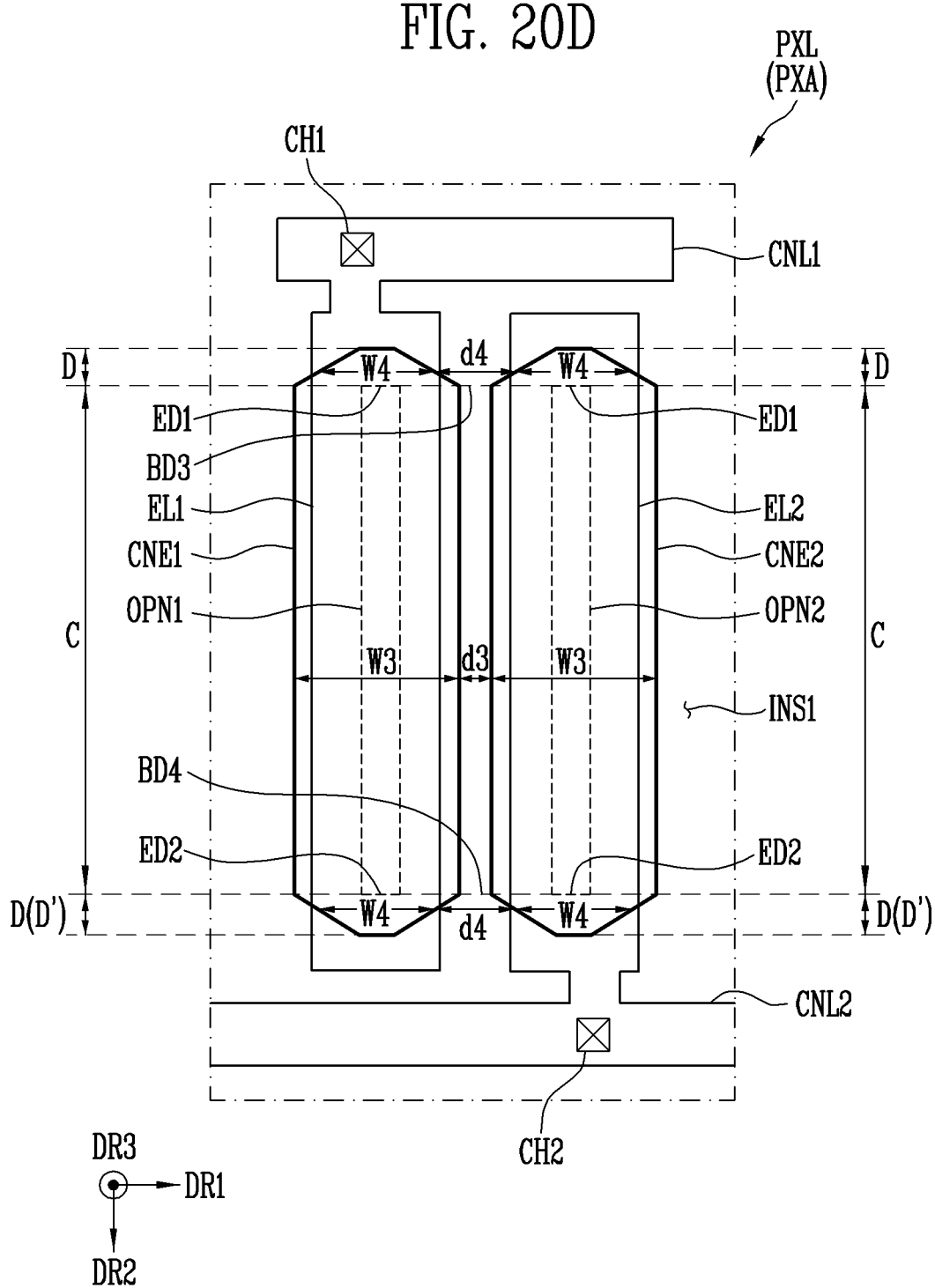

Referring to FIG. 20D, the fourth-first and fourth-second regions D and D' of each of the first and second contact electrodes CNE1 and CNE2 may each be partially chamfered and thus may have two side surfaces that extend in a diagonal direction inclined to the first direction DR1. The fourth-first region D of the first contact electrode CNE1 and the fourth-first region D' of the second contact electrode CNE2 may have the same size and shape, but the present disclosure is not limited thereto. According to one or more example embodiments, the fourth-first region D of the first contact electrode CNE1 and the fourth-first region D' of the second contact electrode CNE2 may have different sizes and shapes. In some embodiments, the fourth-second region D' of the first contact electrode CNE1 and the fourth-second region D' of the second contact electrode CNE2 may have the same size, but according to some other example embodiments, the fourth-second region D' of the first contact electrode CNE1 and the fourth-second region D' of the second contact electrode CNE2 may have different sizes and shapes.

When the fourth-first region D of the first contact electrode CNE1 and the fourth-first region D of the second contact electrode CNE2 have the same size and shape and the fourth-second region D' of the first contact electrode CNE1 and the fourth-second region D' of the second contact electrode CNE2 have the same size and shape, the first contact electrode CNE1 and the second contact electrode CNE2 may be disposed in symmetry about an imaginary line (not illustrated) that extends in the second direction DR2 when viewed from above.

In one or more example embodiments, the width W4 of the fourth-first region D of each of the first and second contact electrodes CNE1 and CNE2 in the first direction DR1 may be decreased as a distance from a third boundary BD3 is increased. In some example embodiments, the width W4 of the fourth-second region D' of each of the first and second contact electrodes CNE1 and CNE2 in the first direction DR1 may be decreased as a distance from a fourth boundary BD4 is increased.

As described above, because the fourth-first and fourth-second regions D and D' of each of the first and second contact electrodes CNE1 and CNE2 are partially chamfered, a separation distance d4 between the fourth-first region D of the first contact electrode CNE1 and the fourth-first region D of the second contact electrode CNE2 in the first direction DR1 may be further secured, and a separation distance d4 between the fourth-second region D' of the first contact electrode CNE1 and the fourth-second region D' of the second contact electrode CNE2 in the first direction DR1 may be further secured.

Figure 20E:
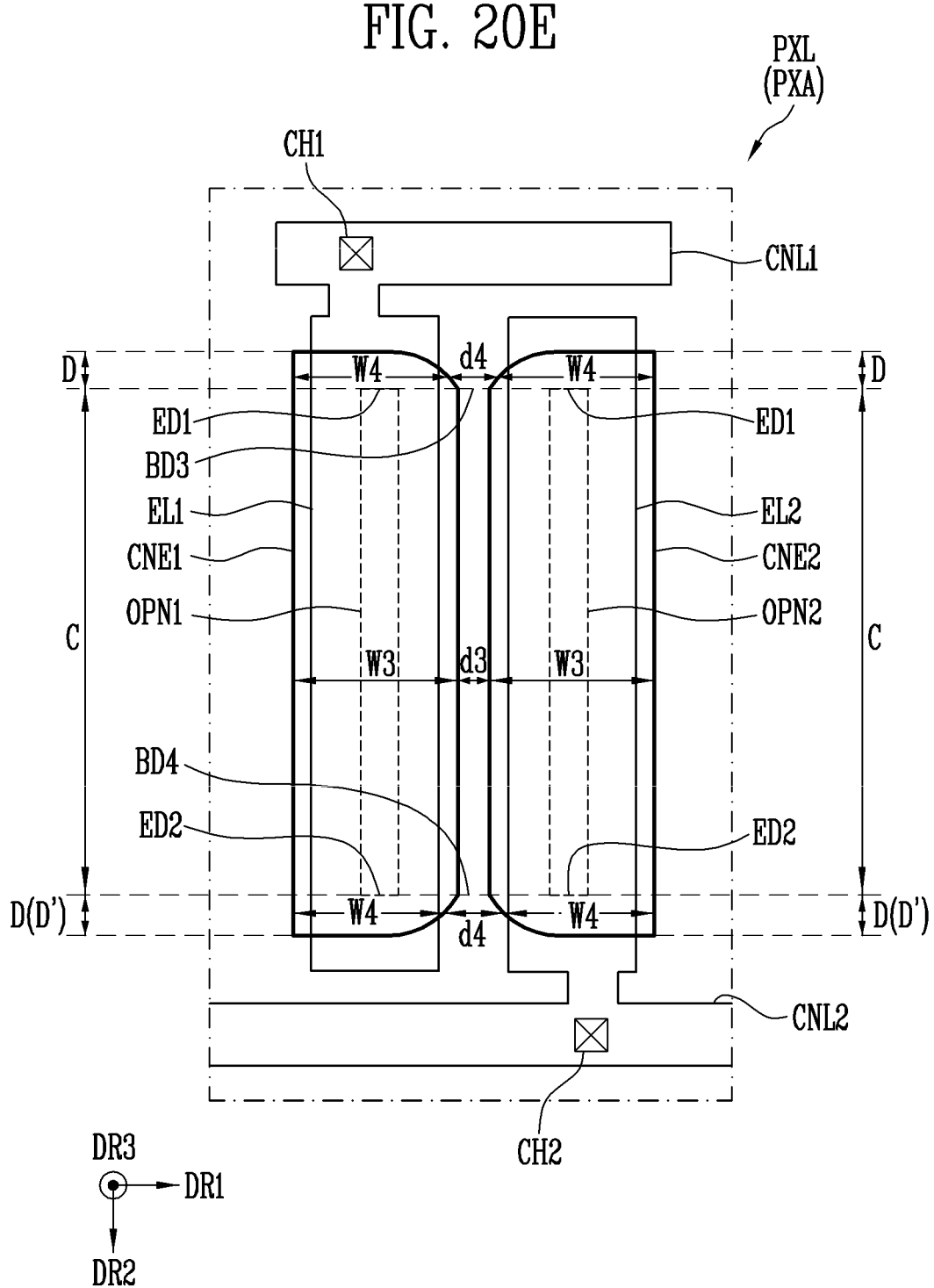

In the above-described example embodiments, it has been described that the partially chamfered fourth-first and fourth-second regions D and D' of each of the first and second contact electrodes CNE1 and CNE2 have at least one side surface formed of a straight line that extends in a diagonal direction inclined to the first direction DR1, but the present disclosure is not limited thereto. According to one or more example embodiments, as illustrated in FIG. 20E, the fourth-first and fourth-second regions D and D' of each of the first and second contact electrodes CNE1 and CNE2 may include a non-square boundary. For example, the fourth-first and fourth-second regions D and D' of each of the first and second contact electrodes CNE1 and CNE2 may include at least one side surface formed of a curve having certain curvature. In this case, the shapes of the fourth-first and fourth-second regions D and D' of each of the first and second contact electrodes CNE1 and CNE2 may be variously changed within a range in which a width W4 of each of the fourth-first and fourth-second regions D and D' of a corresponding contact electrode in the first direction DR1 may be smaller than a width W3 of the third region C of the corresponding contact electrode in the first direction DR1.

A third boundary BD3 of each of the first and second contact electrodes CNE1 and CNE2 may match a first edge ED1 of a corresponding opening of a first insulating layer INS1, and a fourth boundary BD4 of each of the first and second contact electrodes CNE1 and CNE2 may match a second edge ED2 of the corresponding opening of the first insulating layer INS1, but the present disclosure is not limited thereto.

Figure 20F:
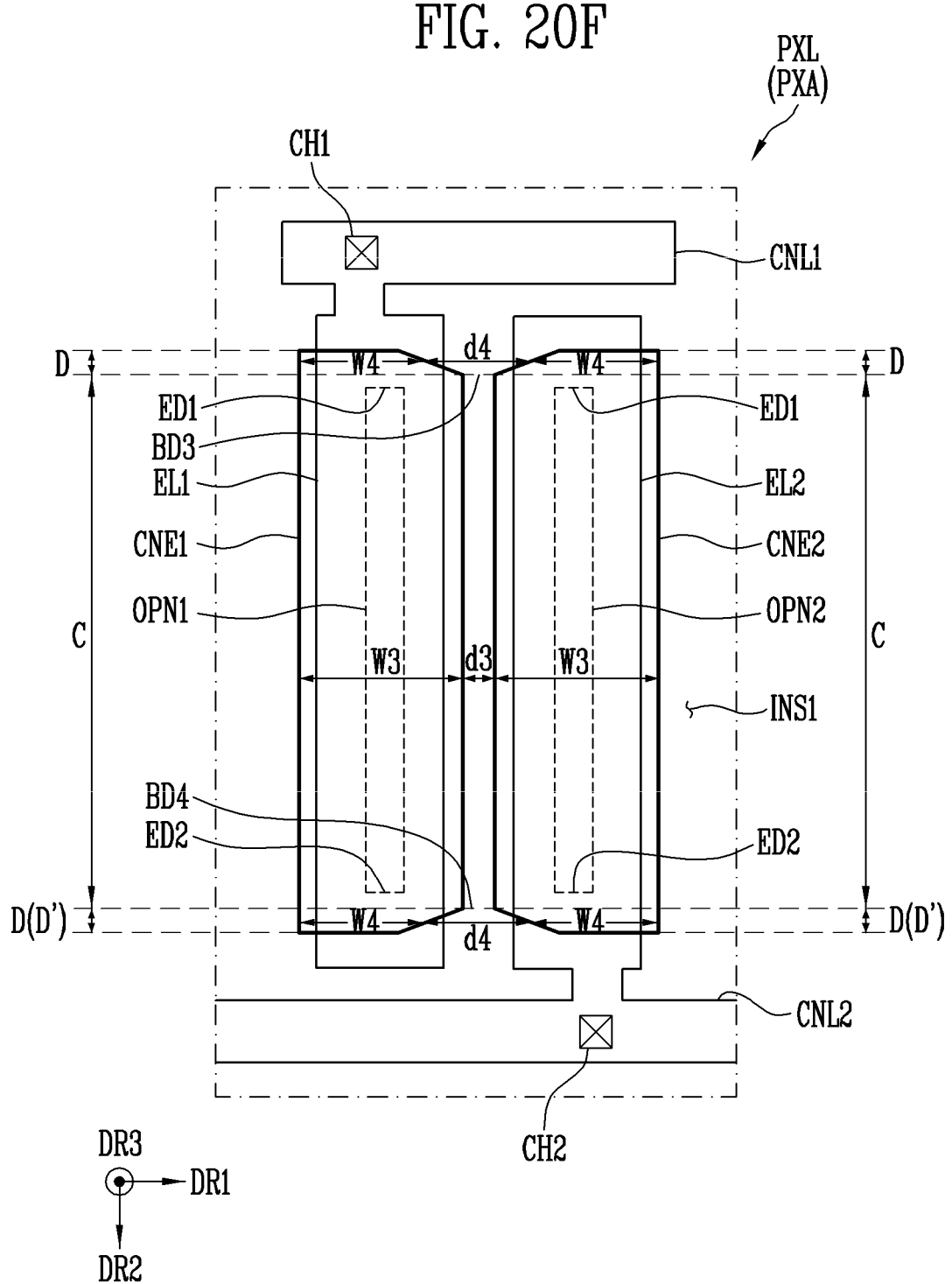
Figure 20G:
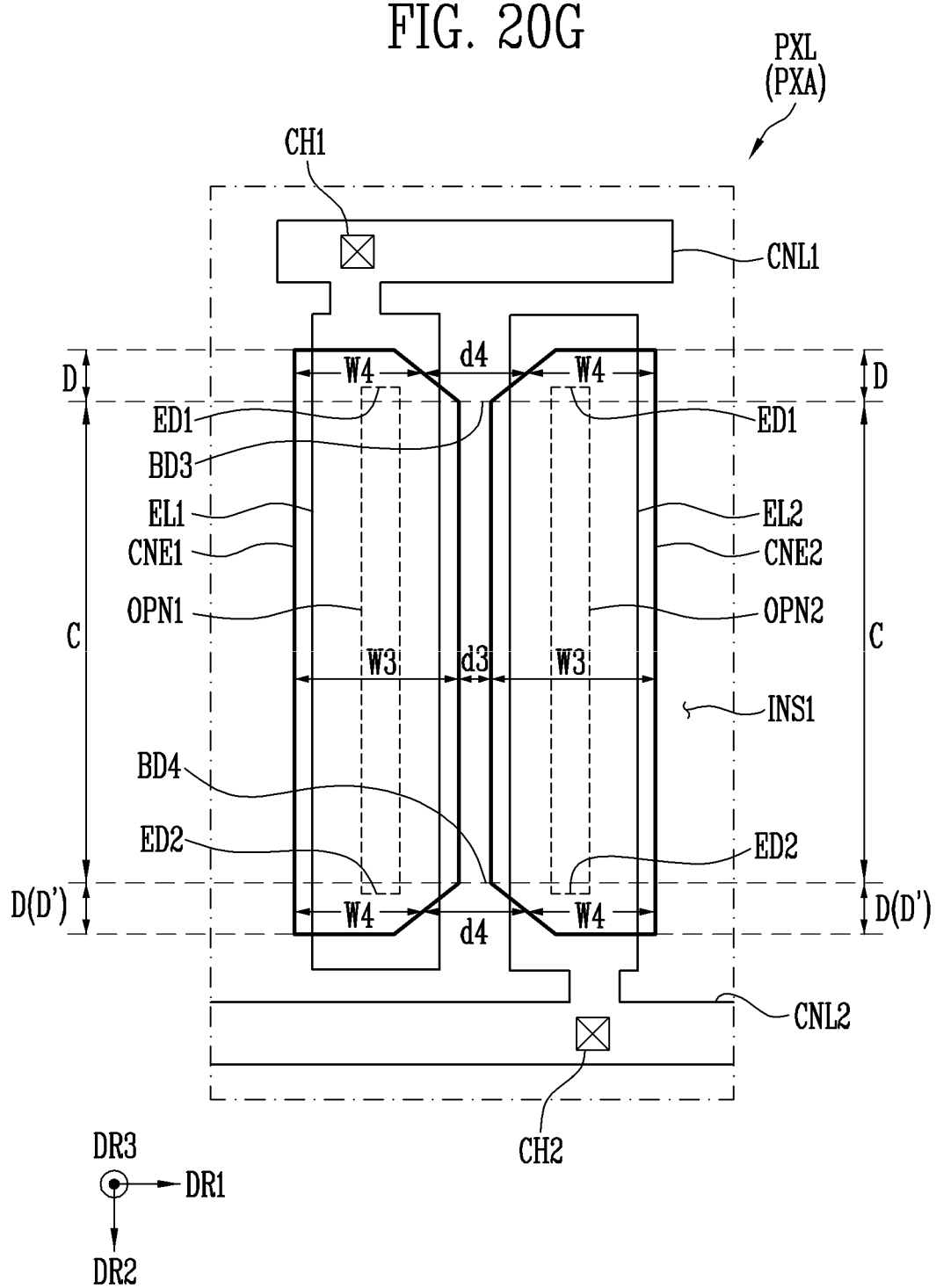

Referring to FIGS. 20F-20G, a third boundary BD3 of each of the first contact electrode CNE1 may match not a first edge ED1 of a first opening OPN1 of a first insulating layer INS1, and a fourth boundary BD4 of the second contact electrode CNE2 may match not a second edge ED2 of a second opening OPN2 of the first insulating layer INS1.

As illustrated in FIG. 20F, the third boundary BD3 of the first contact electrode CNE1 may be positioned at an upper side than the first edge ED1 of the first opening OPN1 in the second direction DR2, and the third boundary BD3 of the second contact electrode CNE2 may be positioned at an upper side than the first edge ED1 of the second opening OPN2 in the second direction DR2, but the present disclosure is not limited to thereto. According to one or more example embodiments, as illustrated in FIG. 20G, the third boundary BD3 of the first contact electrode CNE1 may be positioned at a lower side than the first edge ED1 of the first opening OPN1 in the second direction DR2, and the third boundary BD3 of the second contact electrode CNE2 may be positioned at a lower side than the first edge ED1 of the second opening OPN2 in the second direction DR2.

In some example embodiments, the fourth boundary BD4 of the first contact electrode CNE1 may not match the second edge ED2 of the first opening OPN1, and the fourth boundary BD4 of the second contact electrode CNE2 may not match the second edge ED2 of the second opening OPN2.

As illustrated in FIG. 20F, the fourth boundary BD4 of the first contact electrode CNE1 may be positioned at an lower side than the second edge ED2 of the first opening OPN1 in the second direction DR2, and the fourth boundary BD4 of the second contact electrode CNE2 may be positioned at a lower side than the second edge ED2 of the second opening OPN2 in the second direction DR2, but the present disclosure is not limited to thereto. According to one or more example embodiments, as illustrated in FIG. 20G, the fourth boundary BD4 of the first contact electrode CNE1 may be positioned at an upper side than the second edge ED2 of the first opening OPN1 in the second direction DR2, and the fourth boundary BD4 of the second contact electrode CNE2 may be positioned at an upper side than the second edge ED2 of the second opening OPN2 in the second direction DR2.

According to some example embodiments, a third boundary BD3 of one contact electrode of the first and second contact electrodes CNE1 and CNE2 may match a first edge ED1 of a corresponding opening of the first insulating layer INS1, and a third boundary BD3 of the other contact electrode of the first and second contact electrodes CNE1 and CNE2 may not match a first edge ED1 of a corresponding opening of the first insulating layer INS1. In this case, the fourth boundary BD4 of the one electrode may not match a second edge ED2 of the corresponding opening of the first insulating layer INS1, and the fourth boundary BD4 of the other contact electrode may match a second edge ED2 of the corresponding opening of the first insulating layer INS1.

According to another example embodiment, a third boundary BD3 of one contact electrode of the first and second contact electrodes CNE1 and CNE2 may match a first edge ED1 of a corresponding opening of a first insulating layer INS1, and a third boundary BD3 of the other contact electrode of the first and second contact electrodes CNE1 and CNE2 may match a first edge ED1 of a corresponding opening of the first insulating layer INS1. In this case, the fourth boundary BD4 of the one electrode may match a second edge ED2 of the corresponding opening of the first insulating layer INS1, and the fourth boundary BD4 of the other contact electrode may not match a second edge ED2 of the corresponding opening of the first insulating layer INS1.

According to the above-described example embodiments, one region of each of the first contact electrode CNE1 and the second contact electrode CNE2 (for example, the fourth-first and fourth-second regions D and D') may be partially chamfered to design the width W4 of the one region in the first direction to be narrow, thereby further securing the separation distance d4 between the first contact electrode CNE1 and the second contact electrode CNE2 adjacent to each other in the first direction DR1. Accordingly, short circuit defects between the first contact electrode CNE1 and the second contact electrode CNE2 may be reduced or minimized to prevent dark point (or dark spot) defects of the pixels PXL.

Figure 21:
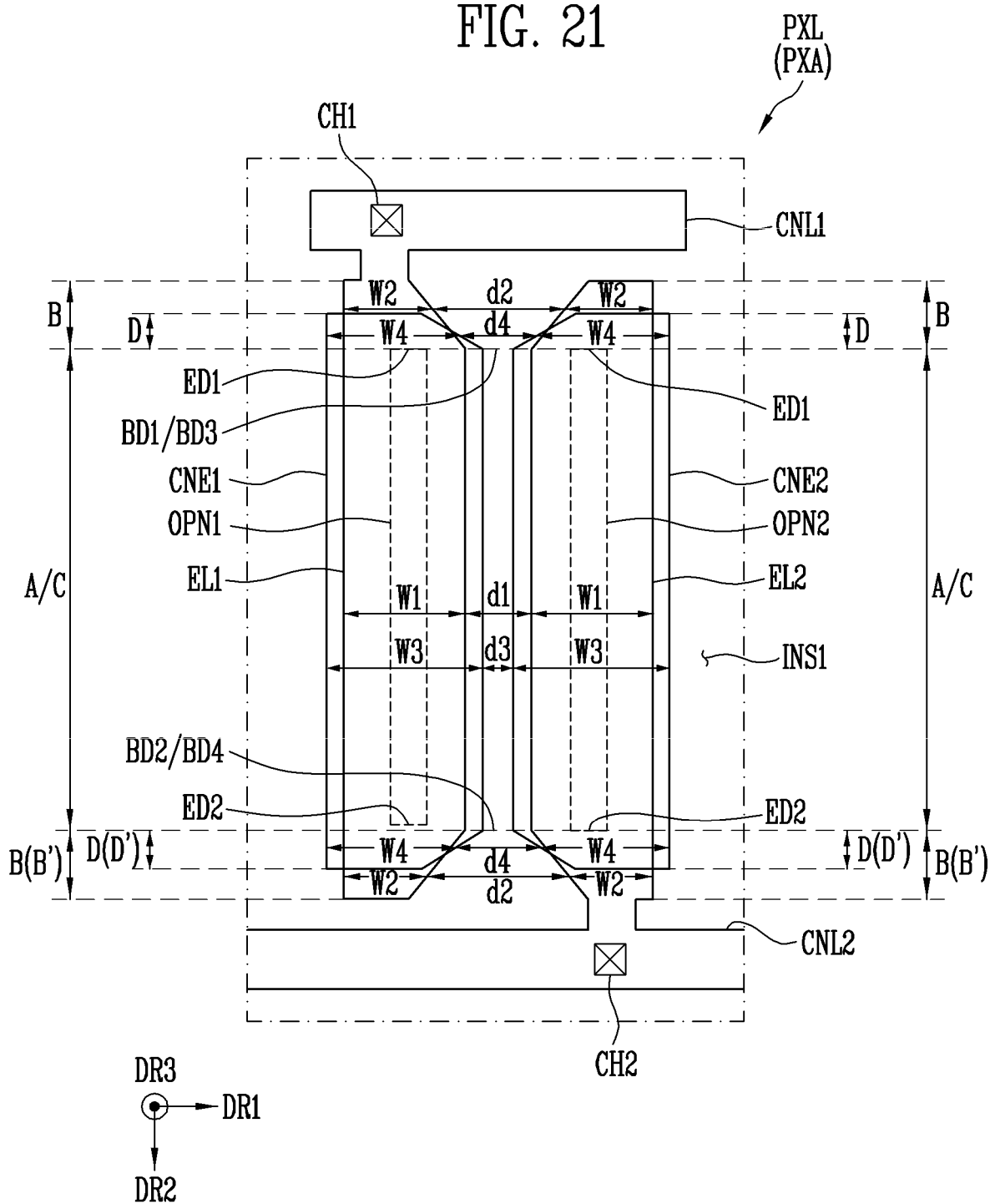
FIG. 21 is a schematic view illustrating a pixel according to still another example embodiment of the present disclosure and is a schematic plan view of a pixel including only some components of a display element layer.

FIG. 21 is a schematic view illustrating a pixel according to still another example embodiment of the present disclosure and is a schematic plan view of a pixel including only some components of a display element layer.

The pixel illustrated in FIG. 21 may have a configuration substantially the same as or substantially similar to that of the pixel of FIGS. 7-14B and the pixel of FIGS. 16-19B, except that one region of each of first and second electrodes EL1 and EL2 and one region of first and second contact electrodes CNE1 and CNE2 are partially chamfered.

In relation to the pixel of FIG. 21, differences from the above-described one or more example embodiments will be mainly described in order to avoid redundant descriptions.

Referring to FIGS. 1-5, 7, 16, and 21, each of the first and second electrodes EL1 and EL2 may be divided into a second-first region B, a first region A, and a second-second region B' in a second direction DR2. In some embodiments, each of the first and second contact electrodes CNE1 and CNE2 may be divided into a fourth-first region D, a third region C, and a fourth-second region D' in the second direction DR2. The first region A of each of the first and second electrodes EL1 and EL2 and the third region C of each of the first and second contact electrodes CNE1 and CNE2 may be one region in which light-emitting elements LD are aligned or one region which overlaps the light-emitting elements LD. The second-first and second-second regions B and B' of each of the first and second electrodes EL1 and EL2 and the fourth-first and fourth-second regions D and D' of each of the first and second contact electrodes CNE1 and CNE2 may be one regions in which the light-emitting elements LD are not aligned or one region which does not overlap the light-emitting elements LD.

In one or more example embodiments of the present disclosure, the second-first and second-second regions B and B' of each of the first and second electrodes EL1 and EL2 may be partially chamfered and thus may have a non-constant width W2 in a first direction DR1. For example, the second-first region B and the second-second region B' of each of the first and second electrodes EL1 and EL2 may have at least two widths W2 in the first direction DR1. The width W2 of the second-first region B of each of the first and second electrodes EL1 and EL2 in the first direction DR1 may be decreased as a distance from a first boundary BD1 of a corresponding electrode (e.g., a boundary point between the first region A and the second-first region B) is increased. The width W2 of the second-second region B' of each of the first and second electrodes EL1 and EL2 in the first direction DR1 may be decreased as a distance from a second boundary BD2 of a corresponding electrode (e.g., a boundary point between the first region A and the second-second region B') is increased.

The first region A of each of the first and second electrodes EL1 and EL2 may have a constant width W1 in the first direction DR1. The width W1 of the first region A of each of the first and second electrodes EL1 and EL2 in the first direction DR1 may be greater than the width W2 of each of the second-first and second-second regions B and B' of a corresponding electrode in the first direction DR1.

In one or more example embodiments, the fourth-first and fourth-second regions D and D' of each of the first and second contact electrodes CNE1 and CNE2 may be partially chamfered and thus may have a non-constant width W4 in the first direction DR1. As an example, the fourth-first and fourth-second regions D and D' of each of the first and second contact electrodes CNE1 and CNE2 may have at least two widths W4 in the first direction DR1. The width W4 of the fourth-first region D of each of the first and second contact electrodes CNE1 and CNE2 in the first direction DR1 may be decreased as a distance from a third boundary BD3 of a corresponding contact electrode (e.g., a boundary point between the third region C and the fourth-first region D) is increased. In some embodiments, the width W4 of the fourth-second region D' of each of the first and second contact electrodes CNE1 and CNE2 in the first direction DR1 may be decreased as a distance from a fourth boundary BD4 of a corresponding contact electrode (e.g., a boundary point between the third region C and the fourth-second region D') is increased.

In one or more example embodiments of the present disclosure, the first boundary BD1 of each of the first and second electrodes EL1 and EL2 and the third boundary BD3 of each of the first and second contact electrodes CNE1 and CNE2 may match each other. For example, the first boundary BD1 of each of the first and second electrodes EL1 and EL2 and the third boundary BD3 of each of the first and second contact electrodes CNE1 and CNE2 may be positioned on the same line when viewed from above. However, the present disclosure is not limited thereto, and according to one or more example embodiments, the first boundary BD1 of each of the first and second electrodes EL1 and EL2 and the third boundary BD3 of each of the first and second contact electrodes CNE1 and CNE2 may not match each other.

In some embodiments, the second boundary BD2 of each of the first and second electrodes EL1 and EL2 and the fourth boundary BD4 of each of the first and second contact electrodes CNE1 and CNE2 may match each other. For example, the second boundary BD2 of each of the first and second electrodes EL1 and EL2 and the fourth boundary BD4 of each of the first and second contact electrodes CNE1 and CNE2 may be positioned on the same line when viewed from above. However, the present disclosure is not limited thereto, and according to some example embodiments, the second boundary BD2 of each of the first and second electrodes EL1 and EL2 and the fourth boundary BD4 of each of the first and second contact electrodes CNE1 and CNE2 may not match each other.

In one or more example embodiments of the present disclosure, the first boundary BD1 of each of the first and second electrodes EL1 and EL2 and the third boundary BD3 of each of the first and second contact electrodes CNE1 and CNE2 may or may not match a first edge ED1 of a corresponding opening of a first insulating layer INS1. In some embodiments, the second boundary BD2 of each of the first and second electrodes EL1 and EL2 and the fourth boundary BD4 of each of the first and second contact electrodes CNE1 and CNE2 may or may not match a second edge ED2 of the corresponding opening of the first insulating layer INS1.

As described above, because the second-first and second-second regions B and B' of each of the first and second electrodes EL1 and EL2 are partially chamfered, a separation distance d2 between the second-first region B of the first electrode EU and the second-first region B of the second electrode EL2 in the first direction DR1 may be further secured, and a separation distance d2 between the second-second region B' of the first electrode EL1 and the second-second region B' of the second electrode EL2 in the first direction DR1 may be further secured. Accordingly, it is possible to reduce or minimize short circuit defects between the first electrode EL1 and the second electrode EL2 caused by a spatial constraint.

In some embodiments, because the fourth-first and fourth-second regions D and D' of each of the first and second contact electrodes CNE1 and CNE2 are partially chamfered, a separation distance d4 between the fourth-first region D of the first contact electrode CNE1 and the fourth-first region D of the second contact electrode CNE2 in the first direction DR1 may be further secured, and a separation distance d4 between the fourth-second region D' of the first contact electrode CNE1 and the fourth-second region D' of the second contact electrode CNE2 in the first direction DR1 may be further secured. Accordingly, it is possible to reduce or minimize short circuit defects between the first contact electrode CNE1 and the second contact electrode CNE2 caused by a spatial constraint.

According to one or more example embodiments of the present disclosure, it is possible to provide a pixel in which a shape of an end portion of each of a first electrode and a second electrode spaced from each other in one direction is changed to secure a separation distance between the end portion of the first electrode and the end portion of the second electrode, thereby reducing or minimizing short circuit defects between the first and second electrodes EL1 and EL2.

According to one or more example embodiments of the present disclosure, it is possible to provide a display device including the above-described pixel to have improved reliability.

The effects according to one or more example embodiments of the present disclosure are not limited by the above-described contents, and more various effects are included in the present specification.

Although example embodiments of the present disclosure have been described, it is understood that the present disclosure should not be limited to these example embodiments but various changes and modifications can be made by one ordinary skilled in the art within the spirit and scope of the disclosure as hereinafter claimed.

Therefore, the technical scope of the present disclosure is not limited to the example embodiments described herein, but should be determined by claims.

What is claimed is:

1. A pixel comprising:
    a first electrode and a second electrode facing each other;
    an insulating layer on the first and second electrodes;
    a plurality of light-emitting elements located on the insulating layer between the first electrode and the second electrode;
    a first contact electrode electrically connected to the first electrode; and
    a second contact electrode electrically connected to the second electrode,
    wherein a first gap having a constant width in a first direction and a second gap having a width in the first direction that gradually changes along a second direction are located between the first electrode and the second electrode or between the first contact electrode and the second contact electrode, the second direction being crossing the first direction.

2. The pixel of claim 1, wherein the second gap is wider than the first gap in the first direction.

3. The pixel of claim 2, wherein each of the first and second electrodes comprises a first region corresponding to the first gap and a second region corresponding to the second gap, and
    each of the first and second contact electrodes comprises a third region corresponding to the first gap and a fourth region corresponding to the second gap.

4. The pixel of claim 3, wherein the second region of each of the first and second electrodes is partially chamfered.

5. The pixel of claim 4, wherein the insulating layer includes a first opening exposing one region of the first electrode and a second opening exposing one region of the second electrode.

6. The pixel of claim 5, wherein, in a plan view, an edge of the first opening matches a boundary between the first region of the first electrode and the second region of the first electrode, and
    in the plan view, an edge of the second opening matches a boundary between the first region of the second electrode and the second region of the second electrode.

7. The pixel of claim 5, wherein, in a plan view, an edge of the first opening does not match a boundary between the first region of the first electrode and the second region of the first electrode, and
    in the plan view, an edge of the second opening does not match a boundary between the first region of the second electrode and the second region of the second electrode.

8. The pixel of claim 4, wherein, in a plan view, the second region of each of the first and second electrodes comprises at least one side surface that extends in a diagonal direction inclined to the first direction.

9. The pixel of claim 4, wherein, in a plan view, the second region of each of the first and second electrodes comprises at least one side surface having certain curvature.

10. The pixel of claim 4, wherein a width of the second region of each of the first and second electrodes in the first direction is decreased as a distance from a boundary between the first region and the second region of a corresponding electrode is increased.

11. The pixel of claim 4, wherein each of the first and second electrodes extends in the second direction different from the first direction, and
each of the first and second electrodes has at least two widths in the first direction along the second direction.

12. The pixel of claim 4, wherein the first region of each of the first and second electrodes has a constant width in the first direction.

13. The pixel of claim 4, wherein, in a plan view, a corner of the first contact electrode is positioned outside a chamfered portion of the first electrode, and
a corner of the second contact electrode is positioned outside a chamfered portion of the second electrode.

14. The pixel of claim 3, wherein the fourth region of each of the first and second contact electrodes is partially chamfered.

15. The pixel of claim 14, wherein a width of the fourth region in the first direction is less than a width of the third region in the first direction.

16. The pixel of claim 15, wherein the insulating layer includes a first opening exposing one region of the first electrode and a second opening exposing one region of the second electrode.

17. The pixel of claim 16, wherein, in a plan view, an edge of the first opening matches a boundary between the third region of the first contact electrode and the fourth region of the first contact electrode, and
in the plan view, an edge of the second opening matches a boundary between the third region of the second contact electrode and the fourth region of the second contact electrode.

18. The pixel of claim 17, wherein the width of the fourth region of each of the first and second contact electrodes in the first direction is decreased as a distance from the boundary between the third region and the fourth region of a corresponding contact electrode is increased.

19. The pixel of claim 18, wherein each of the first and second contact electrodes has at least two widths in the first direction along an extending direction thereof.

20. The pixel of claim 16, wherein, in a plan view, an edge of the first opening does not match a boundary between the third region of the first contact electrode and the fourth region of the first contact electrode, and
in the plan view, an edge of the second opening does not match a boundary between the third region of the second contact electrode and the fourth region of the second contact electrode.

21. A display device comprising:
a substrate comprising a plurality of pixel areas; and
a pixel in each of the pixel areas,
wherein the pixel comprises a first electrode and a second electrode facing each other on the substrate, an insulating layer on the first electrode and the second electrode, a plurality of light-emitting elements positioned between the first electrode and the second electrode on the insulating layer, a first contact electrode located on the first electrode and configured to electrically connect the first electrode and one end each of the light-emitting elements, and a second contact electrode located on the second electrode and configured to electrically connect the second electrode and an other end of each of the light-emitting elements, and
a first gap having a constant width in a first direction and a second gap having a width in the first direction that gradually changes along a second direction are located between the first electrode and the second electrode or between the first contact electrode and the second contact electrode, the second direction being crossing the first direction.

22. The display device of claim 21, wherein each of the first and second electrodes comprises a first region corresponding to the first gap and a second region corresponding to the second gap,
each of the first and second contact electrodes comprises a third region corresponding to the first gap and a fourth region corresponding to the second gap, and
the second gap is wider than the first gap in the first direction.

* * * * *